(12) United States Patent
Shimada et al.

(10) Patent No.: US 8,003,296 B2
(45) Date of Patent: Aug. 23, 2011

(54) CHEMICALLY AMPLIFIED POSITIVE RESIST COMPOSITION

(75) Inventors: Masahiko Shimada, Toyonaka (JP);
Kazuhiko Hashimoto, Toyonaka (JP);
Junji Shigematsu, Ibaraki (JP);
Takayuki Miyagawa, Toyonaka (JP);
Satoshi Yamamoto, Hyogo (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 182 days.

(21) Appl. No.: 12/536,386

(22) Filed: Aug. 5, 2009

(65) Prior Publication Data

US 2010/0062365 A1    Mar. 11, 2010

(30) Foreign Application Priority Data

Aug. 7, 2008  (JP) ................ 2008-203967

(51) Int. Cl.
*G03F 7/004* (2006.01)

(52) U.S. Cl. .................. 430/270.1; 430/907; 430/910

(58) Field of Classification Search ........ 430/270.1, 430/907, 910
See application file for complete search history.

(56) References Cited

U.S. PATENT DOCUMENTS

| | | | | |
|---|---|---|---|---|
| 4,075,263 A | * | 2/1978 | Lane et al. ............ | 525/58 |
| 4,536,554 A | * | 8/1985 | Lim et al. ............ | 526/264 |
| 2010/0331508 A1 | * | 12/2010 | Sato et al. ............ | 526/257 |
| 2011/0009643 A1 | * | 1/2011 | Nakayama et al. ...... | 549/11 |
| 2011/0060112 A1 | * | 3/2011 | Nakayama et al. ...... | 526/257 |

FOREIGN PATENT DOCUMENTS

| | | | |
|---|---|---|---|
| JP | 61040279 | * | 4/1986 |
| JP | 0259570 | * | 2/1990 |
| WO | WO2009144801 | * | 12/2009 |

* cited by examiner

*Primary Examiner* — John S Chu
(74) *Attorney, Agent, or Firm* — Birch, Stewart, Kolasch & Birch, LLP

(57) ABSTRACT

The present invention provides a chemically amplified positive composition comprising:

(A) a resin comprising a structural unit having an acid-labile group and being itself insoluble or poorly soluble in an alkali aqueous solution but becoming soluble in an alkali aqueous solution by the action of an acid, (B) a resin comprising a structural unit represented by the formula (I):

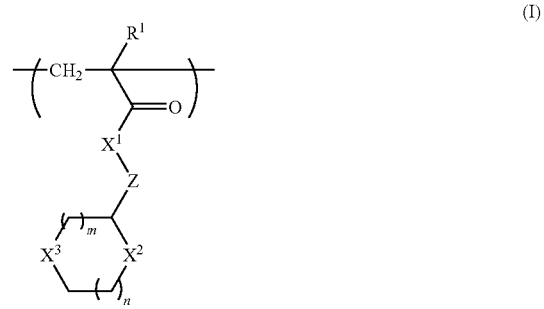

wherein $R^1$ represents a hydrogen atom, a halogen atom, a C1-C4 alkyl group or a C1-C4 perfluoroalkyl group, Z represents a single bond or $-(CH_2)_k-CO-X^4-$, k represents an integer of 1 to 4, $X^1$, $X^2$, $X^3$ and $X^4$ each independently represents an oxygen atom or a sulfur atom, m represents an integer of 1 to 3 and n represents an integer of 0 to 3, and a structural unit having a fluorine atom in a side chain, and
an acid generator.

7 Claims, No Drawings

CHEMICALLY AMPLIFIED POSITIVE RESIST COMPOSITION

This nonprovisional application claims priority under 35 U.S.C. §119(a) on Patent Application No. 2008-203967 filed in JAPAN on Aug. 7, 2008, the entire contents of which are hereby incorporated by reference.

FIELD OF THE INVENTION

The present invention relates to a chemically amplified positive resist composition.

BACKGROUND OF THE INVENTION

A chemically amplified positive resist composition used for semiconductor microfabrication employing a lithography process contains an acid generator comprising a compound generating an acid by irradiation.

US 2001/0044070 A1 and US 2003/0180659 A1 disclose a chemically amplified positive resist composition comprising a resin which comprises a structural unit having an acid-labile group and an acid generator.

SUMMARY OF THE INVENTION

The present invention is to provide a chemically amplified positive resist composition.

The present invention relates to the followings:

<1> A chemically amplified positive resist composition comprising:

(A) a resin comprising a structural unit having an acid-labile group and being itself insoluble or poorly soluble in an alkali aqueous solution but becoming soluble in an alkali aqueous solution by the action of an acid, (B) a resin comprising a structural unit represented by the formula (I):

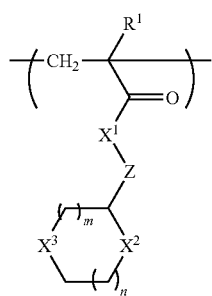

wherein $R^1$ represents a hydrogen atom, a halogen atom, a C1-C4 alkyl group or a C1-C4 perfluoroalkyl group, Z represents a single bond or —$(CH_2)_k$—CO—$X^4$—, k represents an integer of 1 to 4, $X^1$, $X^2$, $X^3$ and $X^4$ each independently represents an oxygen atom or a sulfur atom, m represents an integer of 1 to 3 and n represents an integer of 0 to 3, and a structural unit having a fluorine atom in a side chain, and an acid generator;

<2> The chemically amplified positive resist composition according to <1>, wherein the structural unit having a fluorine atom in a side chain is a structural unit represented by the formula (VI):

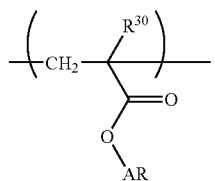

wherein $R^{30}$ represents a hydrogen atom, a methyl group or a trifluoromethyl group, and AR represents a fluorine-containing C1-C30 hydrocarbon group which may have one or more hydroxyl groups and one or more methylene group in the hydrocarbon group may be replaced by —O—, —NH— or —S—;

<3> The chemically amplified positive resist composition according to <1> or <2>, wherein the resin (A) further contains a structural unit represented by the formula (III):

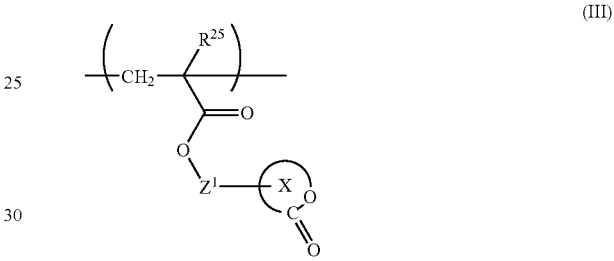

wherein $R^{25}$ represents a hydrogen atom or a methyl group, ring X represents an unsubstituted or substituted C3-C30 cyclic hydrocarbon group having —COO—, $Z^1$ represents a single bond or —$(CH2)_k$—COO—, and k' represents an integer of 1 to 4;

<4> The chemically amplified positive resist composition according to any one of <1> to <3>, wherein the amount of the resin (B) is 0.1 to 30 parts by weight per 100 parts by weight of the resin (A);

<5> The chemically amplified positive resist composition according to any one of <1> to <4>, wherein the acid generator is an acid generator represented by the formula (V):

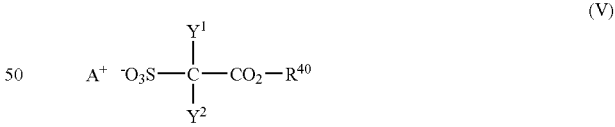

wherein $Y^1$ and $Y^2$ each independently represent a fluorine atom or a C1-C6 perfluoroalkyl group, $R^{40}$ represents a C1-C30 linear, branched chain or cyclic hydrocarbon group which may be substituted with at least one selected from the group consisting of a C1-C6 alkyl group, a C1-C6 alkoxy group, a C1-C4 perfluoroalkyl group, a hydroxyl group and a cyano group, and one or more —$CH_2$— in the hydrocarbon group may be replaced by —CO—, —O— or —COO—, and $A^+$ represents an organic counter ion;

<6> The chemically amplified positive resist composition according to <5>, wherein $R^{40}$ in the formula (V) is a group represented by the formula:

wherein $X^{10}$ represents a C3-C30 monocyclic or polycyclic hydrocarbon group having a hydroxyl group or a carbonyl group, and one or more hydrogen atoms in the monocyclic or polycyclic hydrocarbon group may be replaced by a C1-C6 alkyl group, a C1-C6 alkoxy group, a C1-C4 perfluoroalkyl group, a C1-C6 hydroxyalkyl group, a hydroxyl group or a cyano group and Z' represents a single bond or a C1-C4 alkylene group;

<7> The chemically amplified positive resist composition according to <5> or <6>, wherein the organic counter ion is a cation represented by the formula (XIIa):

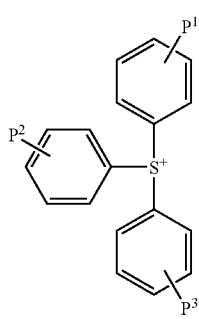

(XIIa)

wherein $P^1$, $P^2$ and $P^3$ each independently represent a hydrogen atom, a hydroxyl group, a C1-C12 alkyl group or a C1-C12 alkoxy group.

DESCRIPTION OF PREFERRED EMBODIMENTS

The present resist composition comprises (A) a resin comprising a structural unit having an acid-labile group and being itself insoluble or poorly soluble in an alkali aqueous solution but becoming soluble in an alkali aqueous solution by the action of an acid, (B) a resin comprising a structural unit represented by the formula (I):

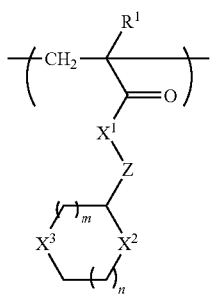

(I)

wherein $R^1$ represents a hydrogen atom, a halogen atom, a C1-C4 alkyl group or a C1-C4 perfluoroalkyl group, Z represents a single bond or —$(CH_2)_k$—CO—$X^4$—, k represents an integer of 1 to 4, $X^1$, $X^2$, $X^3$ and $X^4$ each independently represents an oxygen atom or a sulfur atom, m represents an integer of 1 to 3 and n represents an integer of 0 to 3 (hereinafter, simply referred to as the structural unit (I)) and an acid generator.

First, the resin (A) will be illustrated.

In this specification, "an acid-labile group" means a group capable to eliminate by the action of an acid.

In the present specification, "ester group" means "a structure having ester of carboxylic acid". Specifically, "tert-butyl ester group" is "a structure having tert-butyl ester of carboxylic acid", and may be described as "—COOC$(CH_3)_3$".

Examples of the acid-labile group include a structure having ester of carboxylic acid such as an alkyl ester group in which a carbon atom adjacent to the oxygen atom is quaternary carbon atom, an alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom".

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom such as an isobornyl ester, 1-alkylcycloalkyl ester, 2-alkyl-2-adamantyl ester, and 1-(1-adamantyl)-1-alkylalkyl ester group.

The preferable structural unit having an acid-labile group in a side chain is a structural unit represented by the formula (IIa) or (IIb).

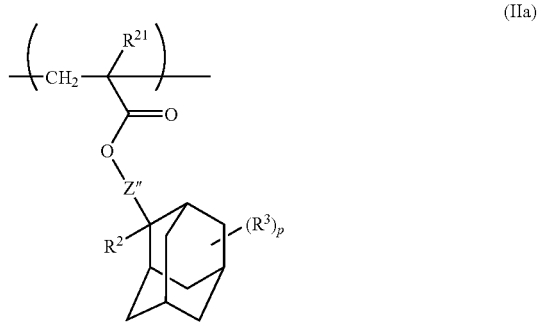

(IIa)

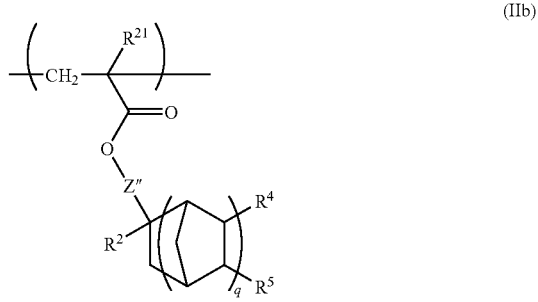

(IIb)

wherein $R^{21}$ represents a hydrogen atom or a methyl group, Z" represents a single bond or —$[CH_2]_r$—COO—, r represents an integer of 1 to 4, $R^2$ represents a linear or branched chain C1-C8 alkyl group or a C3-C8 cycloalkyl group, $R^3$ represents a methyl group, p represents an integer of 0 to 14, $R^4$ and $R^5$ each independently represent a hydrogen atom or a C1-C8 monovalent hydrocarbon group which may have one or more heteroatoms, or $R^4$ and $R^5$ may be bonded to form a C1-C8 divalent hydrocarbon group which may have at least one heteroatom which forms a ring together with the adjacent carbon atoms to which $R^4$ and $R^5$ are bonded, or $R^4$ and $R^5$ may be also bonded to form a carbon-carbon double bond between the carbon atom to which $R^4$ is bonded and the carbon atom to which $R^5$ is bonded, and q represents an integer of 1 to 3 (hereinafter, simply referred to as the structural unit (IIa), (IIb), respectively).

Examples of the C1-C4 alkyl group and the C1-C4 perfluoroalkyl group include the same as described above.

Examples of the linear or branched chain C1-C8 alkyl group include a methyl group, an ethyl group, an n-propyl group, an isopropyl group, an n-butyl group, an isobutyl group, a sec-butyl group, an n-pentyl group, an isopentyl group, a neopentyl group, an n-hexyl group, an n-heptyl group and an n-octyl group. Examples of the C3-C8 cycloalkyl group include a cyclopentyl group, a cyclohexyl group, a cyclooctyl group, a 2-methylcyclopentyl group, a 3-methylcyclohexyl group, a 4-methylcyclohexyl group, a 2,3-dimethylcyclohexyl group and a 4,4-dimethylcyclohexyl group. Among them, a C2-C8 linear or branched chain alkyl group and a C3-C8 cycloalkyl group are preferable.

In the formula (IIIa), p is preferably 0 or 1, and Z" preferably represents a single bond or —$CH_2$—COO—, and more preferably represents a single bond.

Examples of the C1-C8 monovalent hydrocarbon group include a methyl group, an ethyl group, an n-propyl group, an isopropyl group, an n-butyl group, an isobutyl group, a sec-butyl group, an n-pentyl group, an n-hexyl group, an n-heptyl group and an n-octyl group.

Examples of the C1-C8 divalent hydrocarbon group formed by bonding $R^4$ and $R^5$ include an ethylene group and a trimethylene group.

The resin (A) may have one or more structural units having an add-labile group.

Examples of the monomer used for giving the structural unit (IIa) include the followings:

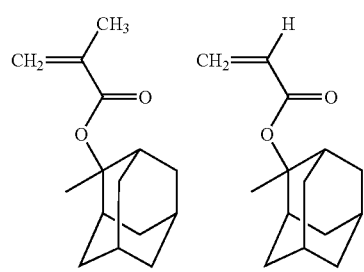

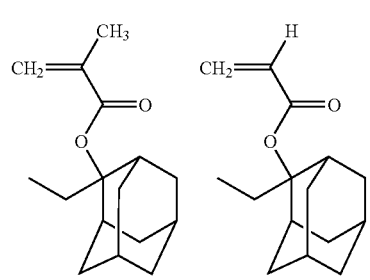

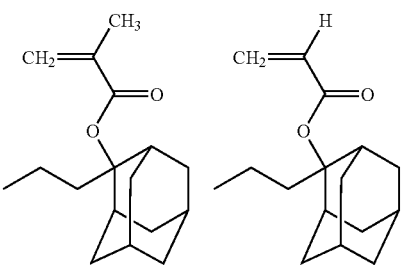

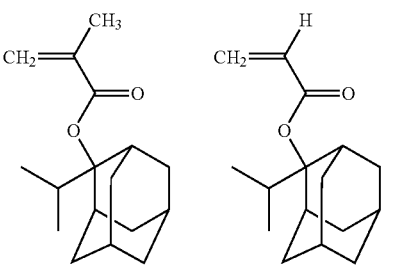

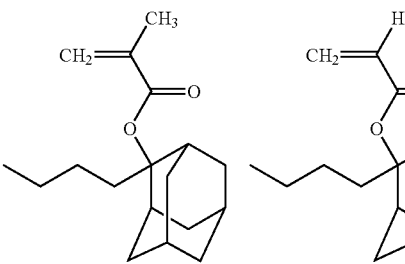

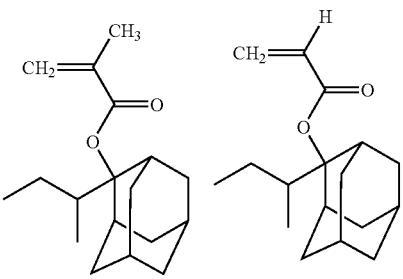

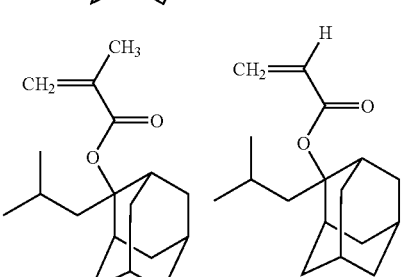

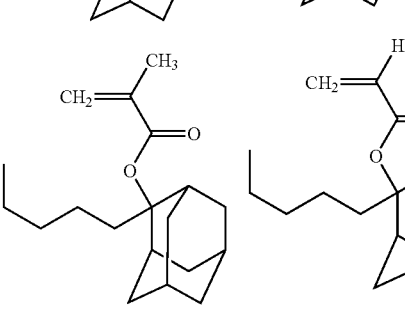

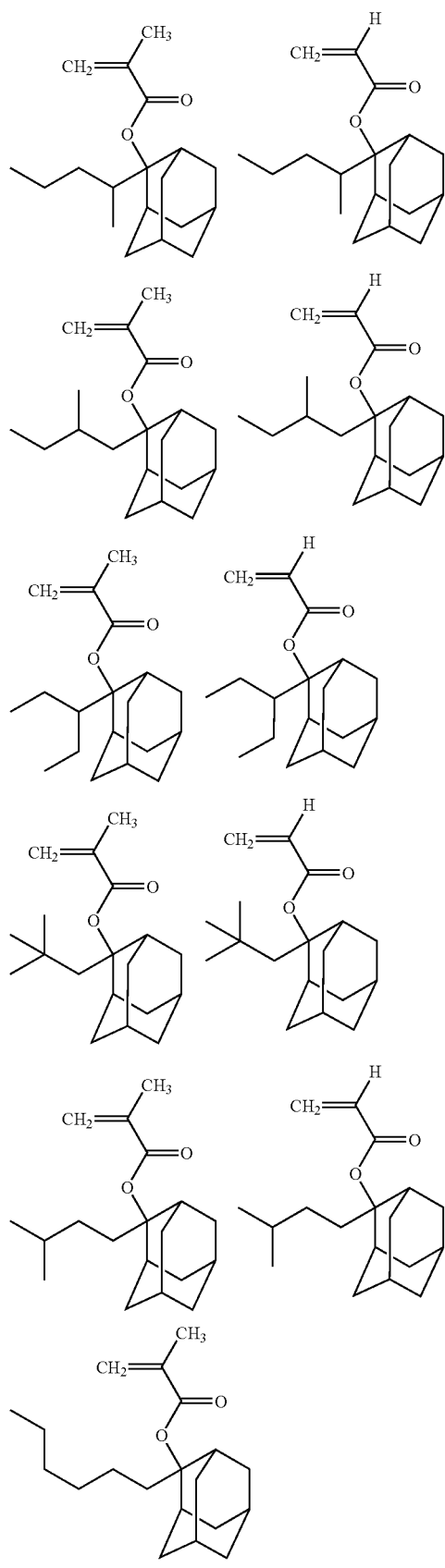
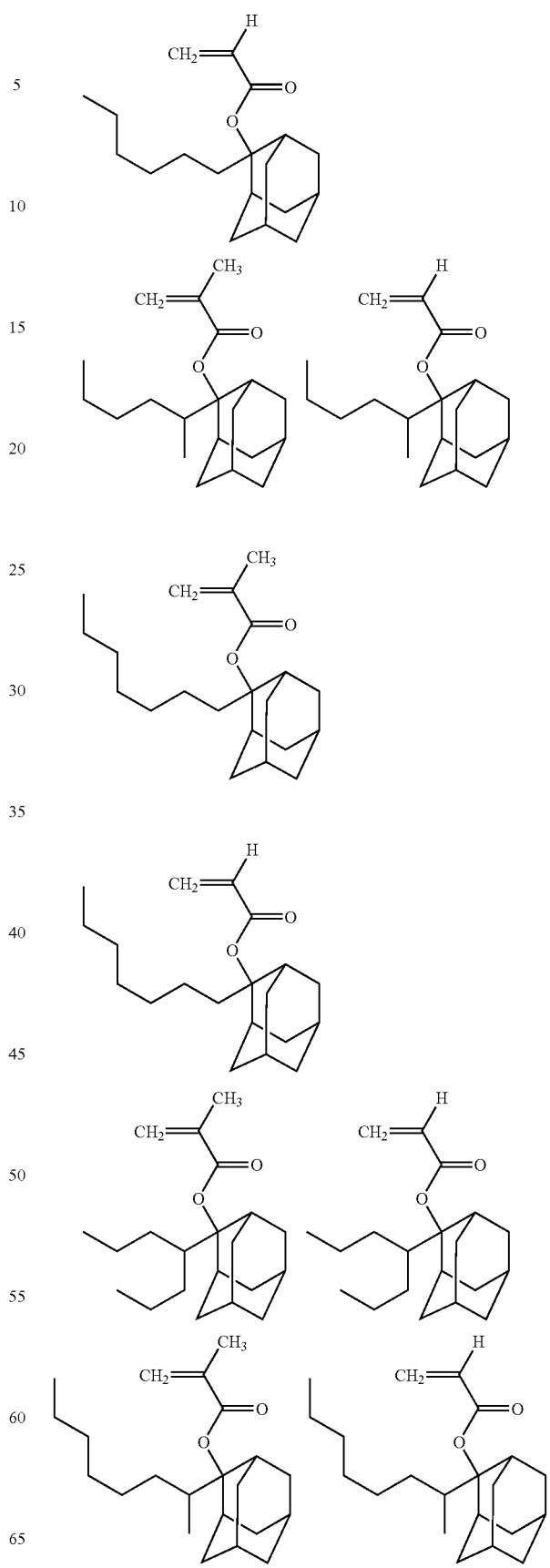

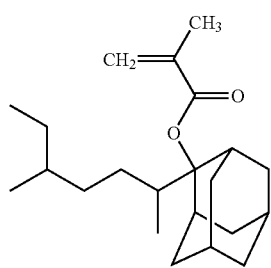
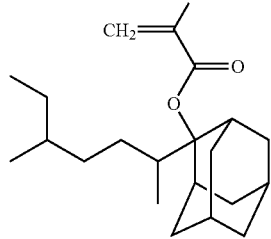
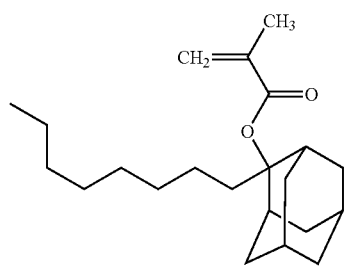
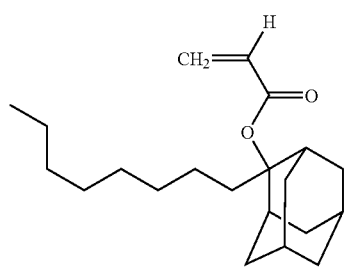
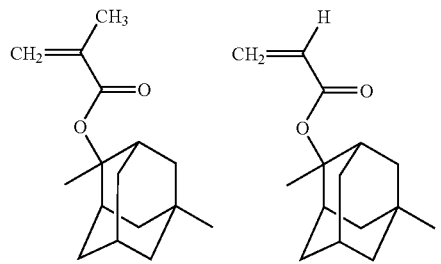
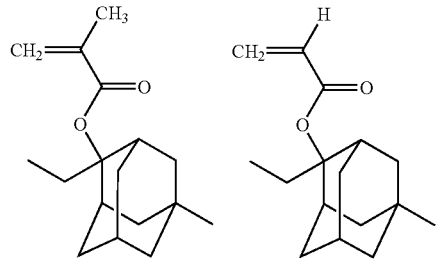
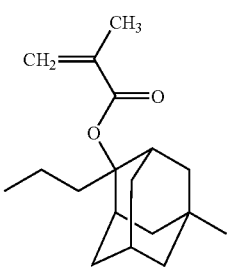
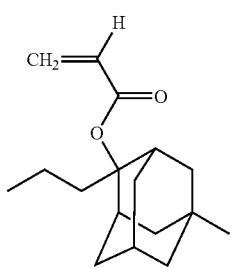
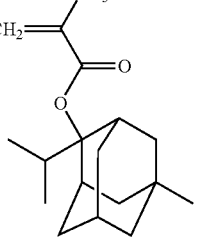
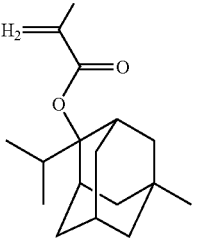
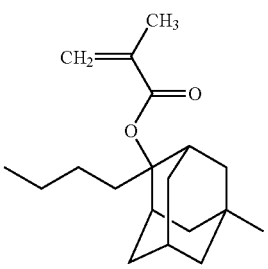
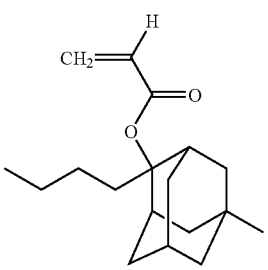
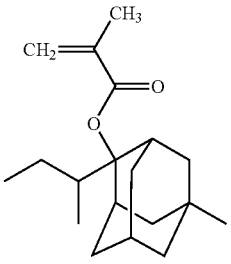
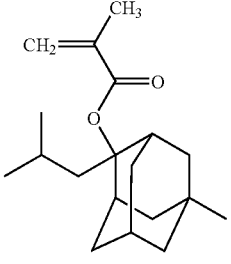

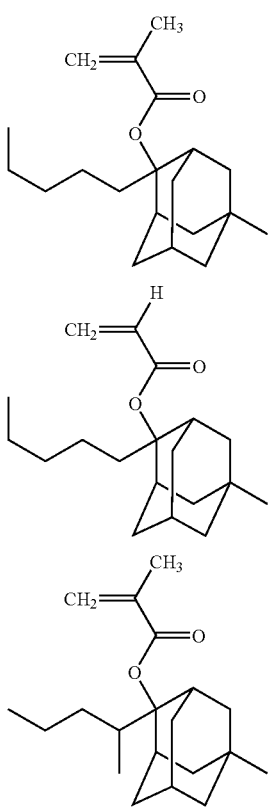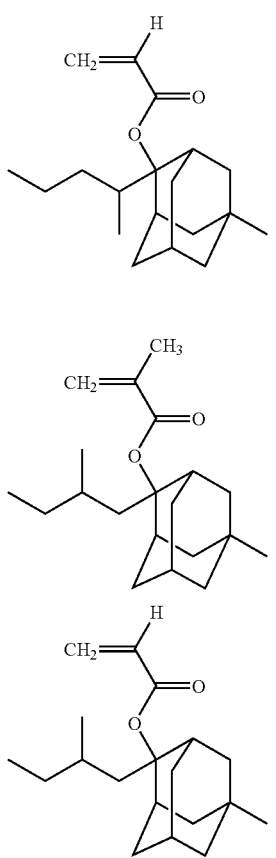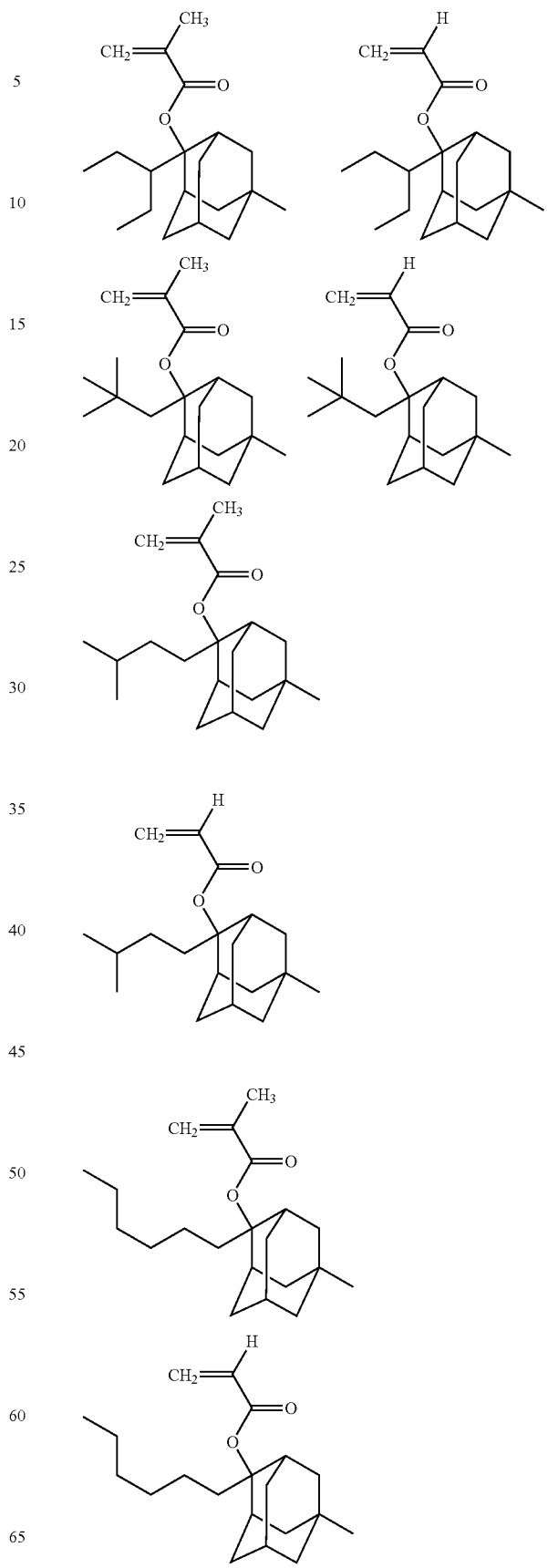

-continued
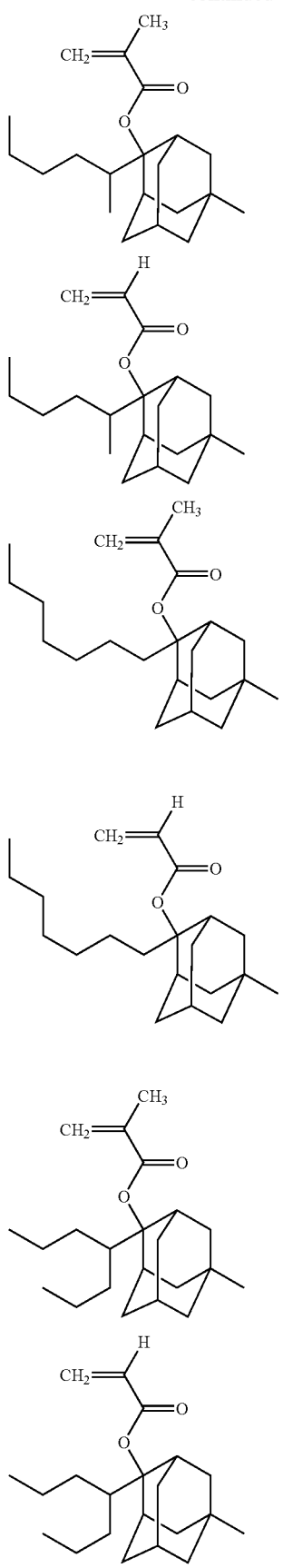
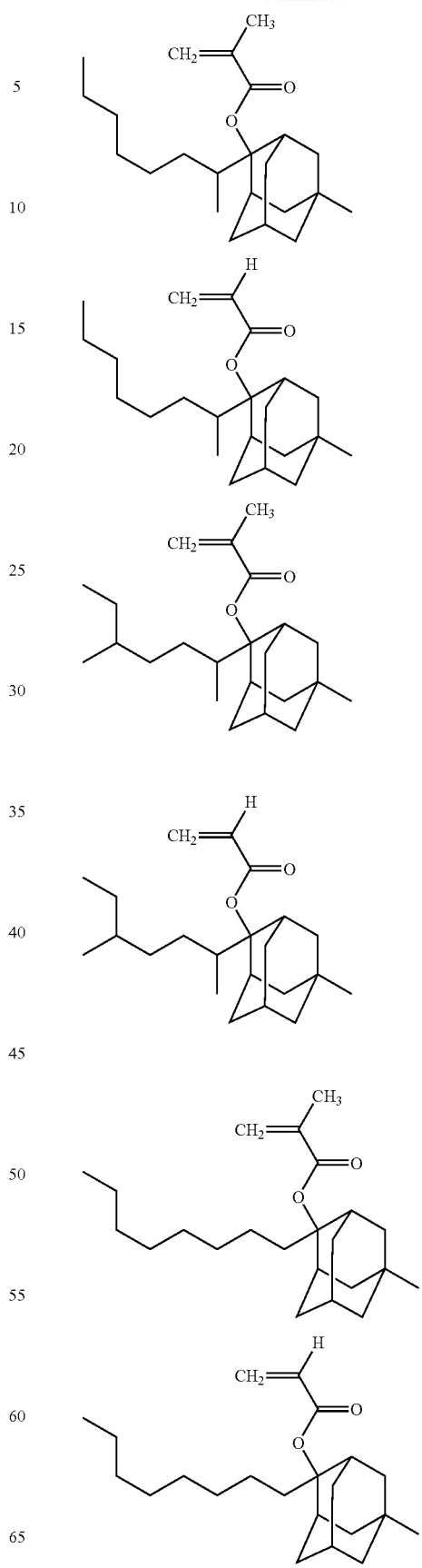

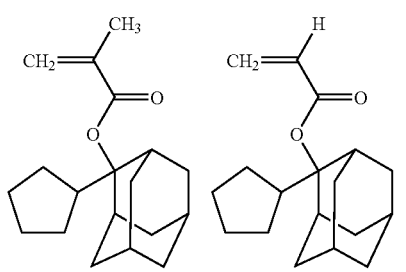
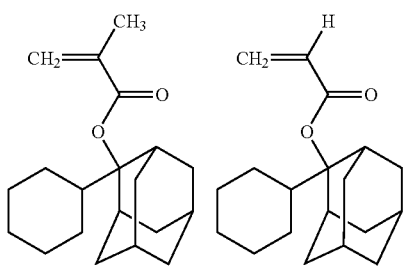
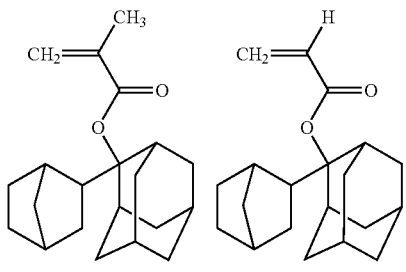
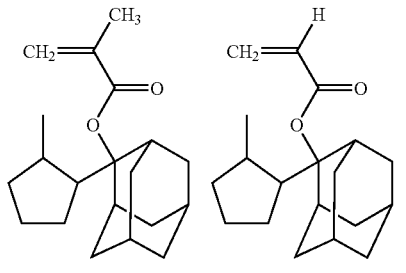
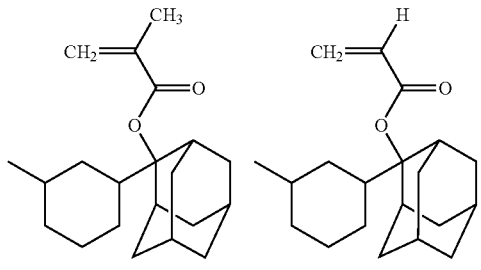
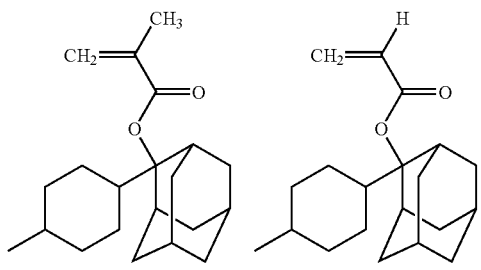
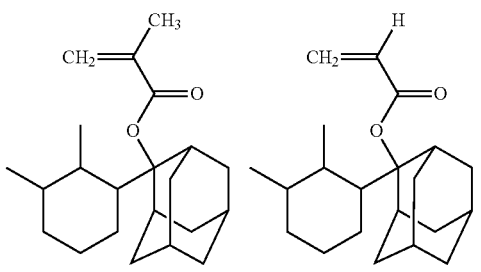
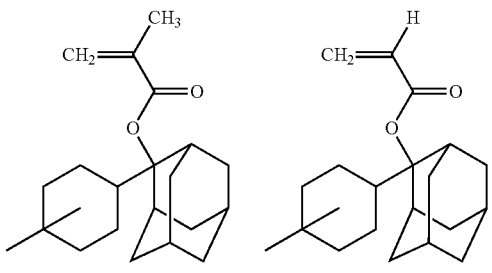
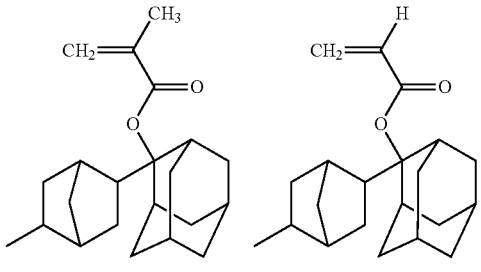
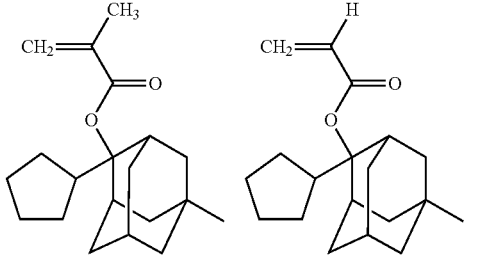
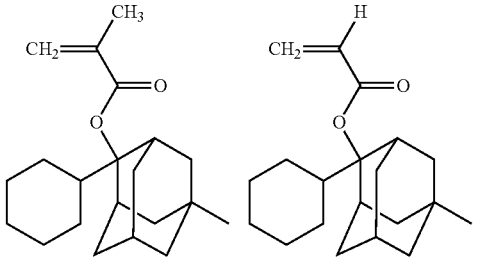
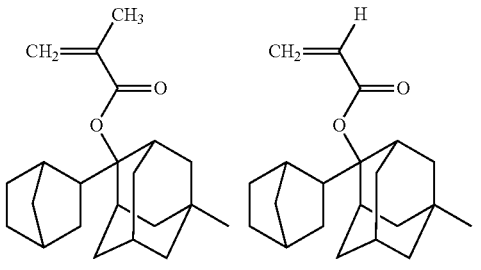

17
-continued
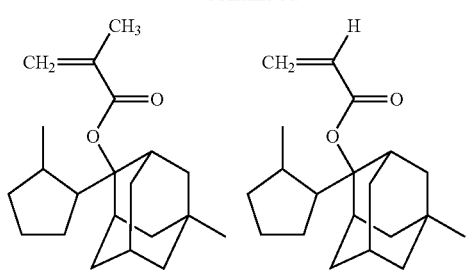
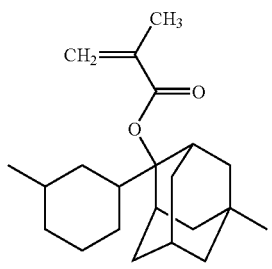
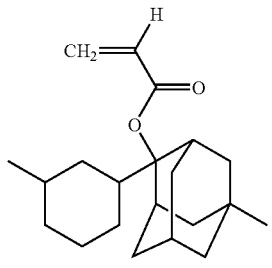
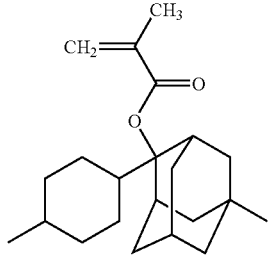
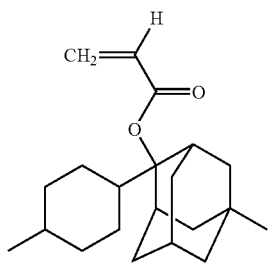
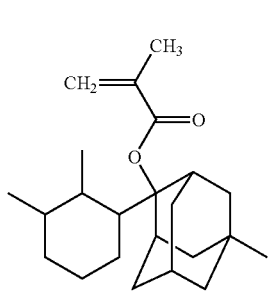
18
-continued
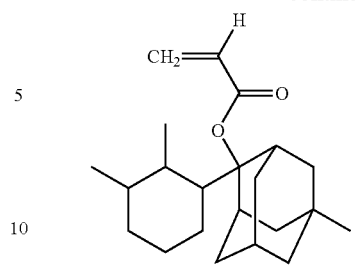
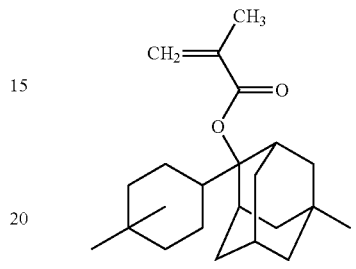
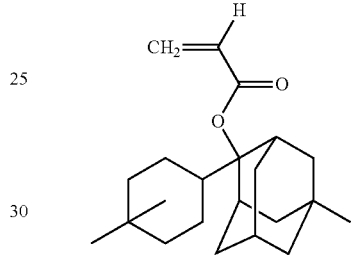
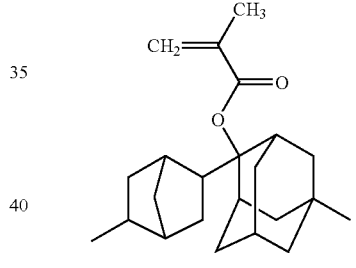
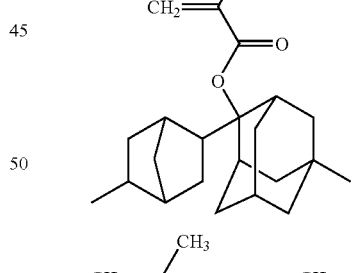
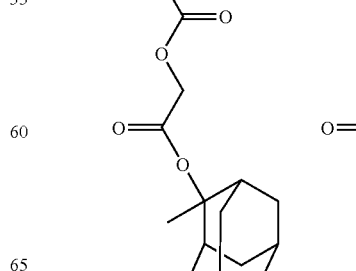

-continued
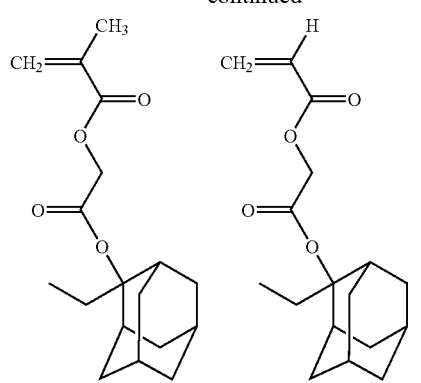
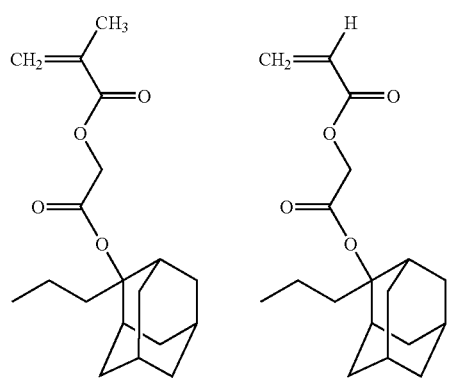
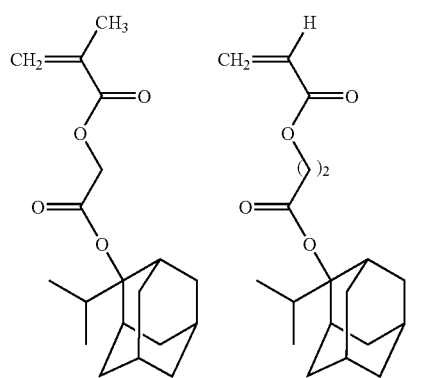
-continued
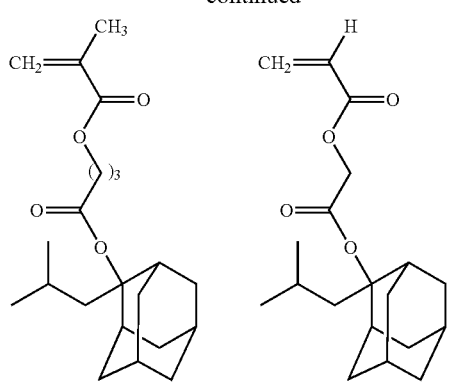
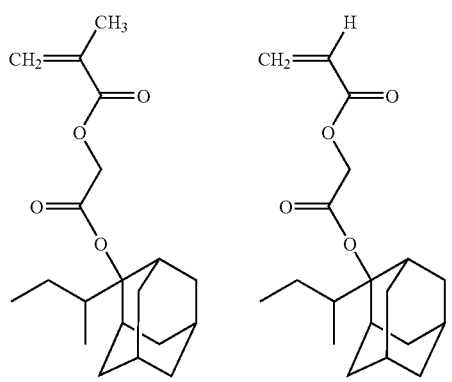
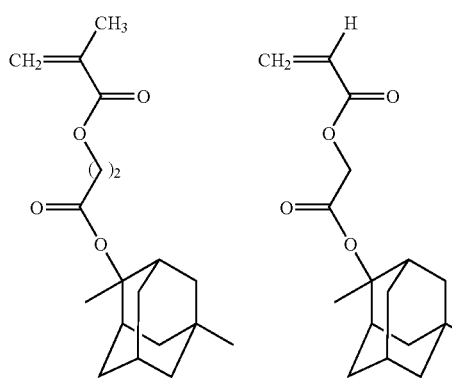
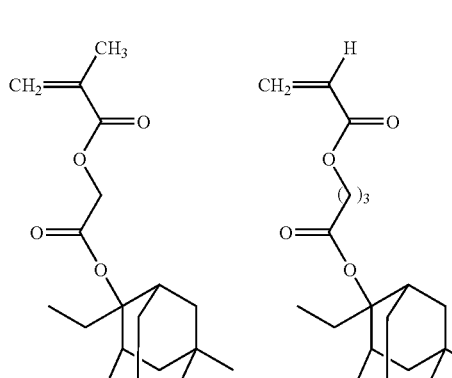

21
-continued
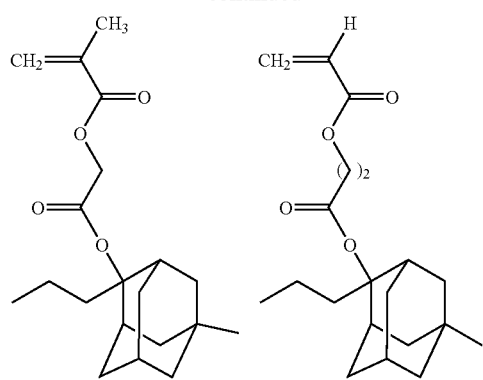
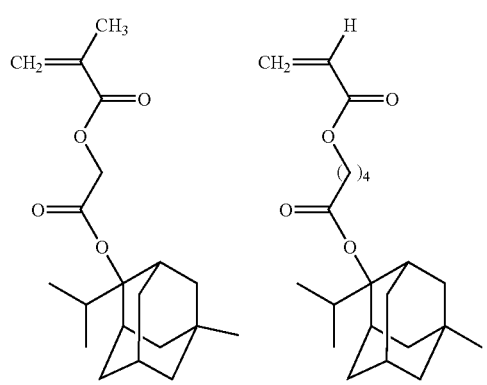
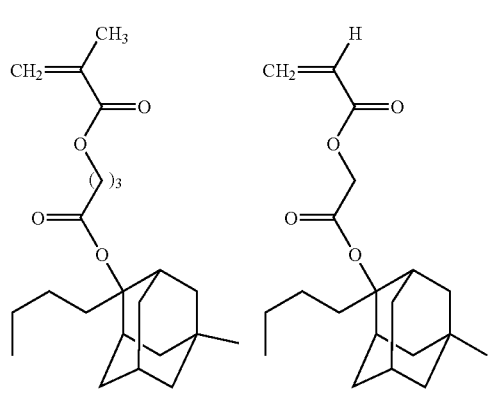
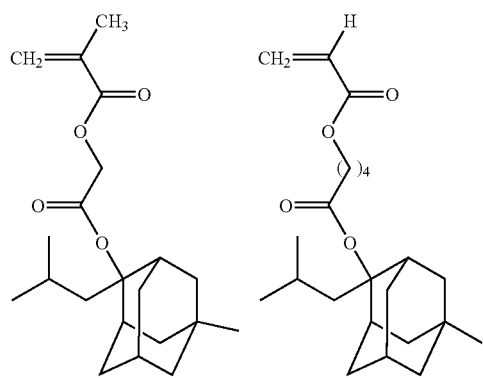
22
-continued
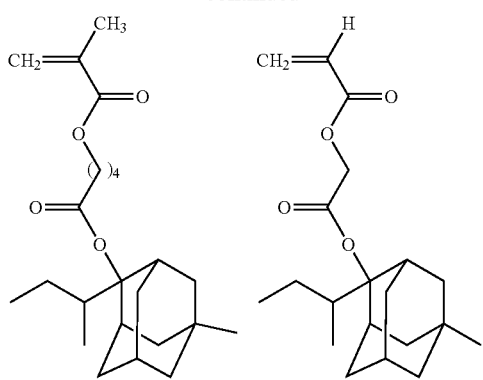
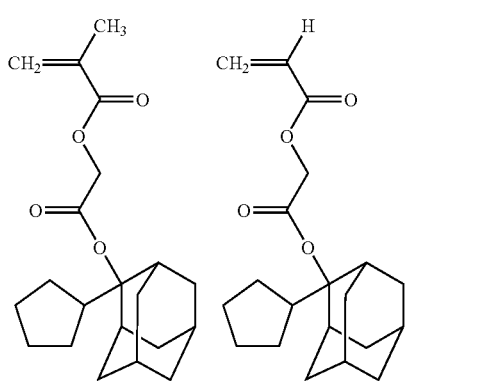
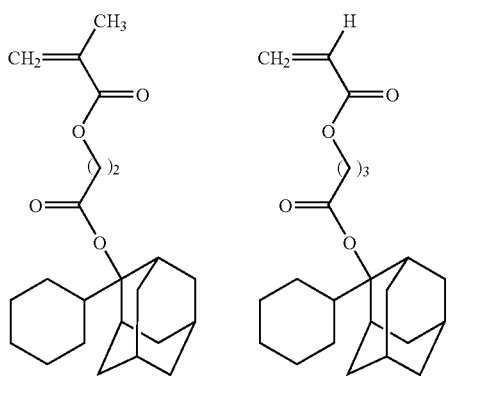
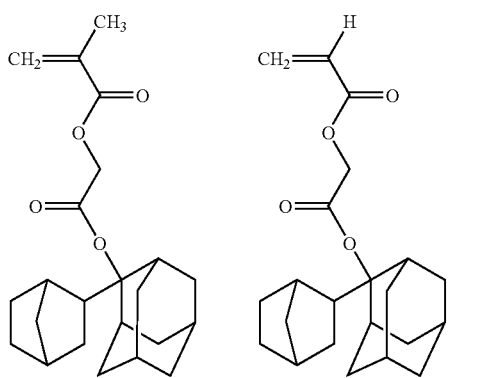

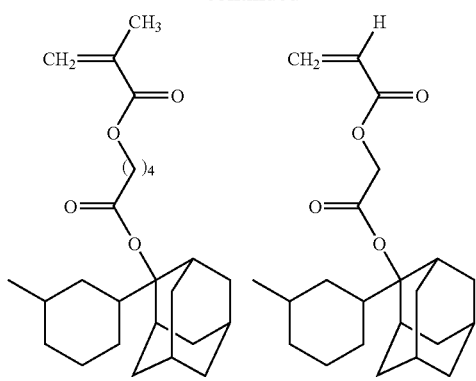
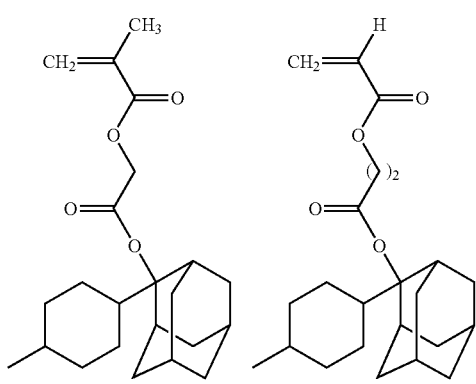
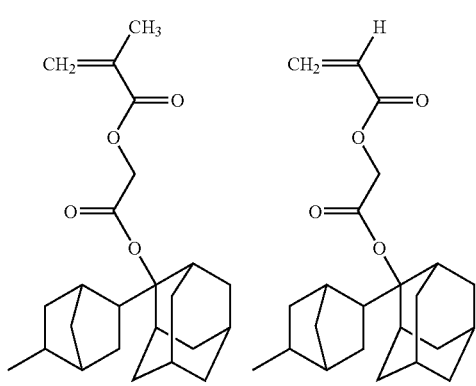
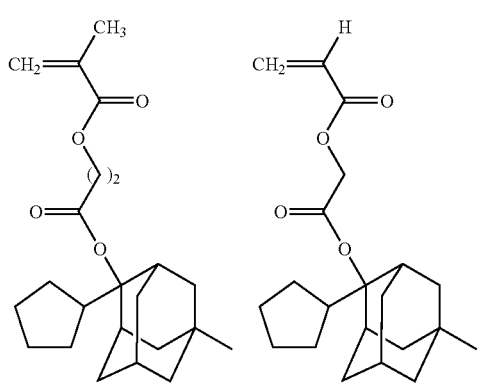
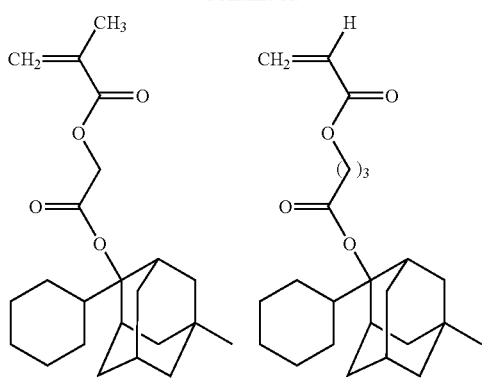
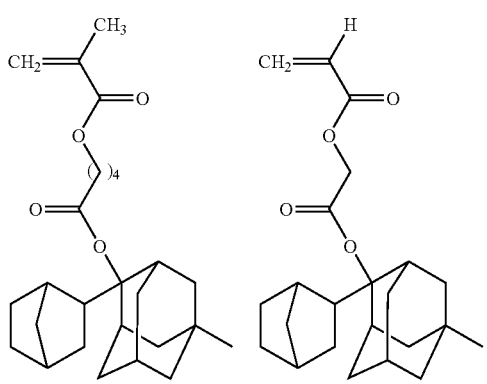
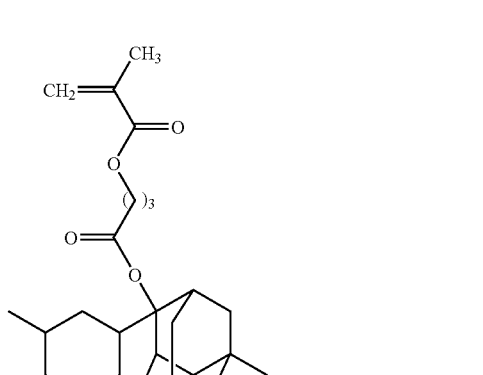
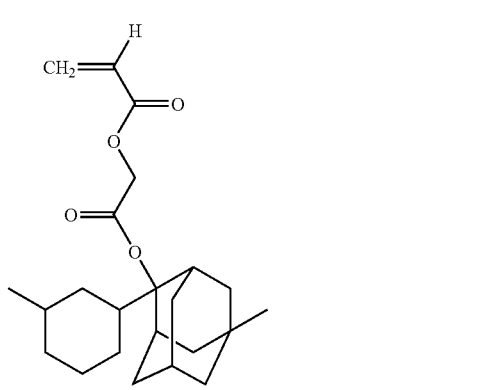

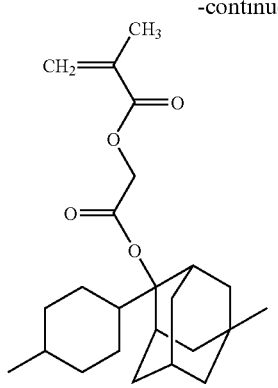
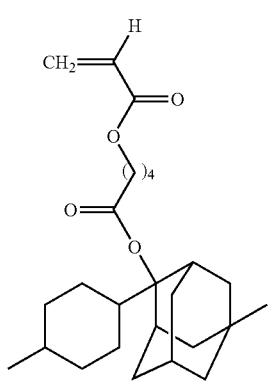
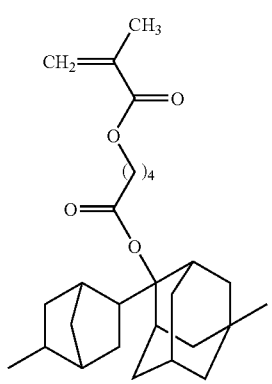
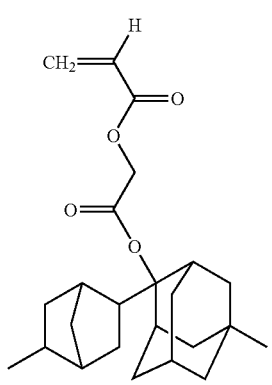
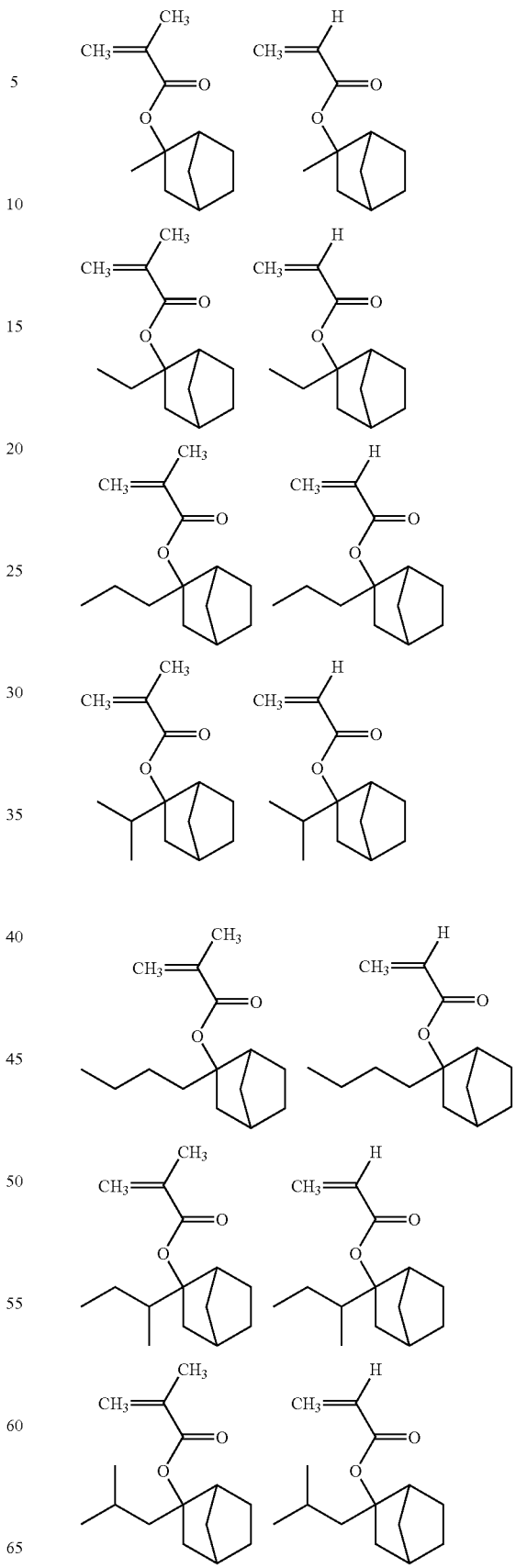
Examples of the monomer used for giving the structural unit (IIb) include the followings.

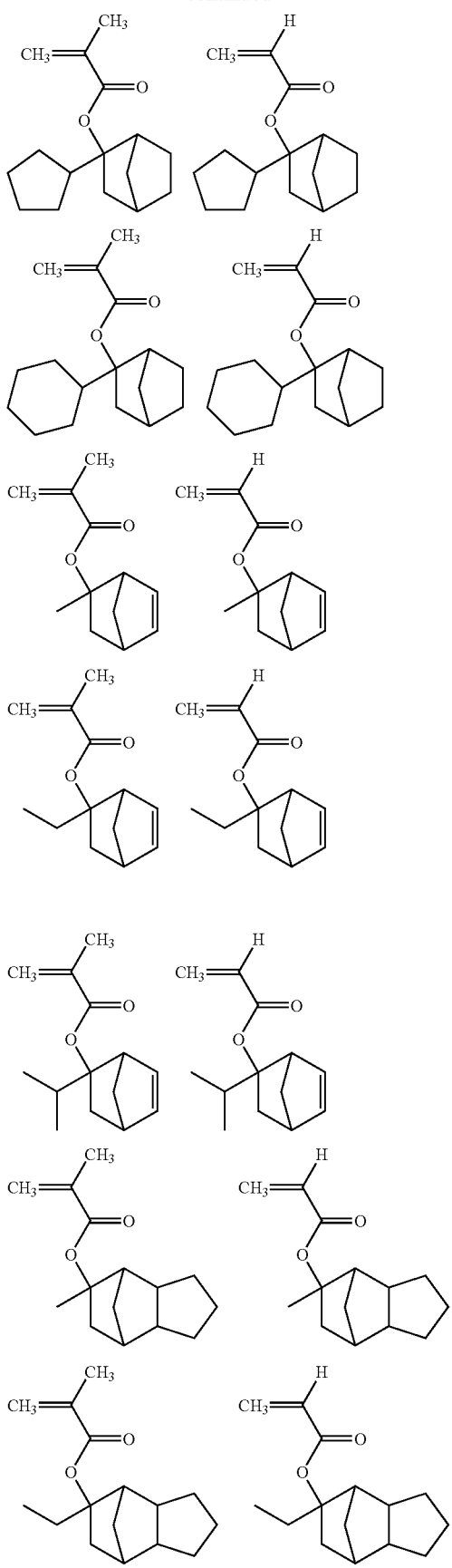
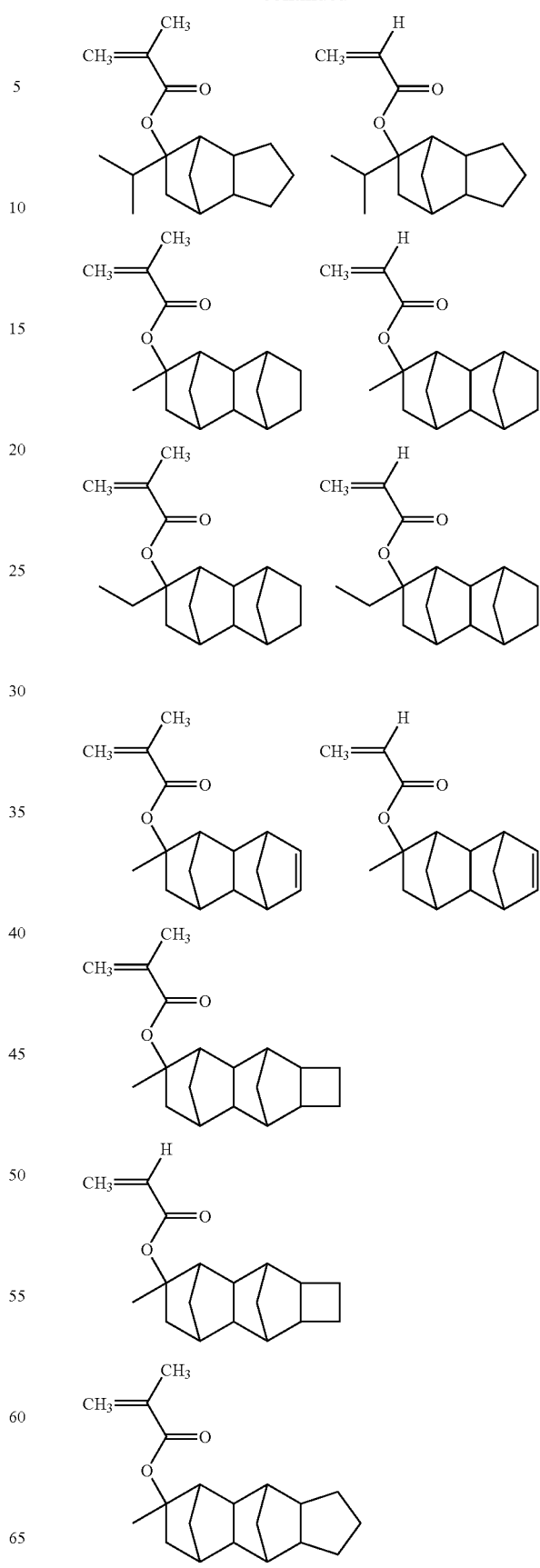

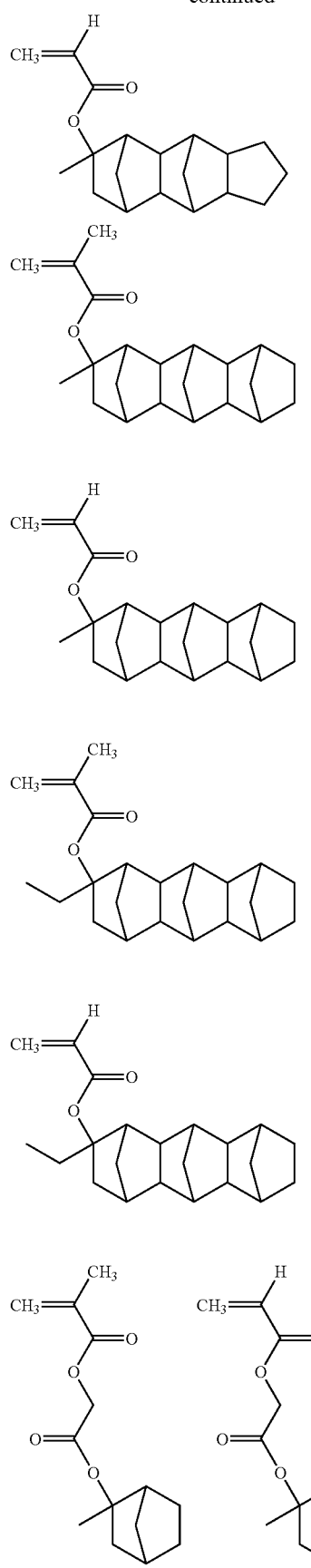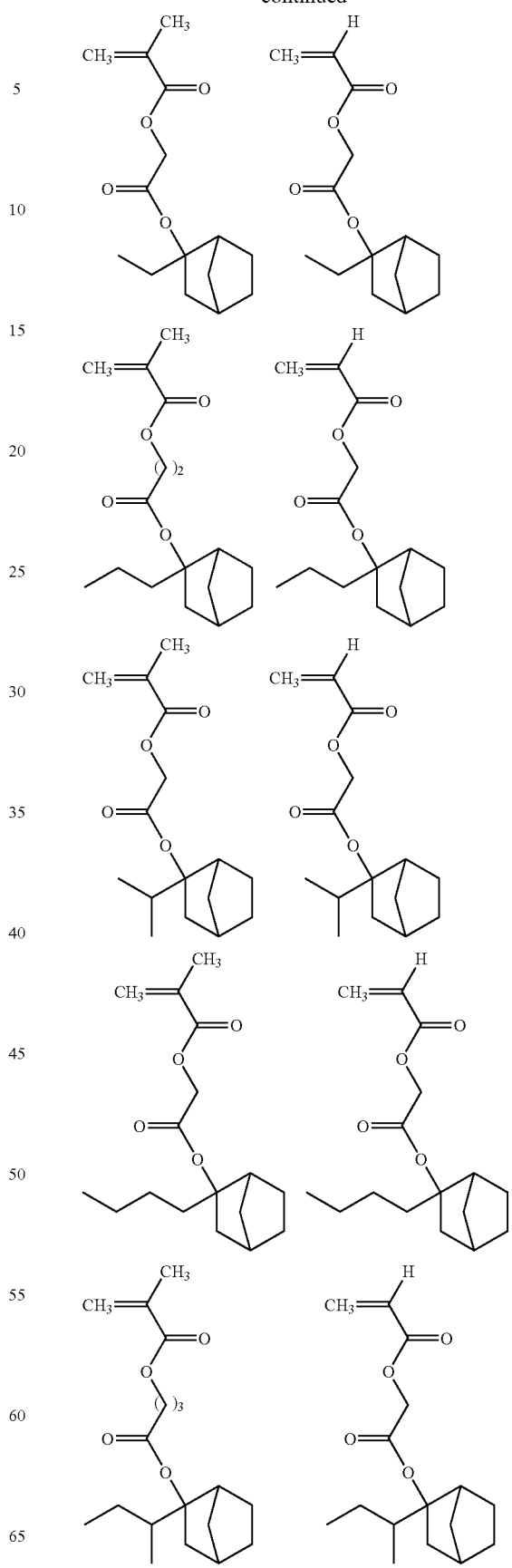

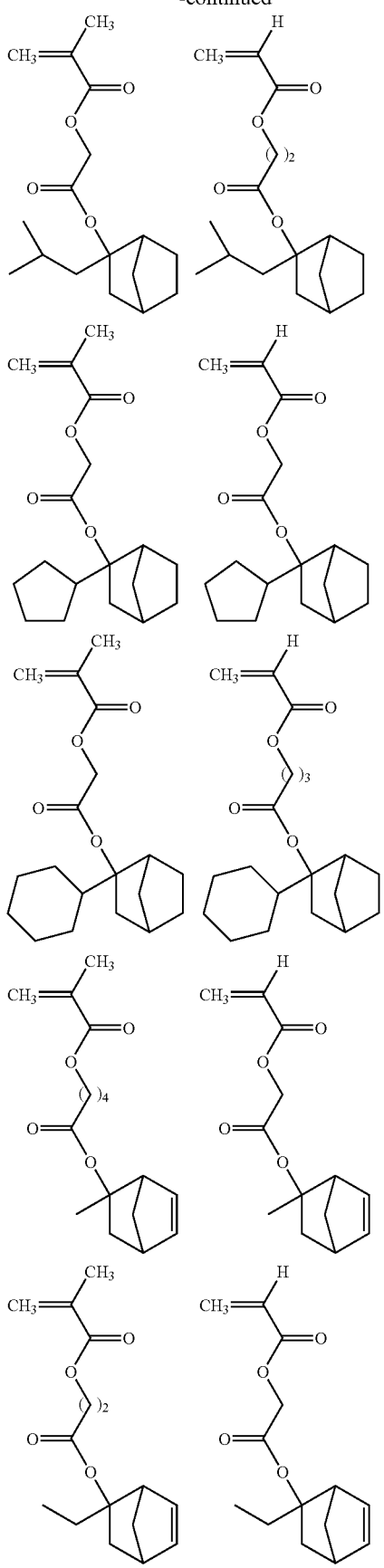
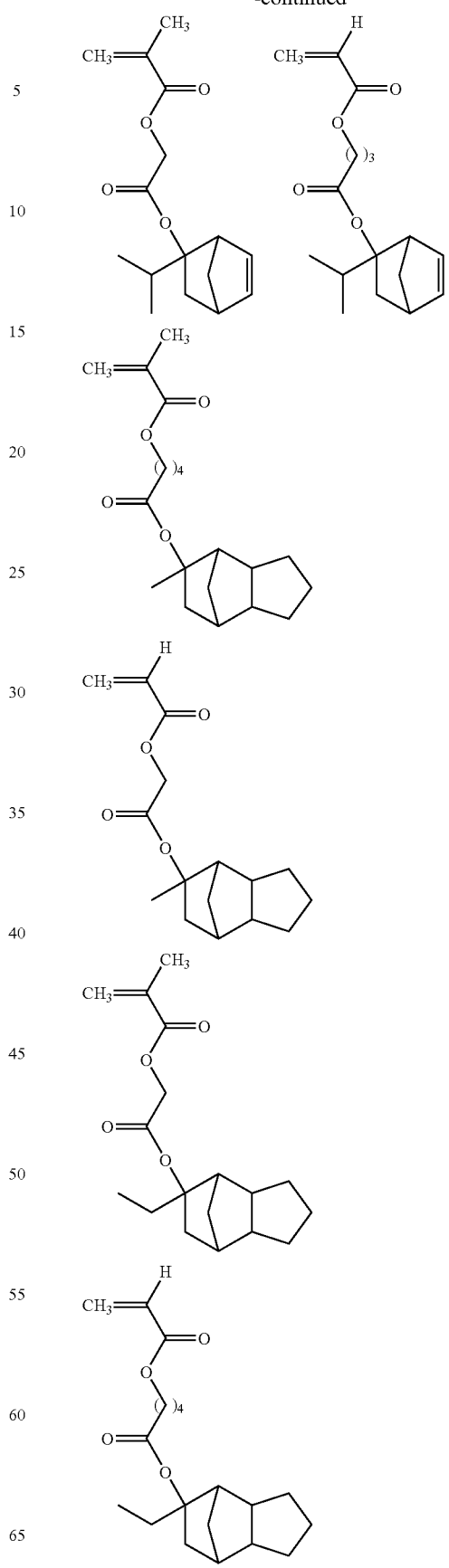

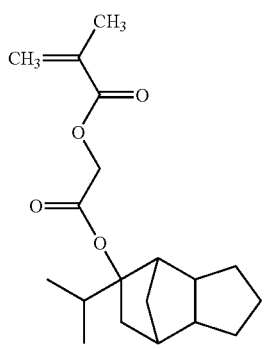

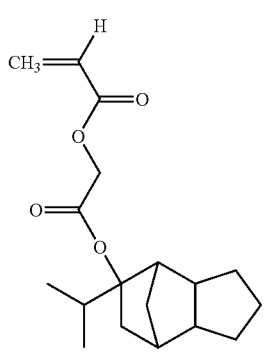

Among them, the structural unit (IIa) is preferable. The structural unit derived from 2-alkyl-2-adamantyl acrylate, 2-alkyl-2-adamantyl methacrylate, 1-(2-alkyl-2-adamantyloxycarbonyl)alkyl acrylate or 1-(2-alkyl-2-adamantyloxycarbonyl)alkyl methacrylate is more preferable since the resin (A) has a strong structure and shows a property that dry etching resistance is excellent. Further, when the resin (A) has the structural unit derived from 2-ethyl-2-adamantyl acrylate, 2-ethyl-2-adamantyl methacrylate, 2-isopropyl-2-adamantyl acrylate or 2-isopropyl-2-adamantyl methacrylate, a resist composition having excellent sensitivity and heat resistance tends to be obtained.

The monomers used for giving the structural unit (IIa) can usually be produced by a reaction of the corresponding hydroxyl-containing adamantane compound with an acrylic halide or a methacrylic halide. The monomers used for giving the structural unit (IIb) can usually be produced by a reaction of the corresponding hydroxyl-containing norbornene compound with an acrylic halide or a methacrylic halide.

Other examples of the structural unit having an acid-labile group include a structural unit represented by the formula (IIc) or (IId):

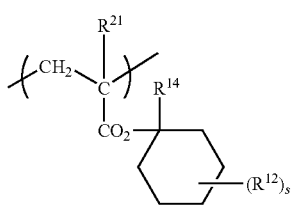

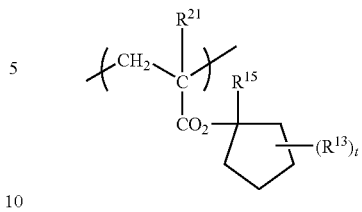

wherein $R^{21}$ is the same meaning as defined above, $R^{14}$ represents a C1-C8 alkyl group, $R^{12}$ is independently in each occurrence a C1-C8 alkyl group or a C1-C8 alkoxy group, s represents an integer of 0 to 10, $R^{15}$ represents a C1-C8 alkyl group, $R^{13}$ is independently in each occurrence a C1-C8 alkyl group or a C1-C8 alkoxy group and t represents an integer of 0 to 8.

Examples of the C1-C8 alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group and an n-octyl group. Examples of the C1-C8 alkoxy group include a methoxy group, an ethoxy group, an n-propoxy group, an isopropoxy group, an n-butoxy group, an isobutoxy group, a sec-butoxy group and a tert-butoxy group.

$R^{14}$ is preferably a C2-C5 alkyl group, and $R^{15}$ is preferably a C2-C5 alkyl group.

Examples of monomers from which the structural units represented by the formulae (IIc) and (IId) are derived include the followings.

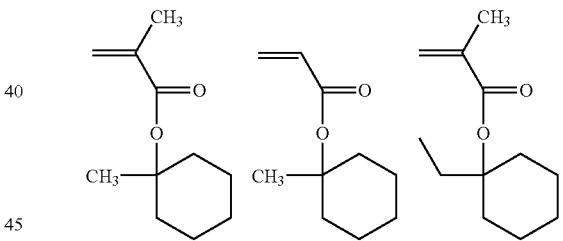

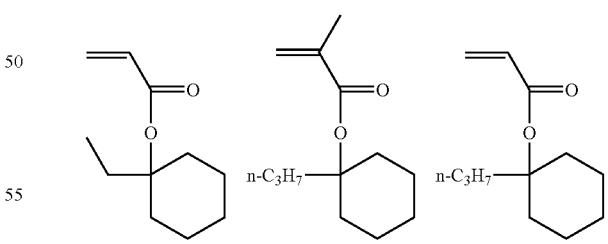

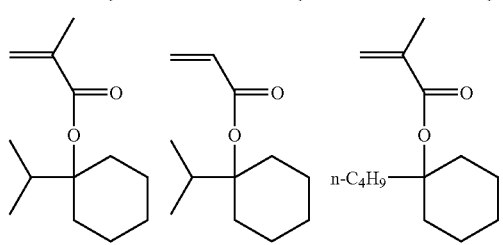

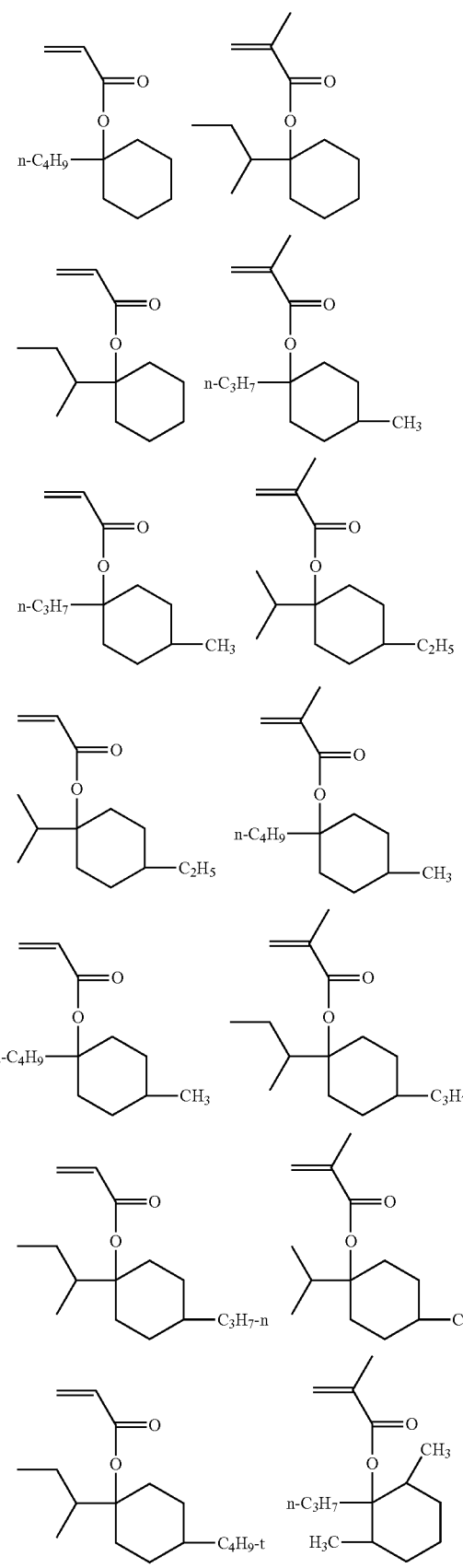
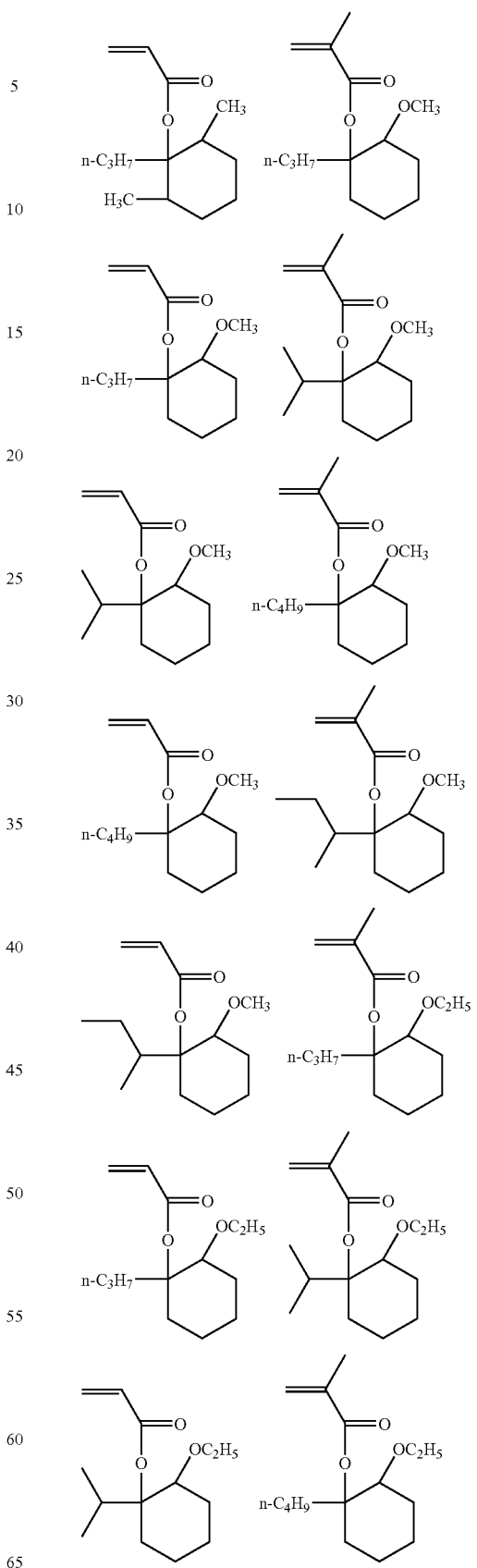

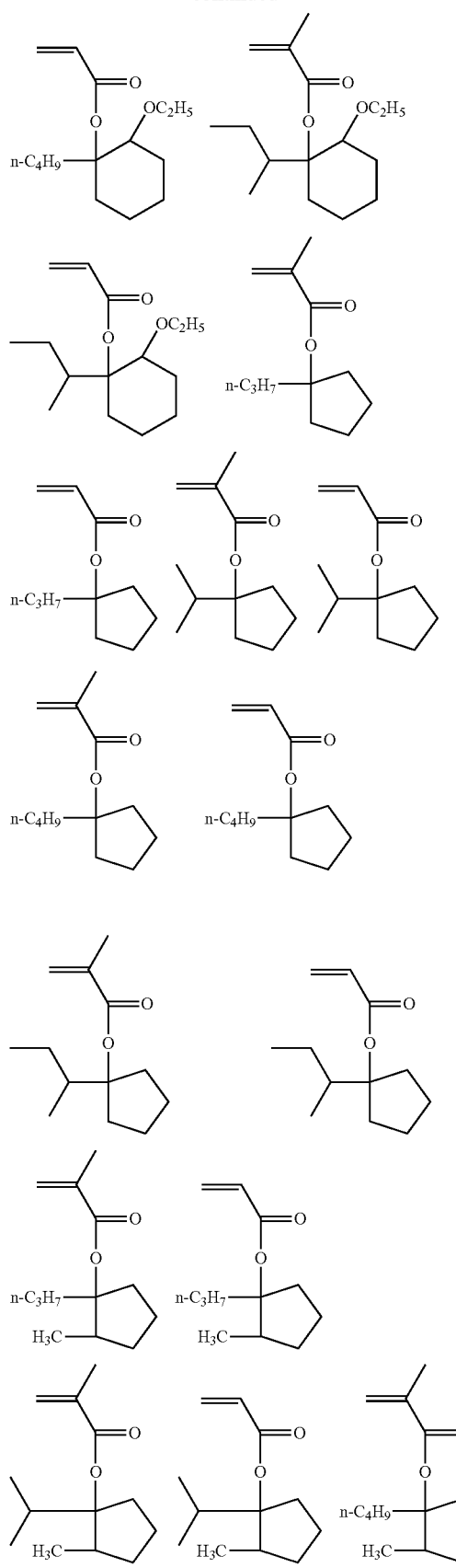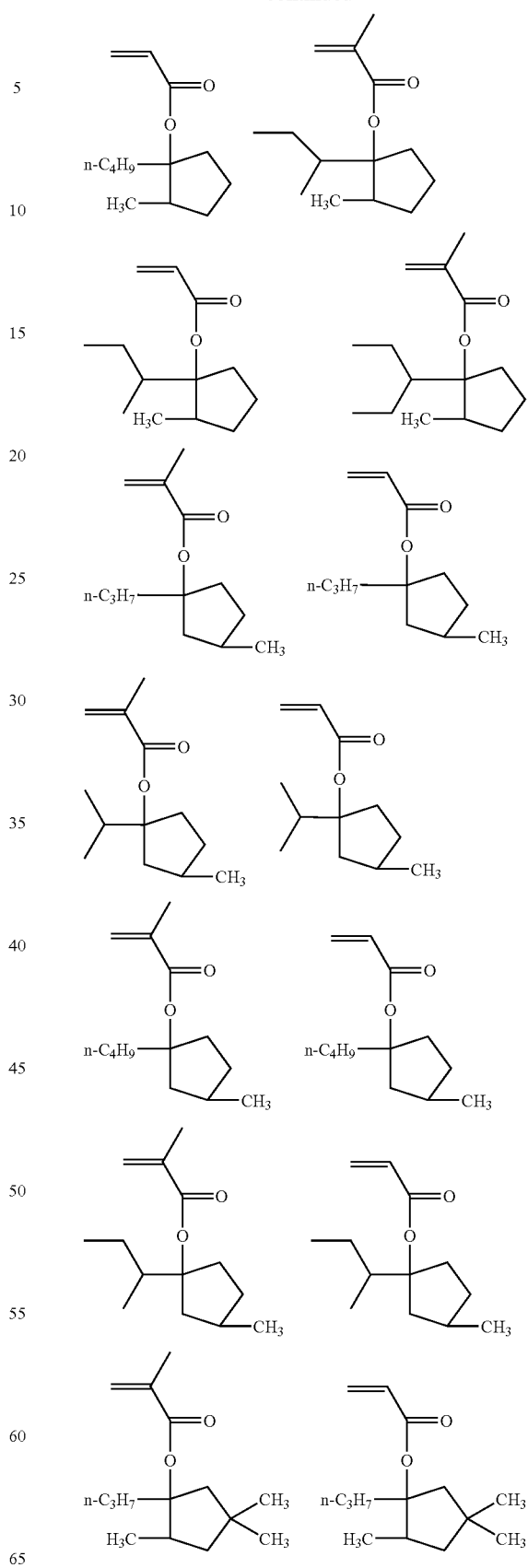

-continued

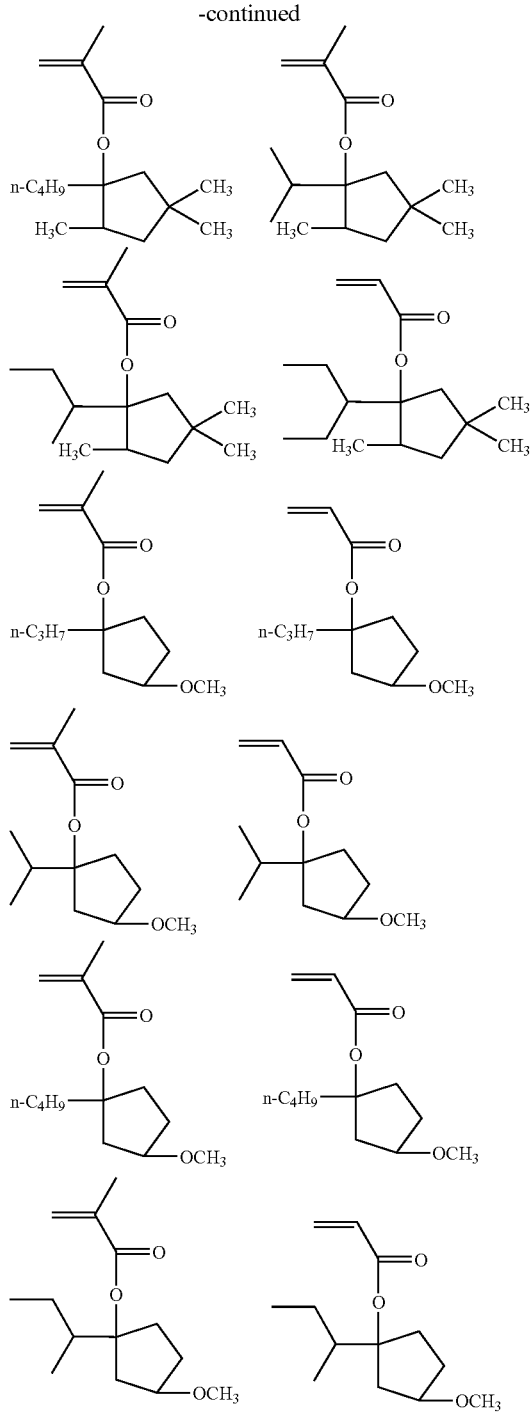

The resin (A) generally contains the structural unit having an acid-labile group in a ratio of 10 to 80 mol % based on all structural units of the resin (A) although the ratio varies depending on the kind of radiation for patterning exposure, the kind of the acid-labile group and the like, and The resin (A) preferably contains the structural unit having an acid-labile group in a ratio of 15 to 70 mol % based on all structural units of the resin (A) from the viewpoint of dry etching resistance.

The resin may have one or more structural units having a lactone structure.

The resin (A) preferably contains a structural unit represented by the formula (III):

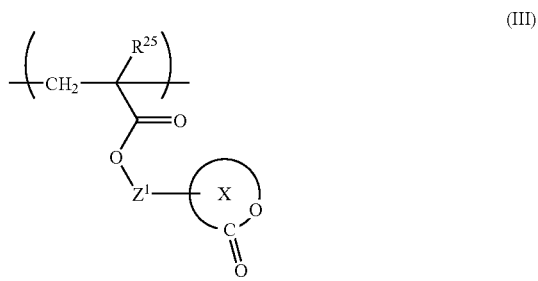

(III)

wherein $R^{25}$ represents a hydrogen atom or a methyl group, ring X represents an unsubstituted or substituted C3-C30 cyclic hydrocarbon group having —COO—, $Z^1$ represents a single bond or —$(CH_2)_{k'}$—COO—, and k' represents an integer of 1 to 4 (hereinafter, simply referred to as the structural unit (III)).

The cyclic hydrocarbon group having —COO— may be a monocyclic hydrocarbon group and a polycyclic hydrocarbon group. Examples of the substituents of the cyclic hydrocarbon group include a C1-C4 hydrocarbon group, a carboxyl group and a cyano group.

$Z^1$ is preferably a single bond or —$CH_2$—COO—.

The resin (A) may contain two or more kinds of the structural unit (III).

Examples of the structural unit (III) include the following structural units represented by the formulae (IIIa), (IIIb) and (IIIc):

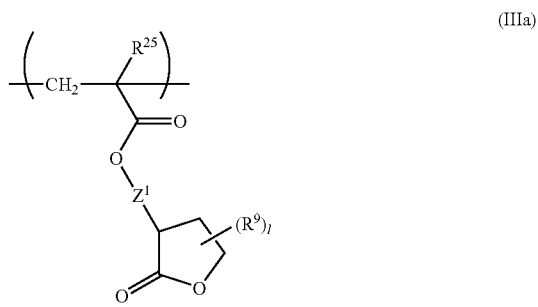

(IIIa)

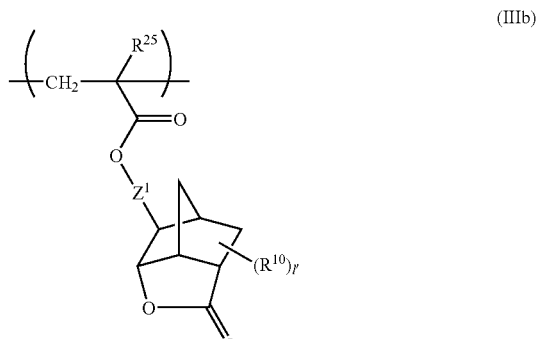

(IIIb)

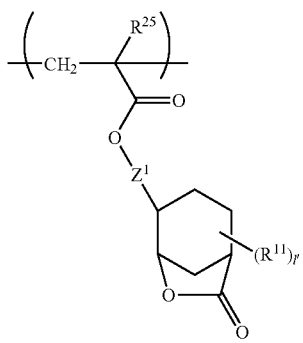

wherein $R^{25}$ and $Z^1$ are the same as defined above, $R^9$ represents a methyl group, $R^{19}$ is independently in each occurrence a carboxyl group, a cyano group or a C1-C4 hydrocarbon group, l represents an integer of 0 to 5, and l' represents an integer of 0 to 9.

The structural unit represented by the formula (IIIa) wherein l is 0 is preferable, and the structural units represented by the formulae (IIIb) and (IIIc) wherein l' is 0 are also preferable.

Examples of the C1-C4 hydrocarbon group include a methyl group, an ethyl group, an n-propyl group, an isopropyl group, an n-butyl group, an isobutyl group and a tert-butyl group.

Examples of the monomer used for giving the structural unit represented by the formula (IIIa) include the followings.

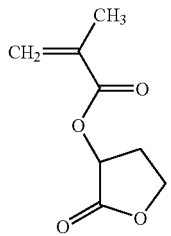 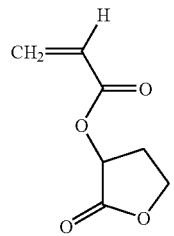

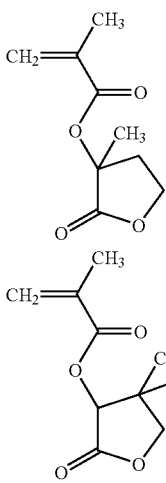
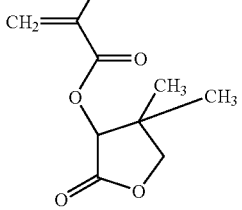
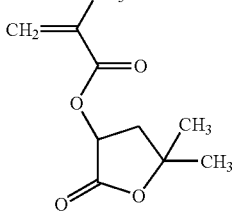
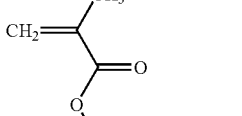
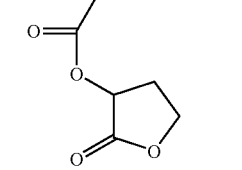
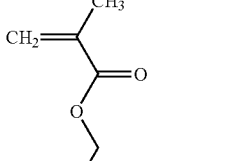
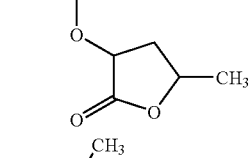
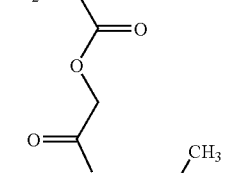
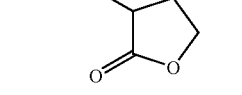

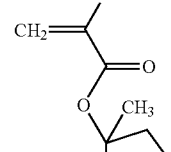
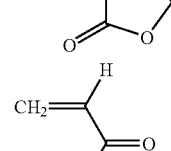
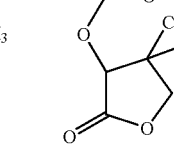
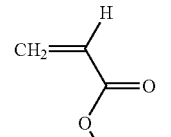
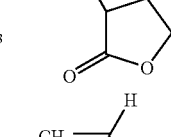
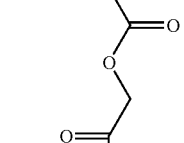
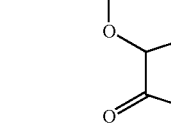
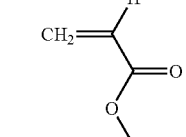
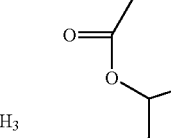
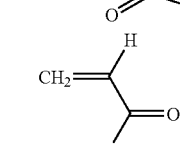
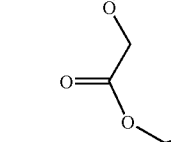

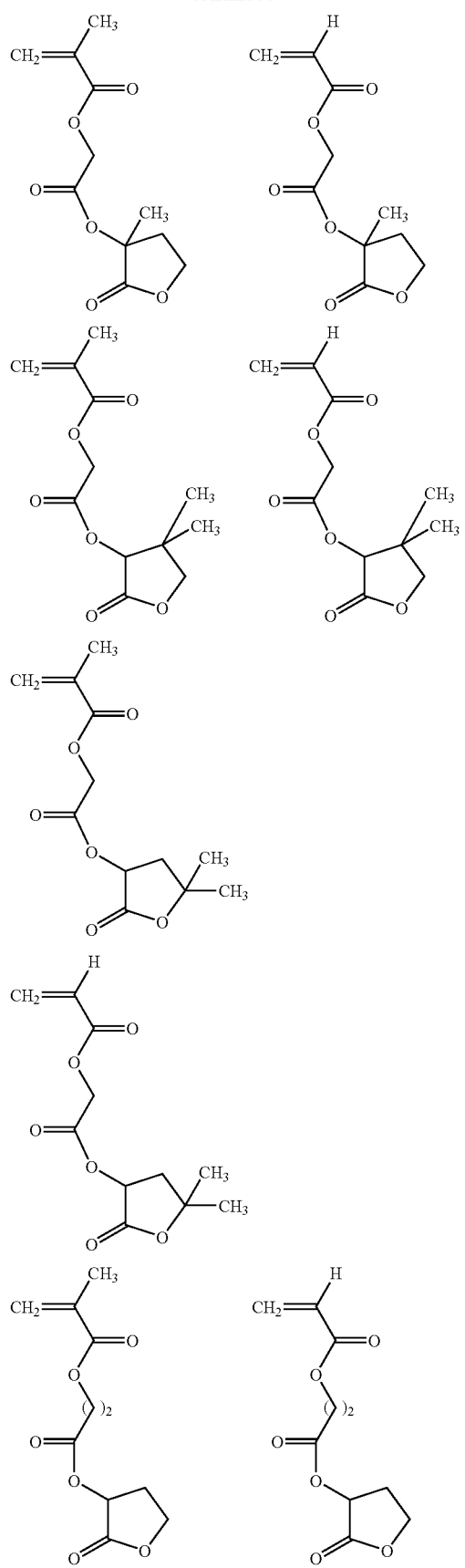
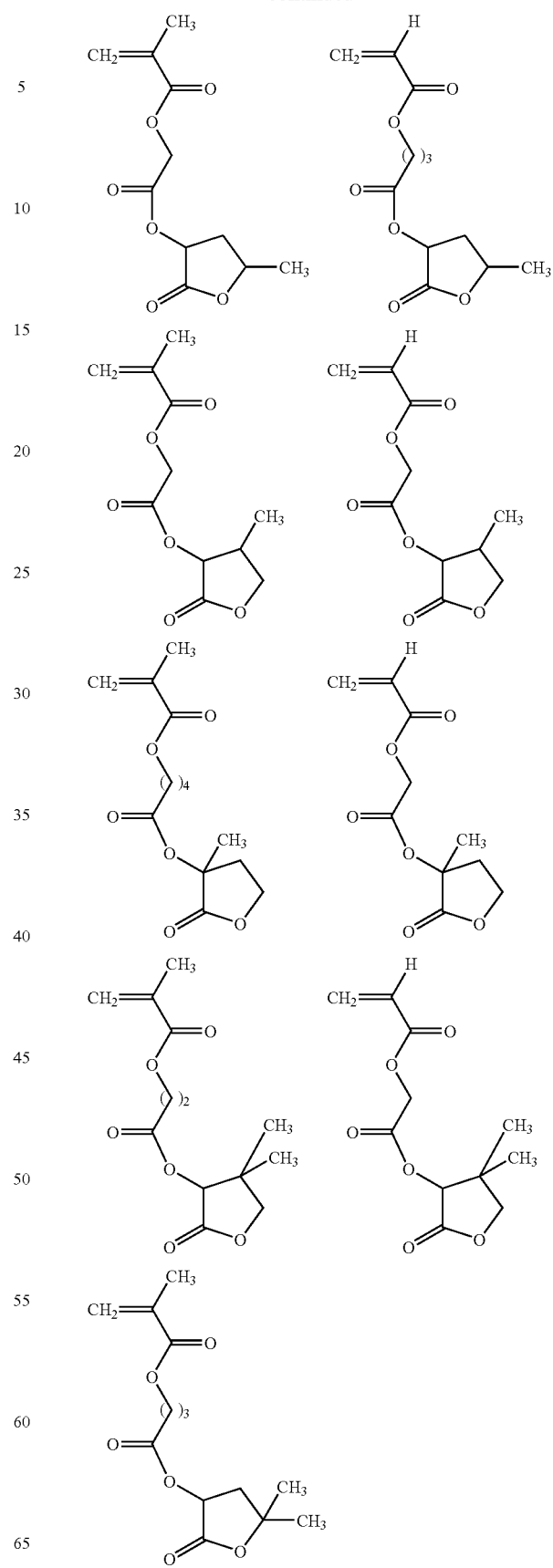

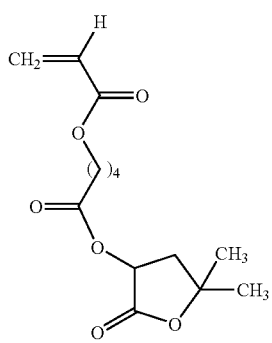
Examples of the monomer used for giving the structural unit represented by the formula (IIIb) include the followings.
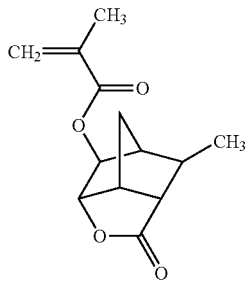
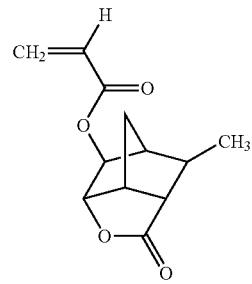
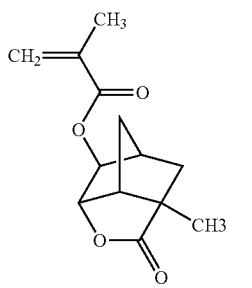
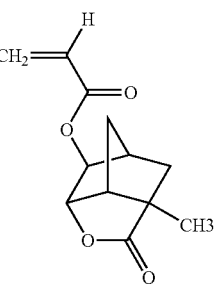
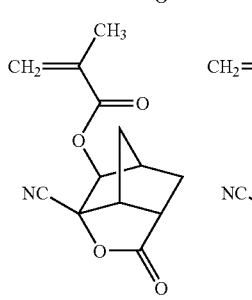
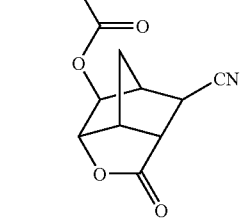
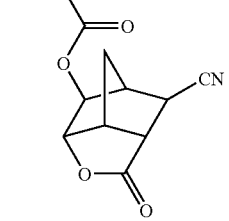
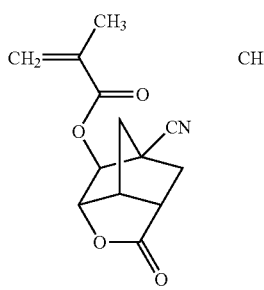
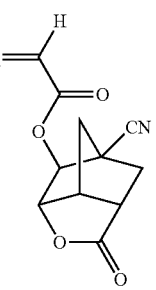
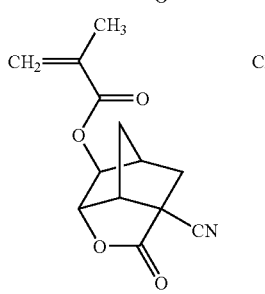
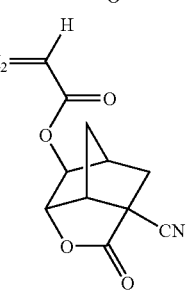

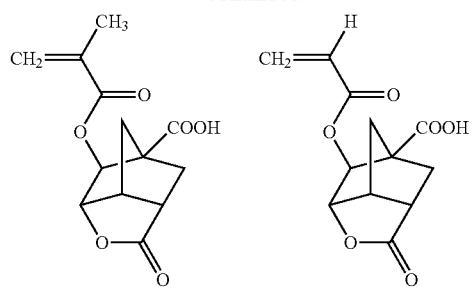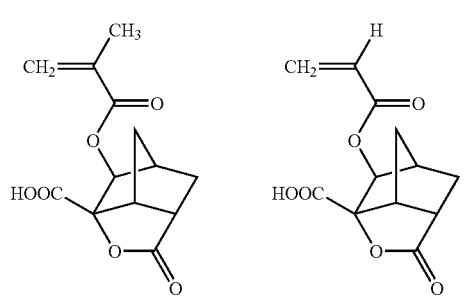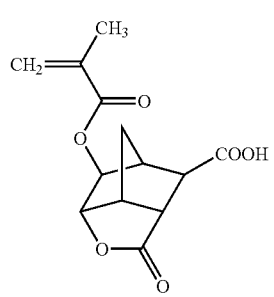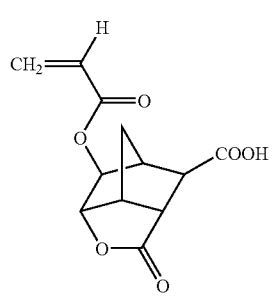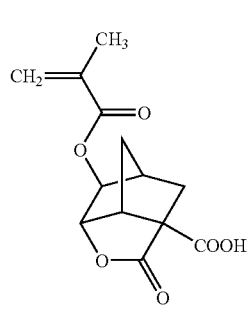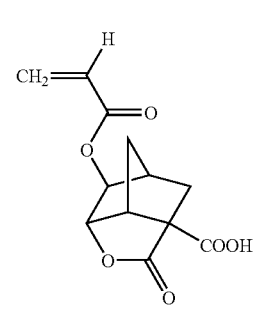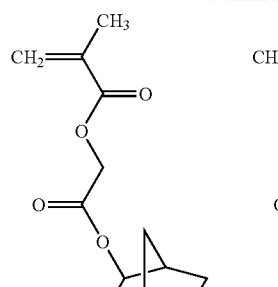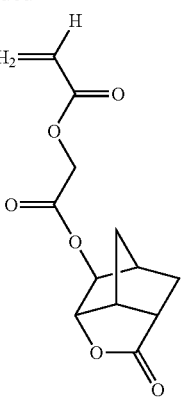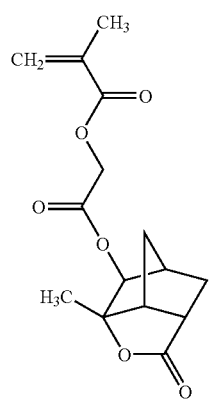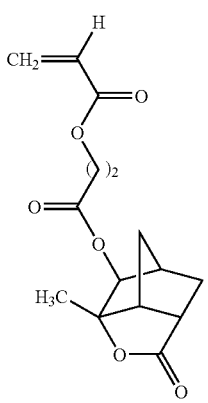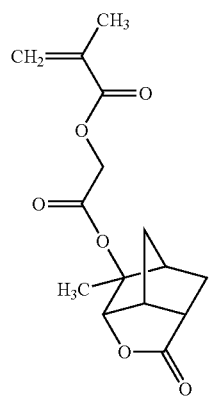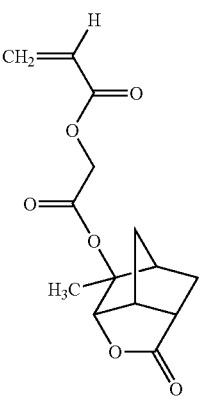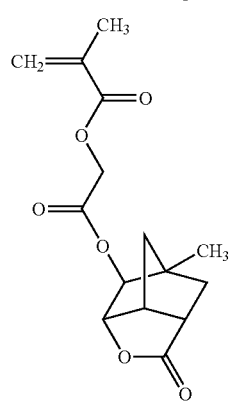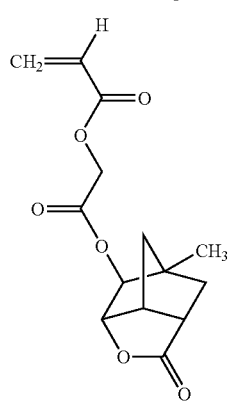

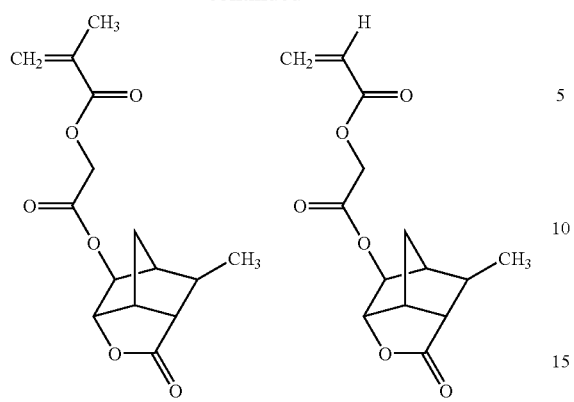
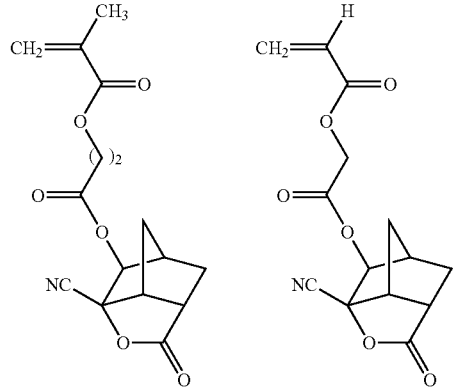
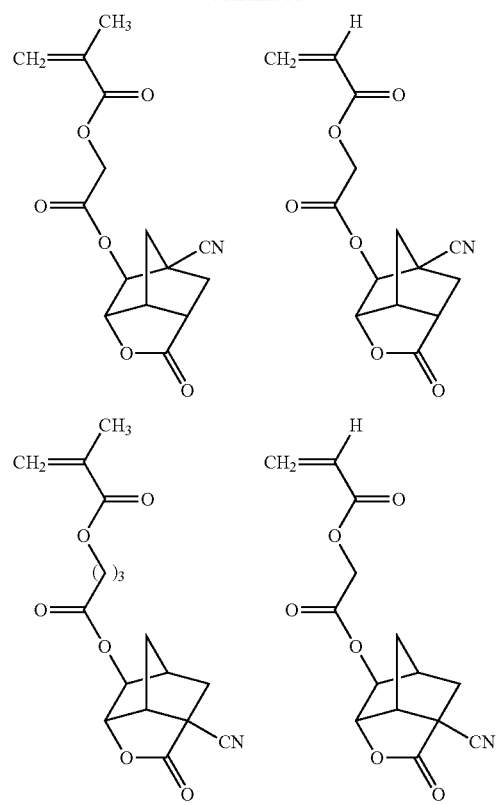
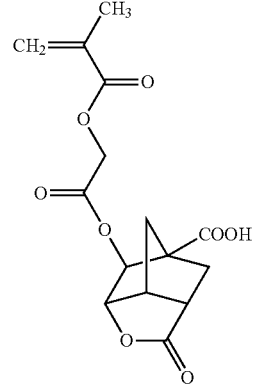
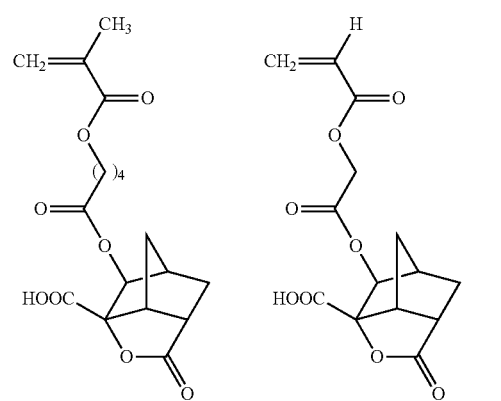

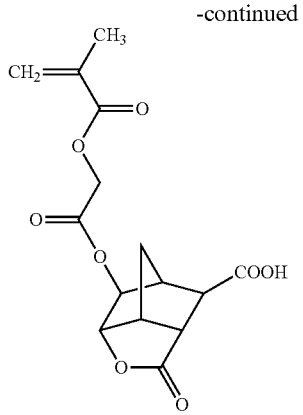
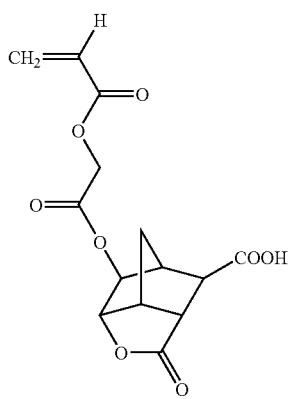
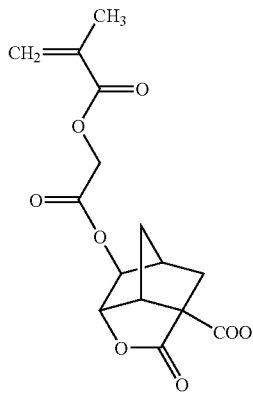
Examples of the monomer used for giving the structural unit represented by the formula (IIIc) include the followings.
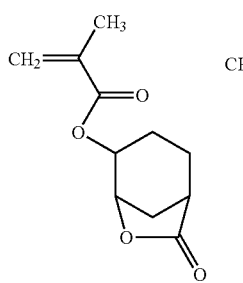
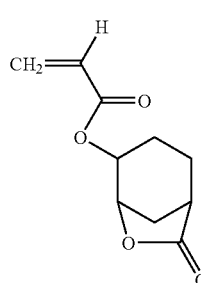
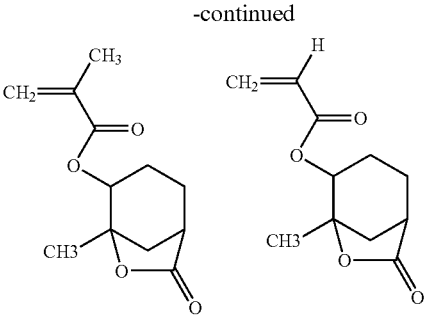
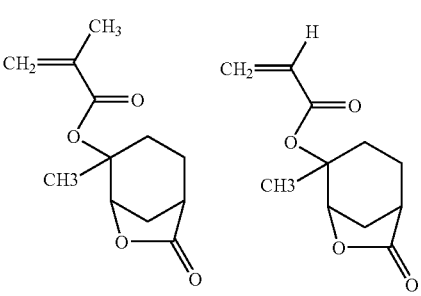
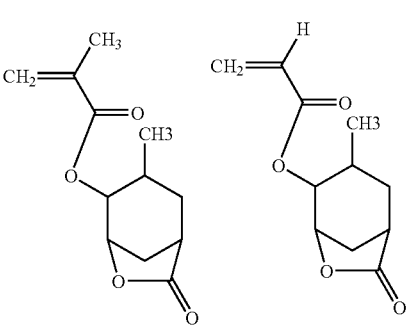
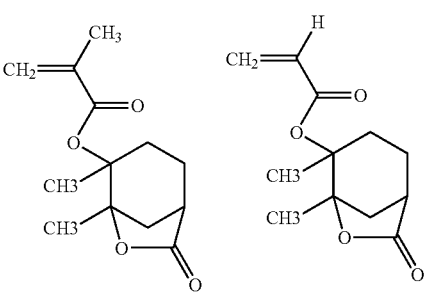
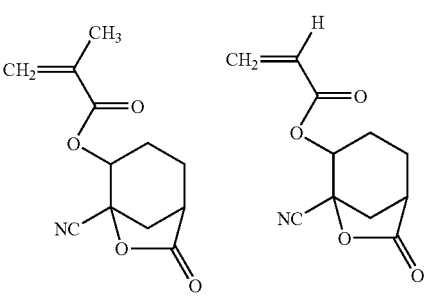

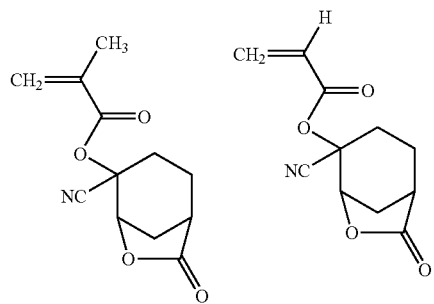
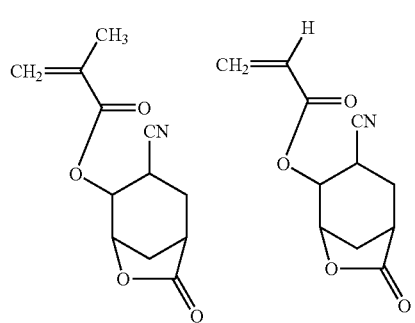
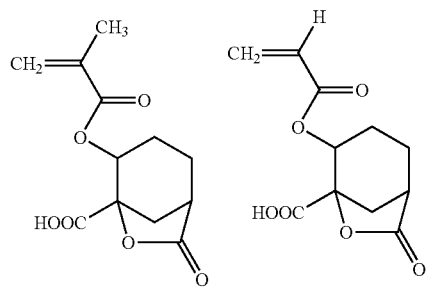
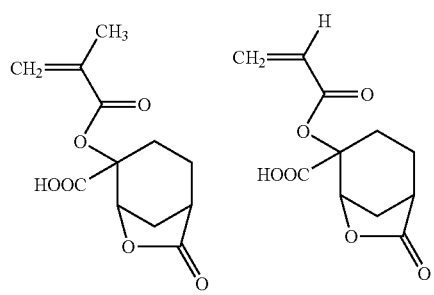
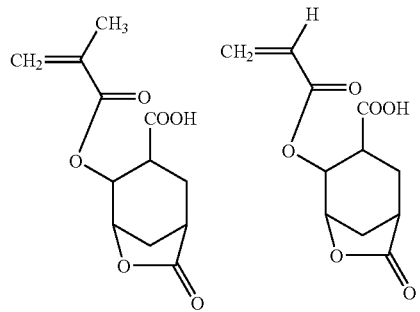
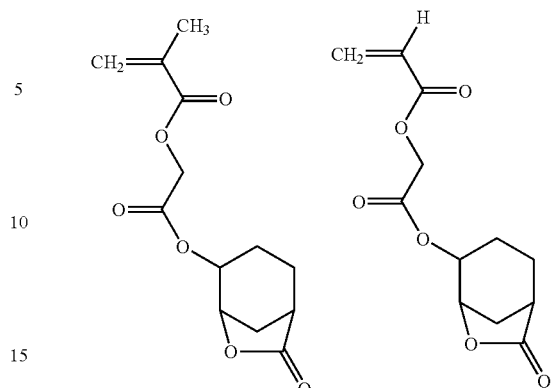
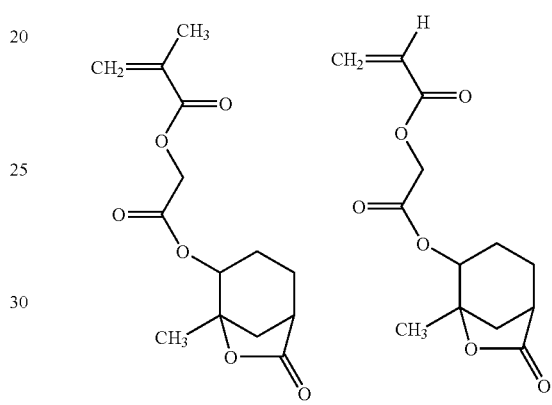
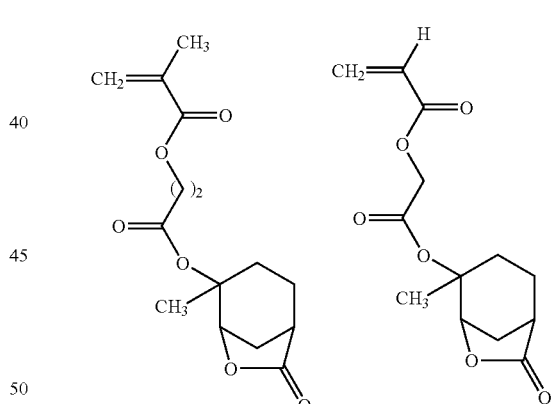
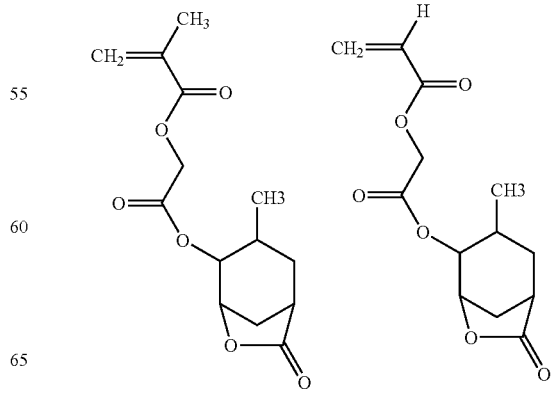

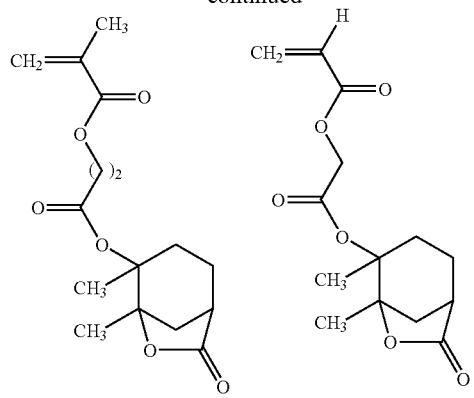
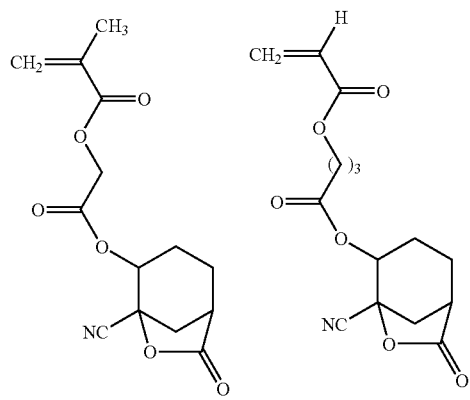
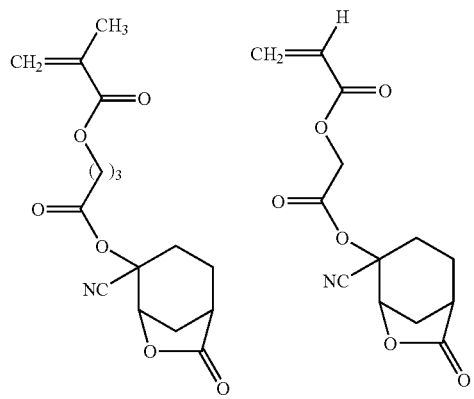
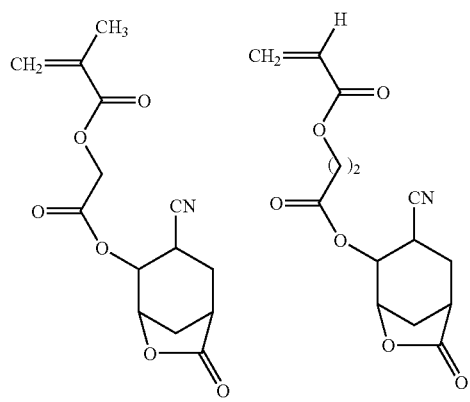
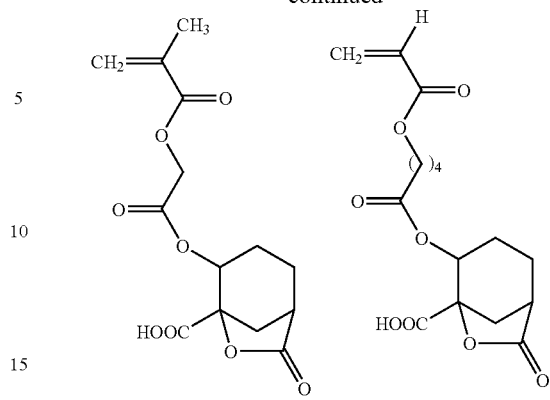
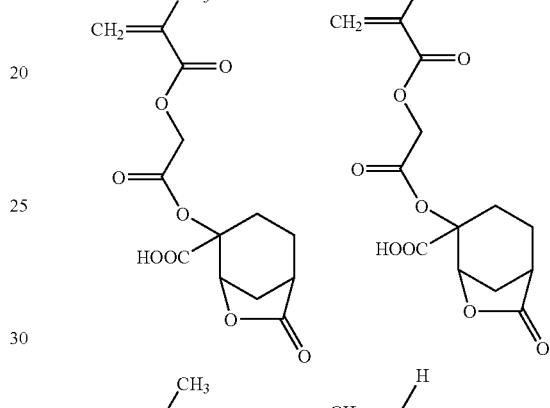
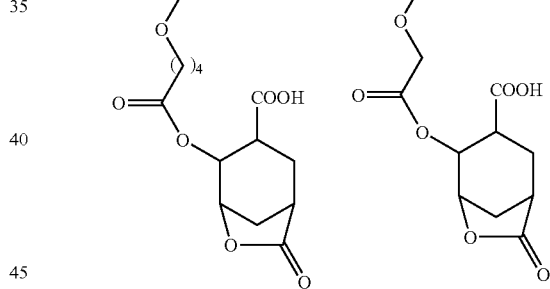

The resin may contain two or more structural units selected from the group consisting of the structural units represented by the formulae (IIIa), (IIIb) and (IIIc).

Among the structural units represented by the formulae (IIIa), (IIIb) and (IIIc), the structural units represented by the formulae (IIIa) and (IIIb) are preferable. The structural units derived from hexahydro-2-oxo-3,5-methano-2H-cyclopenta[b]furan-6-yl acrylate, hexahydro-2-oxo-3,5-methano-2H-cyclopenta[b]furan-6-yl methacrylate, tetrahydro-2-oxo-3-furyl acrylate, tetrahydro-2-oxo-3-furyl methacrylate are preferable in viewpoint of the adhesiveness of resist composition to a substrate. The structural units derived from 2-(5-oxo-4-oxatricyclo[4.2.1.0$^{3,7}$]nonan-2-yloxy)-2-oxoethyl acrylate and 2-(5-oxo-4-oxatricyclo[4.2.1.0$^{3,7}$]nonan-2-yloxy)-2-oxoethyl methacrylate are preferable because the pattern having good profile can be obtained when the resin containing the above-mentioned structural unit is used in the present resist composition.

The monomers used for giving the structural units represented by the formulae (IIIa), (IIIb) and (IIIc) can usually be produced by a reaction of the corresponding hydroxyl-containing lactone compound with an acrylic halide or methacrylic halide.

When the resin (A) contains the structural unit represented by the formula (III), the resin (A) preferably contains the structural unit represented by the formula (III) in a ratio of 5 to 80 mol % and more preferably in a ratio of 10 to 60 mol % based on all structural units of the resin (A) although the ratio varies depending on the kind of radiation for patterning exposure, the kind of the acid-labile group and the like.

The resin (A) may have a structural unit having a hydroxyl group in a side chain in addition to the structural unit having an acid-labile group. In the present specification, —OH of a carboxyl group is not a hydroxyl group.

Examples of the structural unit having a hydroxyl group in a side chain include a structure having an alkyl ester group (for example, a methyl ester group and a tert-butyl ester group) in which at least one hydrogen atom is replaced by a hydroxyl group, an alicyclic ester group (for example, a cyclopentyl ester group, a cyclohexyl ester group, a norbornyl ester group, a 1-adamantyl ester group and a 2-adamantyl ester group) in which at least one hydrogen atom is replaced by a hydroxyl group.

Examples of the structural unit having a hydroxyl group in a side chain include a structural unit represented by the formula (IV):

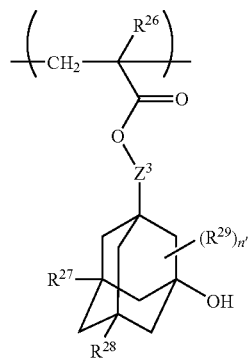

(IV)

wherein $R^{26}$ represents a hydrogen atom or a methyl group, $R^{27}$ and $R^{28}$ each independently represents a hydrogen atom, a methyl group or a hydroxyl group, $R^{29}$ represents a methyl group, n' represents an integer of 0 to 12, $Z^3$ represents a single bond or a —$(CH_2)_{q'}$—COO— group, and q' represents an integer of 1 to 4.

The structural unit (IV) wherein $R^{27}$ and $R^{28}$ each independently represents a hydrogen atom or a hydroxyl group and n' is 0 is preferable.

The resin (A) may contain two or more kinds of the structural unit represented by the formula (IV).

The resin (A) preferably contains the structural unit (IV).

Specific examples of the monomer used to give the structural unit (IV) include the followings:

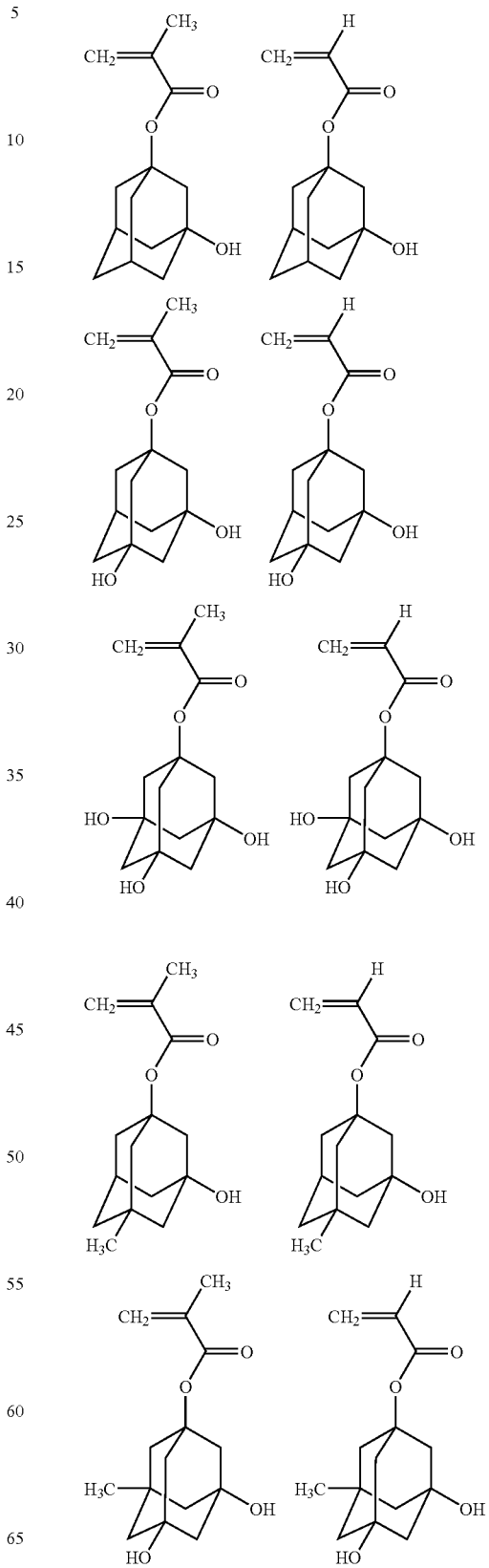

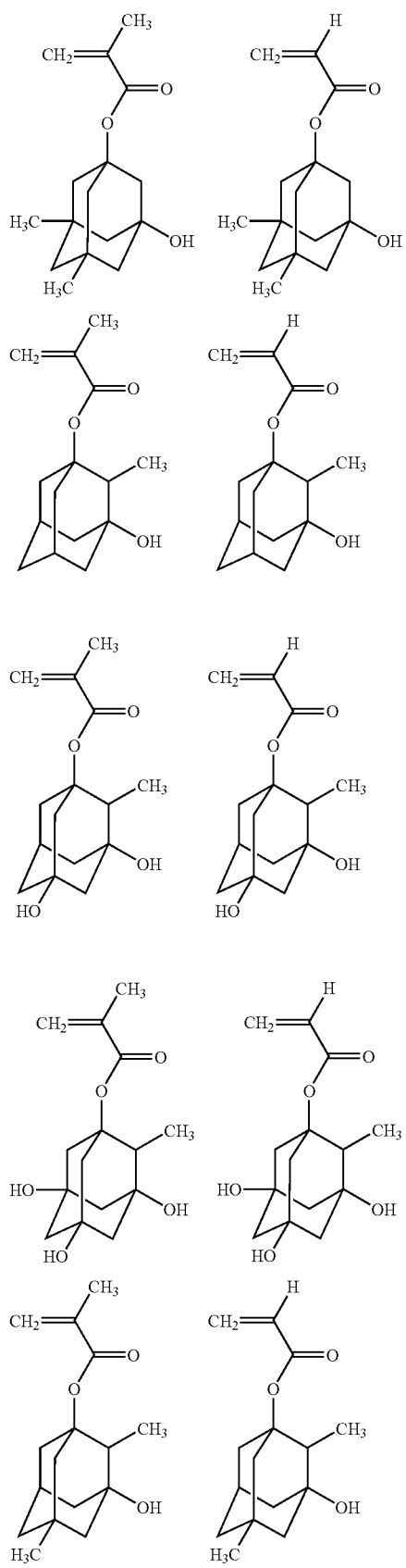
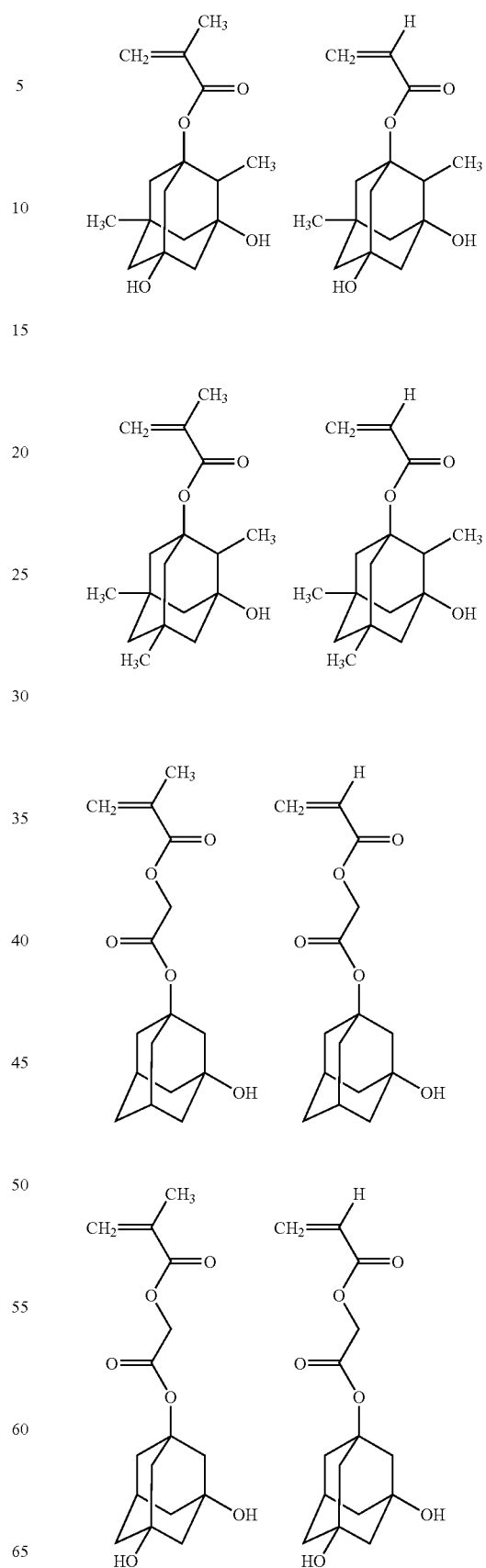

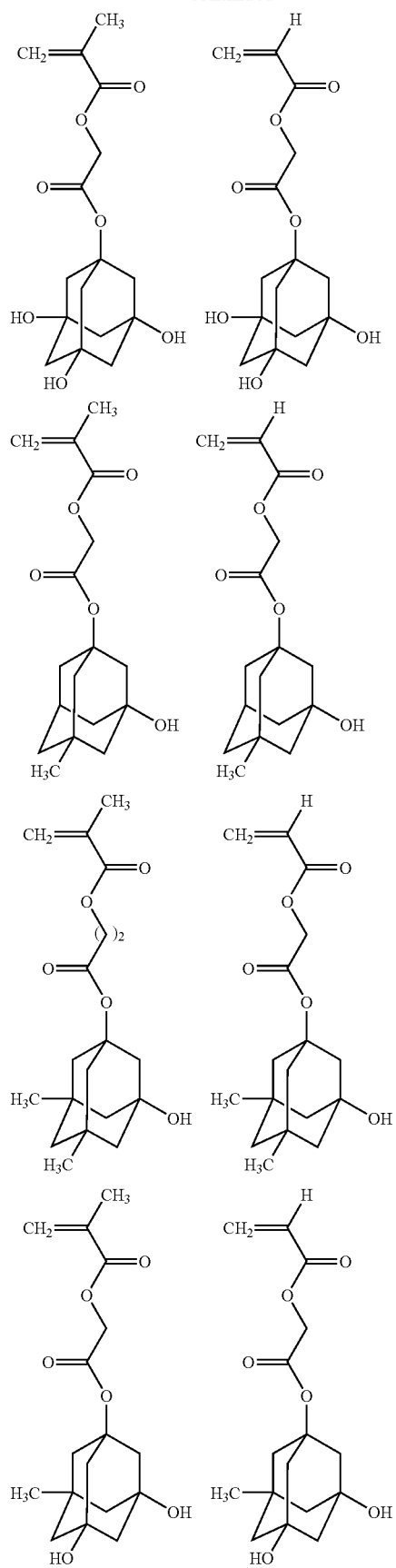
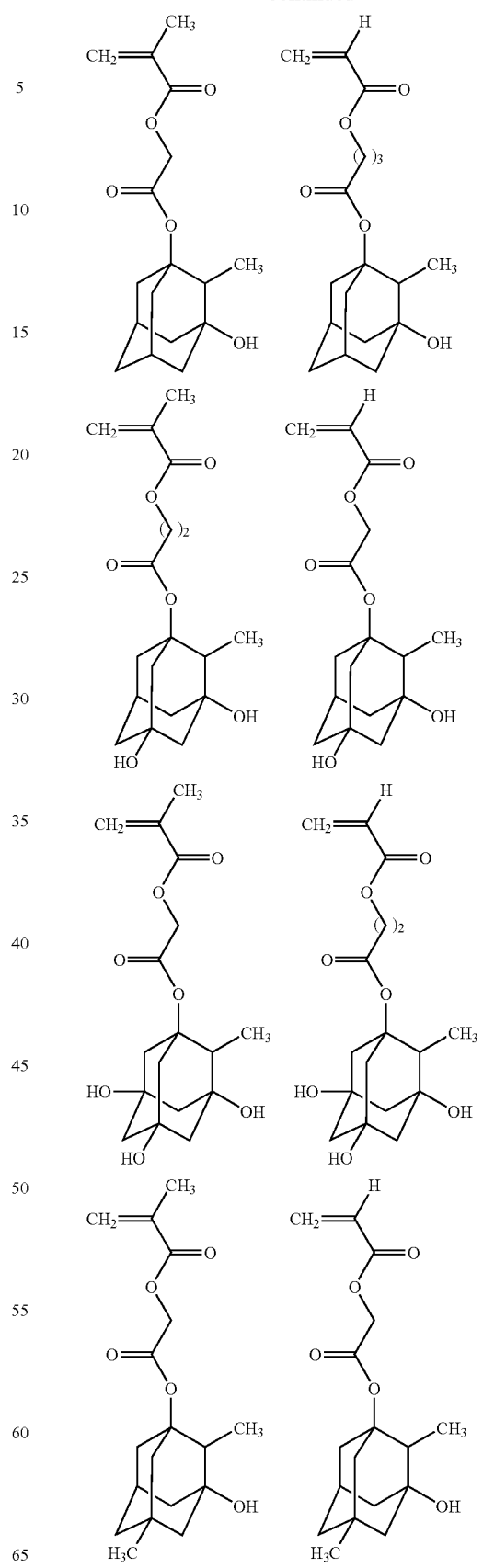

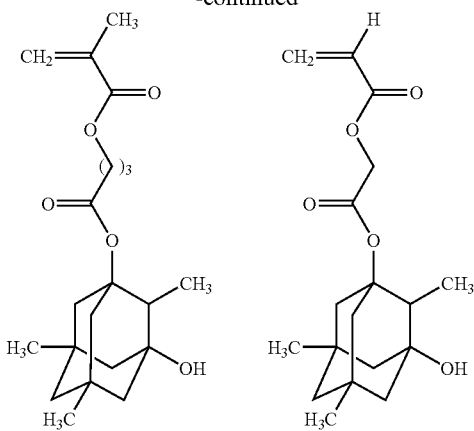

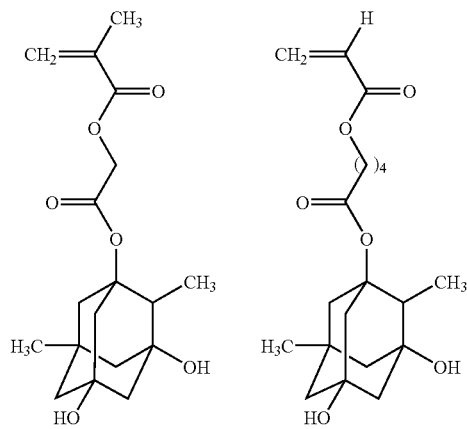

Among these monomers, 3-hydroxy-1-adamantyl acrylate, 3,5-dihydroxy-1-adamantyl acrylate, 3-hydroxy-1-adamantyl methacrylate, 3,5-dihydroxy-1-adamantyl methacrylate, 1-(3-hydroxy-1-adamantyloxycarbonyl)methyl methacrylate and 1-(3,5-dihydroxy-1-adamantyloxycarbonyl)methyl methacrylate are preferable because excellent resolution is obtained when the resin containing the structural unit derived from such monomer is used in the present resist composition.

3-Hydroxy-1-adamantyl acrylate, 3,5-dihydroxy-1-adamantyl acrylate, 3-hydroxy-1-adamantyl methacrylate and 3,5-dihydroxy-1-adamantyl methacrylate can be produced, for example, by reacting corresponding hydroxyl-substituted adamantane with acrylic acid, methacrylic acid, or its acid halide, and they are also commercially available.

The resin (A) usually contains the structural unit (IV) in a ratio of 0 to 40 mol % and preferably in a ratio of 5 to 35 mol % in all structural units of the resin (A) although the ratio varies depending on the kind of radiation for patterning exposure, the kind of the structural unit (IV) and the like.

The resin (A) itself is insoluble or poorly soluble in an alkali aqueous solution but becomes soluble in an alkali aqueous solution by the action of an acid.

The resin (A) may have a structural unit derived from an alicyclic compound having an olefinic double bond. Examples of the structural unit derived from an alicyclic compound having an olefinic double bond include a structural unit represented by the formula (1):

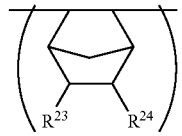

wherein $R^{23}$ and $R^{24}$ each independently represents a hydrogen atom, a C1-C3 alkyl group, a C1-C3 hydroxyalkyl group, a carboxyl group, a cyano group, a hydroxyl group or a —COOU group in which U represents an alcohol residue, or $R^{23}$ and $R^{24}$ can be bonded together to form a carboxylic anhydride residue represented by —C(=O)OC(=O)—;

a structural unit derived from an aliphatic unsaturated dicarboxylic anhydride such as a structural unit represented by the formula (2):

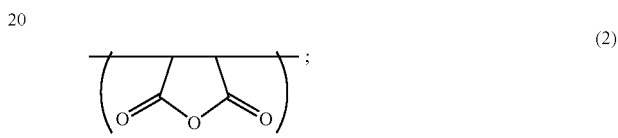

and
a structural unit represented by the formula (3):

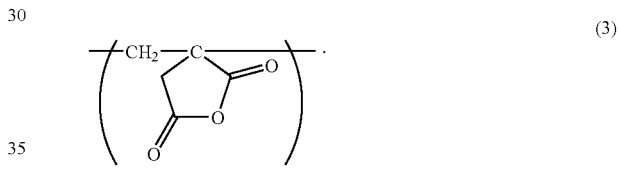

The polymer containing a structural unit derived from 2-norbornene shows strong structure because the alicyclic group is directly present on its main chain and shows a property that dry etching resistance is more excellent. The structural unit derived from 2-norbornene can be introduced into the main chain by radical polymerization using, for example, an aliphatic unsaturated dicarboxylic anhydride such as maleic anhydride and itaconic anhydride together in addition to corresponding 2-norbornene. The structural unit derived from 2-norbornene is formed by opening of its double bond, and can be represented by the above-mentioned formula (1). The structural units derived from maleic anhydride and from itaconic anhydride, which are the structural units derived from aliphatic unsaturated dicarboxylic anhydrides, are formed by opening of their double bonds, and can be represented by the above-mentioned formula (2) and the formula (3), respectively.

In $R^{23}$ and $R^{24}$, examples of the C1-C3 alkyl group include a methyl group, an ethyl group, and an n-propyl group, and examples of the C1-C3 hydroxyalkyl group include a hydroxymethyl group and a 2-hydroxyethyl group.

In $R^{23}$ and $R^{24}$, the —COOU group is an ester formed from the carboxyl group, and examples of the alcohol residue corresponding to U include an optionally substituted C1-C8 alkyl group, a 2-oxooxolan-3-yl group and a 2-oxooxolan-4-yl group, and examples of the substituent on the C1-C8 alkyl group include a hydroxyl group and an alicyclic hydrocarbon residue.

Specific examples of the monomer used to give the structural unit represented by the above-mentioned formula (1)

include 2-norbornene, 2-hydroxy-5-norbornene, 5-norbornene-2-carboxylic add, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the formula (1) is a structural unit having the acid-labile group even if it has the norbornane structure. Examples of monomers giving structural unit having the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, and 1-(1-adamantyl)-1-methylethyl 5-norbornene-2-carboxylate.

The resin (A) has usually polystyrene-equivalent weight-average molecular weight of about 1,000 to 500,000, and preferably of 4,000 to 50,000.

Next, the resin (B) will be illustrated.

The resin (B) comprises a structural unit represented by the formula (I):

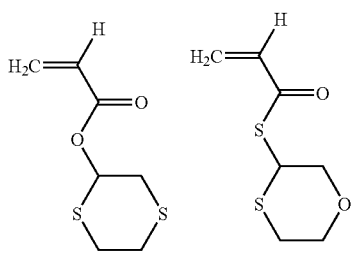

wherein $R^1$ represents a hydrogen atom, a halogen atom, a C1-C4 alkyl group or a C1-C4 perfluoroalkyl group, Z represents a single bond or —$(CH_2)_k$—CO—$X^4$—, k represents an integer of 1 to 4, $X^1$, $X^2$, $X^3$ and $X^4$ each independently represents an oxygen atom or a sulfur atom, m represents an integer of 1 to 3 and n represents an integer of 0 to 3 (hereinafter, simply referred to as the structural unit (I)), and a structural unit having a fluorine atom in a side chain.

Examples of the halogen atom include a fluorine atom. Examples of the C1-C4 alkyl group include a methyl group, an ethyl group, an n-propyl group, an isopropyl group, an n-butyl group and tert-butyl group, and a methyl group is preferable. Examples of the C1-C4 perfluoroalkyl group include a trifluoromethyl group, a pentafluoroethyl group, a heptafluoropropyl group and a nonafluorobutyl group, and a trifluoromethyl group is preferable. $R^1$ is preferably a hydrogen atom, a C1-C4 alkyl group or a C1-C4 perfluoroalkyl group, and is more preferably a hydrogen atom, a methyl group or a trifluoromethyl group.

$X^1$, $X^2$ and $X^4$ are preferably oxygen atoms or a sulfur atom, and $X^3$ is preferably a sulfur atom.

In the formula (I), m is preferably 1 and n is preferably 0, 1 or 2.

Examples of a monomer used for giving the structural unit (I) include the followings:

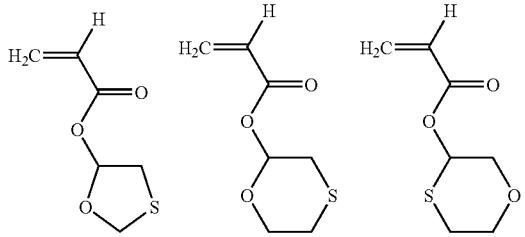

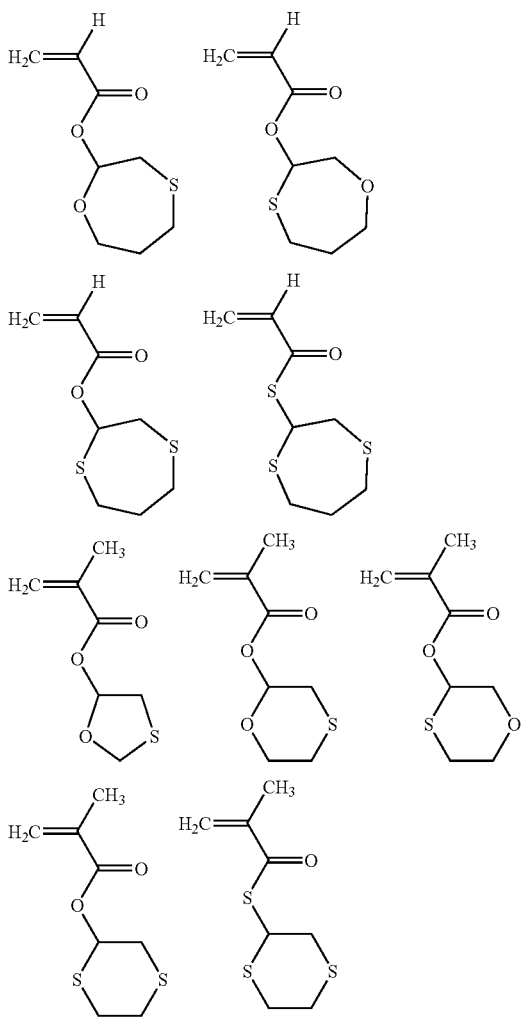

-continued

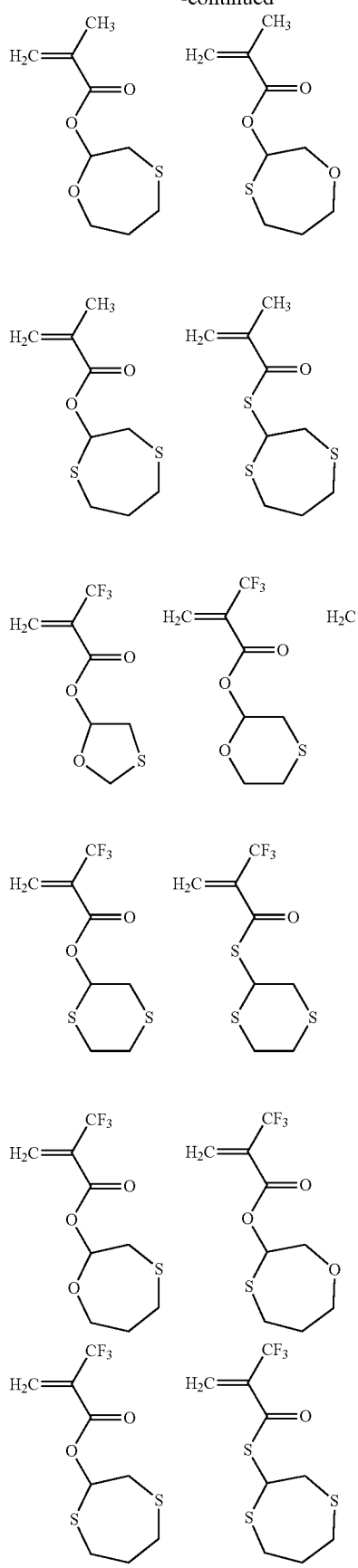

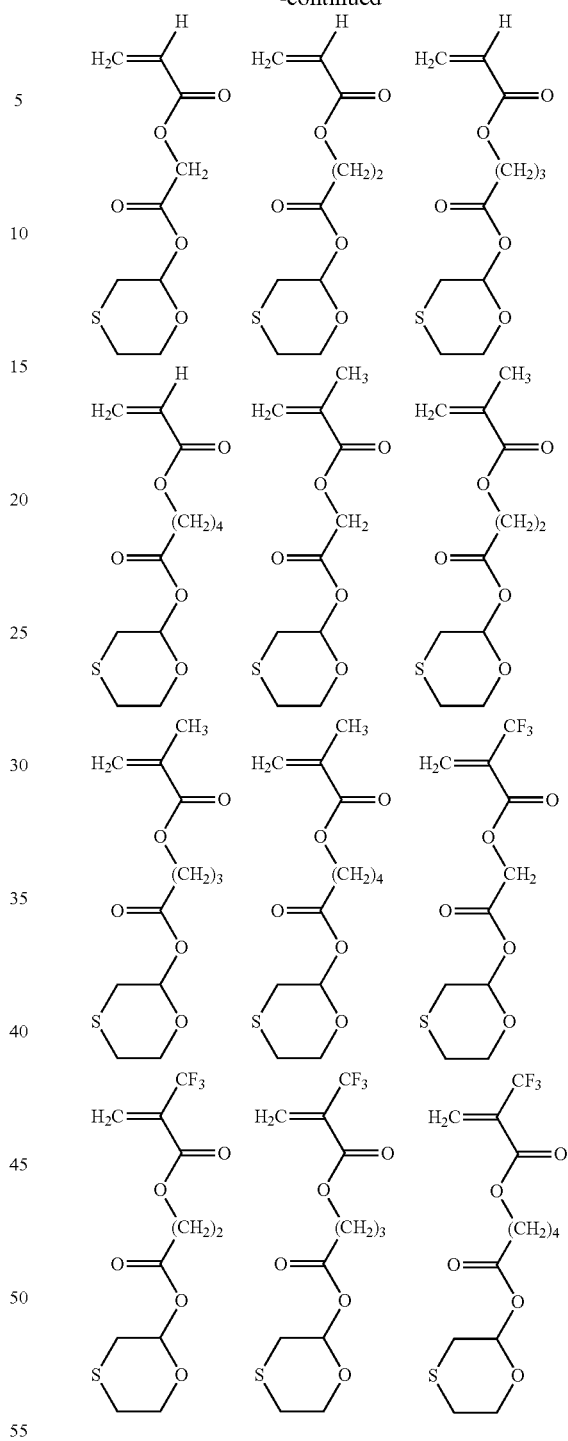

These monomers can be produced by reacting the corresponding alcohol compounds with acryloyl chloride, methacryloyl chloride, acrylic anhydride or methacrylic anhydride.

The resin (B) may contain two or more structural units (I).

The resin (B) usually contains the structural unit (I) in a ratio of 5 to 95 mol % and preferably in a ratio of 10 to 70 mol % in all structural units of the resin (B) although the ratio varies depending on the kind of radiation for patterning exposure, the kind of the structural unit (I) and the like.

Examples of the structural unit having a fluorine atom in a side chain include a structural unit represented by the formula (VI):

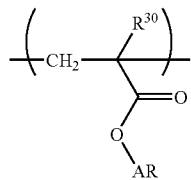
(VI)

wherein $R^{30}$ represents a hydrogen atom, a methyl group or a trifluoromethyl group, and AR represents a fluorine-containing C1-C30 hydrocarbon group which may have one or more hydroxyl groups and one or more methylene group in the hydrocarbon group may be replaced by —O—, —NH— or —S—.

Examples of the structural unit represented by the formula (VI) include a structural unit represented by the formula (VII):

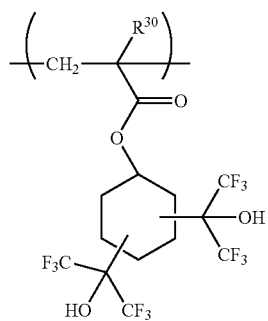
(VII)

wherein $R^{30}$ is the same meaning as defined above. The structural unit (VII) has a two (1,1,1,3,3,3-hexafluoro-2-hydroxy-2-propyl)cyclohexyl groups, and the bonding positions of two 1,1,1,3,3,3-hexafluoro-2-hydroxy-2-propyl group are not limited.

Examples of the fluorine-containing C1-C30 hydrocarbon group include a C1-C30 perfluoroalkyl group such as a trifluoromethyl group, a pentafluoroethyl group, a heptafluoropropyl group and a nonafluorobutyl group; a C1-C30 perfluoroalkoxyalkyl group such as a 1-trifluoromethoxyethyl group and a 1-pentafluoroethoxyethyl group; a C1-C30 perfluoroalkoxyperfluoroalkyl group such as a 1-trifluoromethoxydifluoroethyl group and a 1-pentafluoroethoxydifluoroethyl group; and the following:

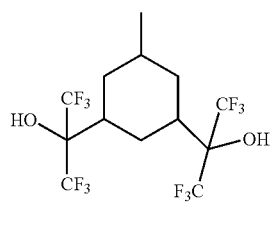

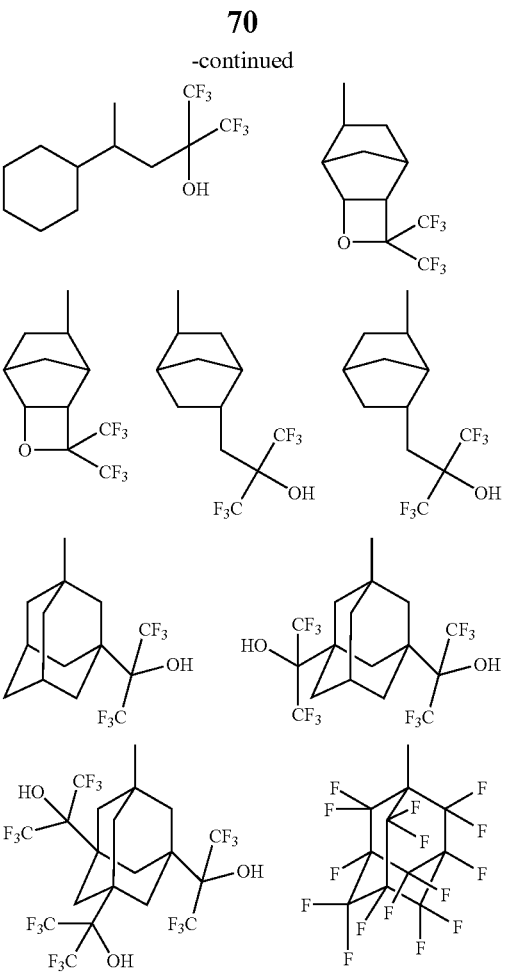

In the formulae above, straight line with an open end shows a bond extended from the adjacent oxygen group.

Examples of the monomer used to give the structural unit (VI) include the followings:

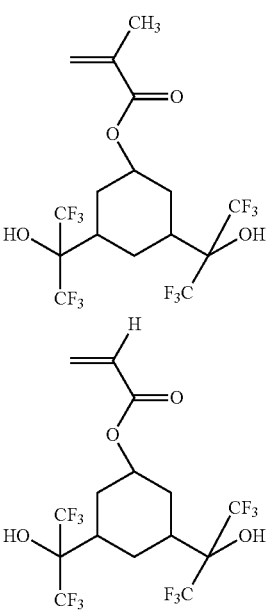

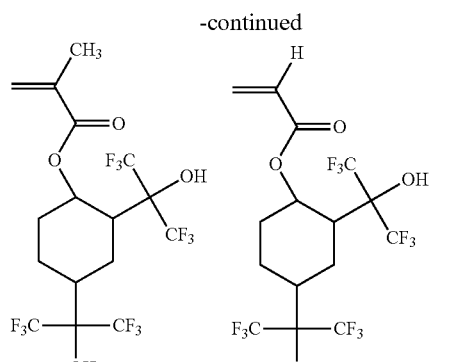
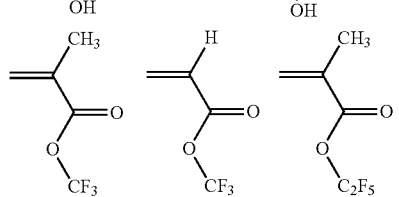
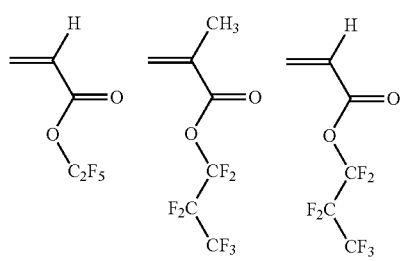
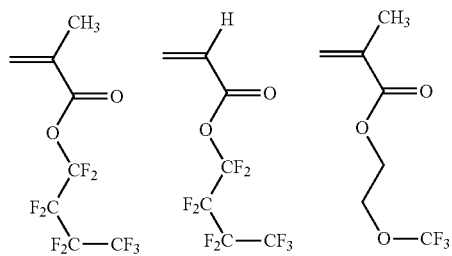
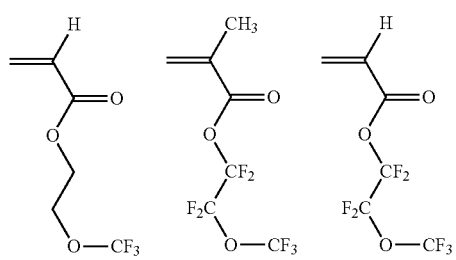
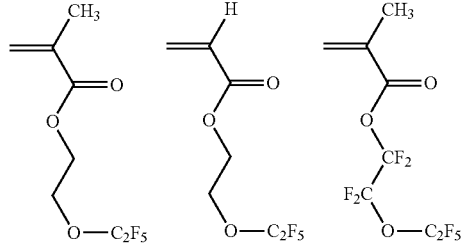
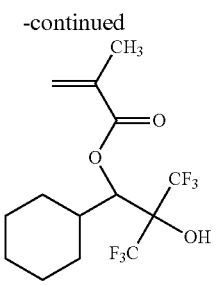
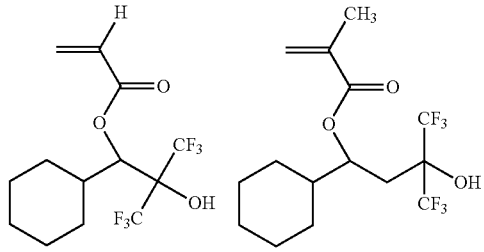
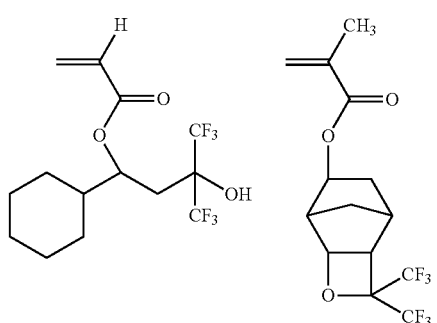
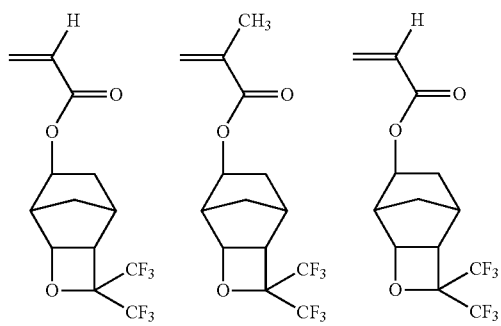
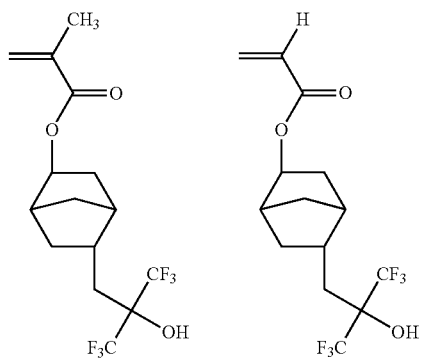

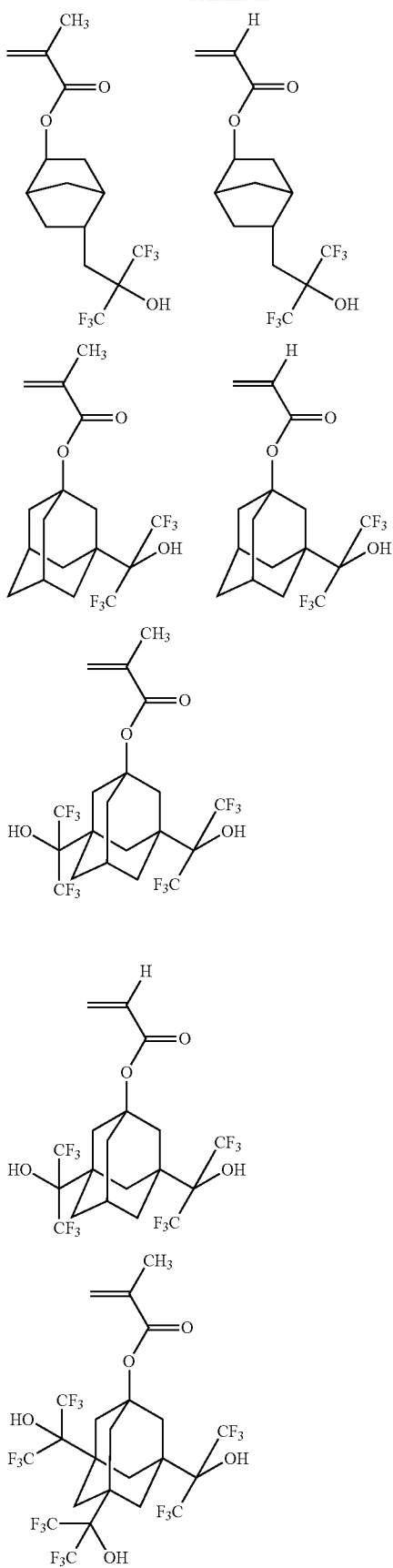

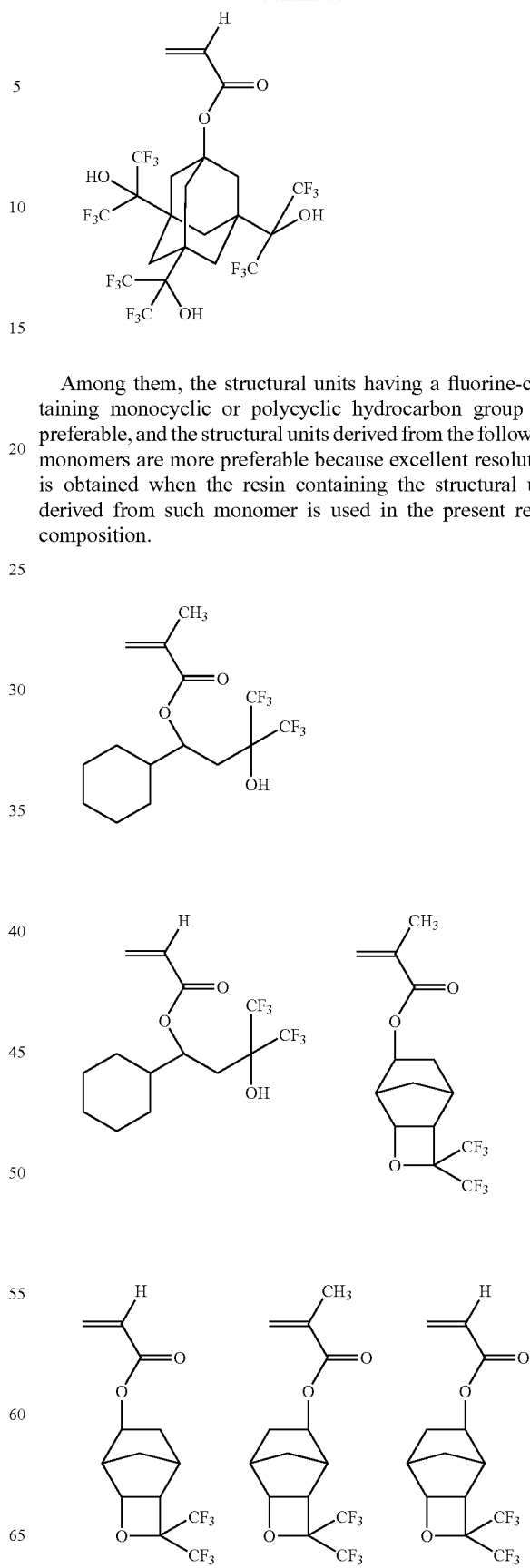

Among them, the structural units having a fluorine-containing monocyclic or polycyclic hydrocarbon group are preferable, and the structural units derived from the following monomers are more preferable because excellent resolution is obtained when the resin containing the structural unit derived from such monomer is used in the present resist composition.

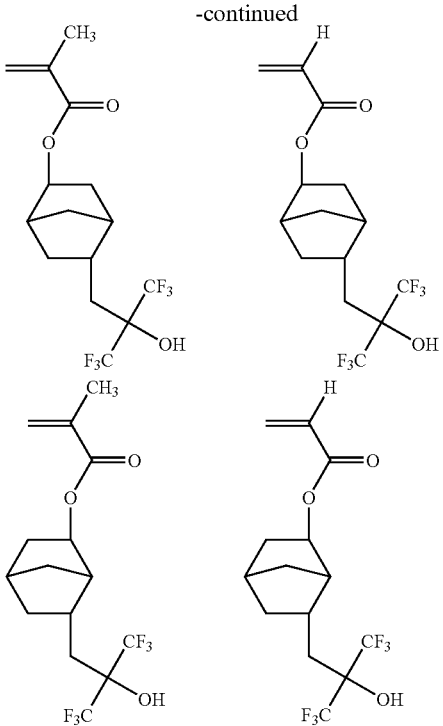

The resin (B) may contain two or more structural units having a fluorine atom in a side chain.

The resin (B) preferably contains the structural unit having a fluorine atom in a side chain in a ratio of 5 to 95 mol % and more preferably 30 to 70 mol % based on all structural units of the resin (B) although the ratio varies depending on the kind of radiation for patterning exposure and the like.

The resin (B) has usually polystyrene-equivalent weight-average molecular weight of about 1,000 to 500,000, and preferably of 4,000 to 50,000.

The resins (A) and (B) can be produced by conducting the polymerization reaction of the corresponding monomer or monomers. The resins (A) and (B) can be also produced by conducting the oligomerization reaction of the corresponding monomer or monomers followed by polymerizing the oligomer obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tell-butyl peroxypivalate and 3,5,5-trimethylhexanol peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited. When the mixture of two kinds thereof is used, the combination of 2,2'-azobis(2,4-dimethylvaleronitrile) and 2,2'-azobisisobutyronitrile, the combination of 2,2'-azobis(2,4-dimethylvaleronitrile) and 2,2'-azobis(2-methylbutyronitrile), the combination of 2,2'-azobis(2,4-dimethylvaleronitrile) and 1,1'-azobis(cyclohexane-1-carbonitrile), and the combination of 2,2'-azobis(2,4-dimethylvaleronitrile) and dimethyl-2,2'-azobis(2-methylpropionate) are preferable, and the mixed ratio thereof is preferably 1/1 to 1/10.

The amount of the radical initiator is preferably 1 to 20% by mole based on all monomer or oligomer molar amounts.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After completion of the polymerization reaction, the resin produced can be isolated, for example, by adding a solvent in which the resin is insoluble or poorly soluble to the reaction mixture obtained and filtering the precipitated resin. If necessary, the isolated resin may be purified, for example, by washing with a suitable solvent.

In the present resist composition, the amount of the resin (B) is usually 0.1 to 30 parts by weight and preferably 1 to 10 parts by weight per 100 parts by weight of the resin (A) from the viewpoint of the retention rate of the resist film.

By using the present resist composition, a resist film having an excellent a contact angle and a receding contact angle, and having a low leaching of the resist composition to water in a contact with water can be formed and a pattern having low development residue can be formed.

The present chemically amplified resist composition contains an acid generator.

The acid generator is a substance which is decomposed to generate an acid by applying a radiation such as a light, an electron beam or the like on the substance itself or on a resist composition containing the substance. The acid generated from the acid generator acts on the resin (A) resulting in cleavage of the acid-labile group existing in the resin (A).

Examples of the acid generator include an onium salt compound, an organo-halogen compound, a sulfone compound, a sulfonate compound, and the like. The onium salt compound is preferable.

Other examples of the acid generator include acid generators described in JP 2003-5374 A1.

Other examples of the acid generator include a salt represented by the formula (V):

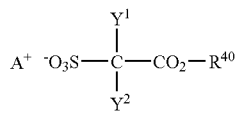

(hereinafter, simply referred to as Salt (V)).

In the formula (V), wherein $Y^1$ and $Y^2$ each independently represent a fluorine atom or a C1-C6 perfluoroalkyl group, $R^{40}$ represents a C1-C30 linear, branched chain or cyclic hydrocarbon group which may be substituted with at least one selected from the group consisting of a C1-C6 alkyl group, a C1-C6 alkoxy group, a C1-C4 perfluoroalkyl group, a hydroxyl group and a cyano group, and one or more —$CH_2$— in the hydrocarbon group may be replaced by —CO—, —O— or —COO—, and $A^+$ represents an organic counter ion.

Examples of the C1-C6 perfluoroalkyl group represented by $Y^1$ and $Y^2$ include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Y^1$ and $Y^2$ each independently is preferably a fluorine atom or a trifluoromethyl group, and is more preferably fluorine atoms.

The C3-C30 monocyclic or polycyclic hydrocarbon group of $R^{12}$ may have an alicyclic structure or structures and may have an aromatic group or groups. The C3-C30 monocyclic or polycyclic hydrocarbon group may have a carbon-carbon double bond or bonds.

Examples of the C1-C6 linear or branched chain hydrocarbon group include a methyl group, an ethyl group, an n-propyl group, an isopropyl group, an n-butyl group, an isobutyl group, a sec-butyl group, a tert-butyl group, an n-pentyl group and an n-hexyl group.

Examples of the C3-C30 monocyclic or polycyclic hydrocarbon group include a hydrocarbon group having a cyclobutane ring, a hydrocarbon group having a cyclopentane ring, a hydrocarbon group having a cyclohexane ring, a hydrocarbon group having a cyclooctane ring, a hydrocarbon group having an adamantane ring, a hydrocarbon group having a benzene ring and a hydrocarbon group having a norbornane ring.

Examples of the C1-C6 alkyl group include a methyl group, an ethyl group, an n-propyl group, an isopropyl group, an n-butyl group, an isobutyl group, a sec-butyl group, a tert-butyl group, an n-pentyl group and n-hexyl group. Examples of the C1-C6 alkoxy group include a methoxy group, an ethoxy group, an n-propoxy group, an isopropoxy group, an n-butoxy group, an isobutoxy group, a sec-butoxy group, a tert-butoxy group, an n-pentyloxy group and an n-hexyloxy group. Examples of the C1-C4 perfluoroalkyl group include a trifluoromethyl group, a pentafluoroethyl group, a heptafluoropropyl group and a nonafluorobutyl group.

Specific examples of the anion part of Salt (V) include the followings.

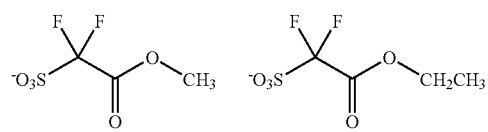

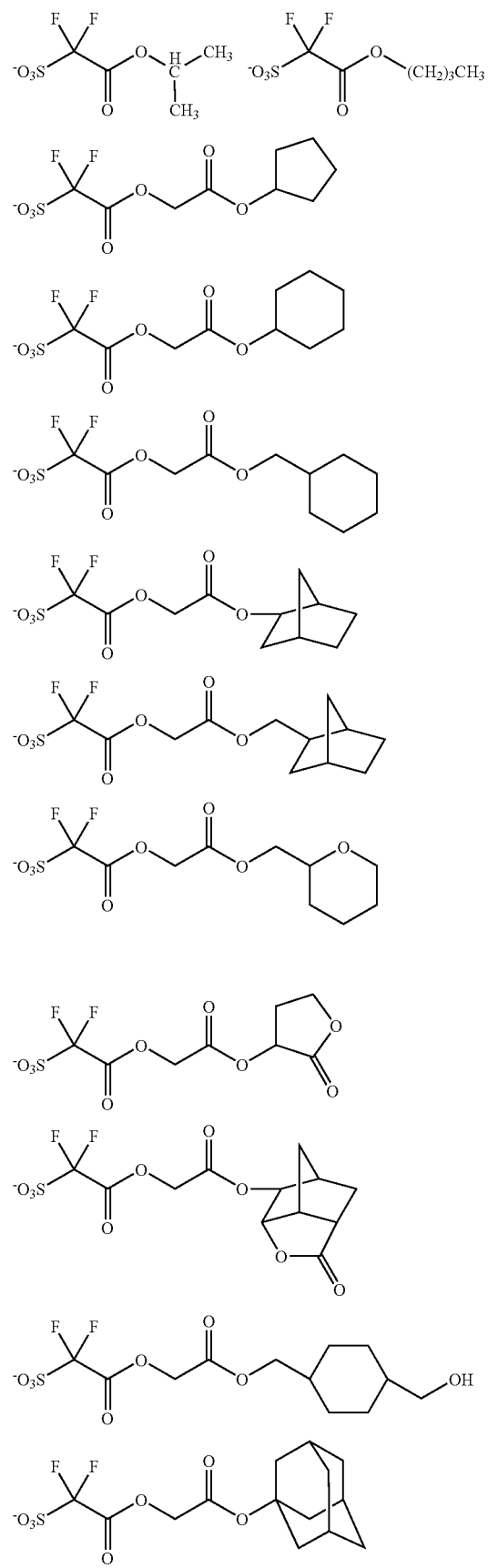

79
-continued
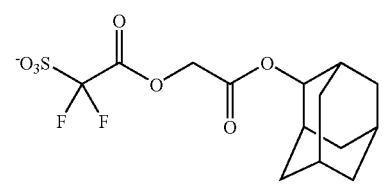
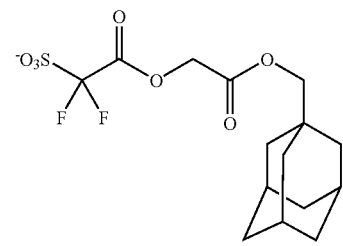
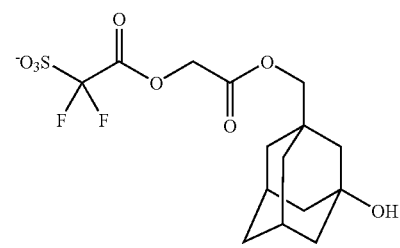
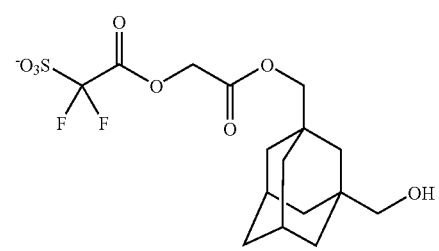
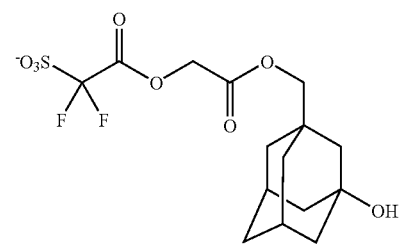
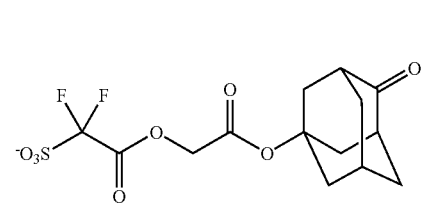
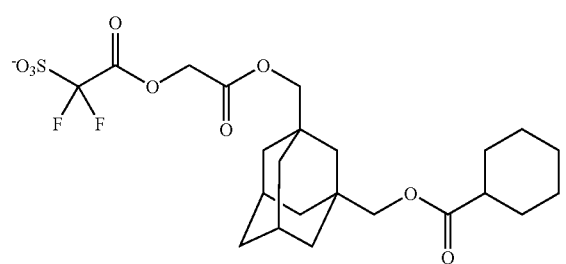
80
-continued
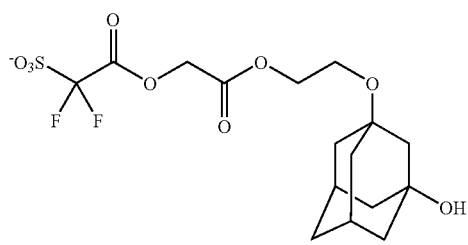
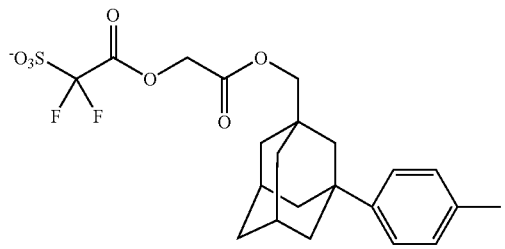
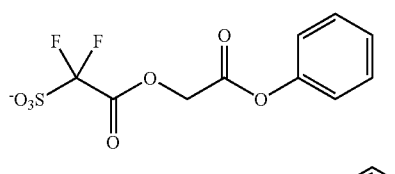
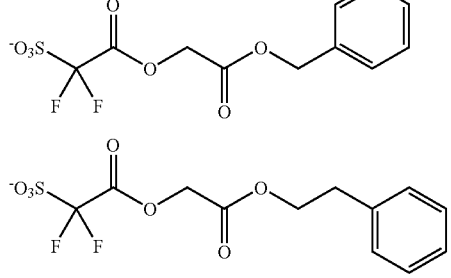
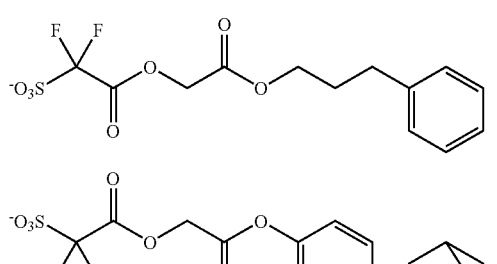
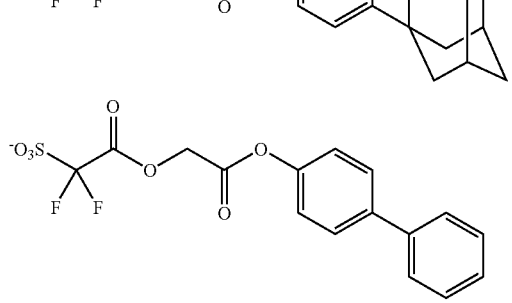
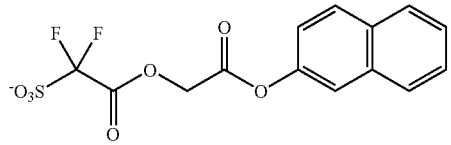

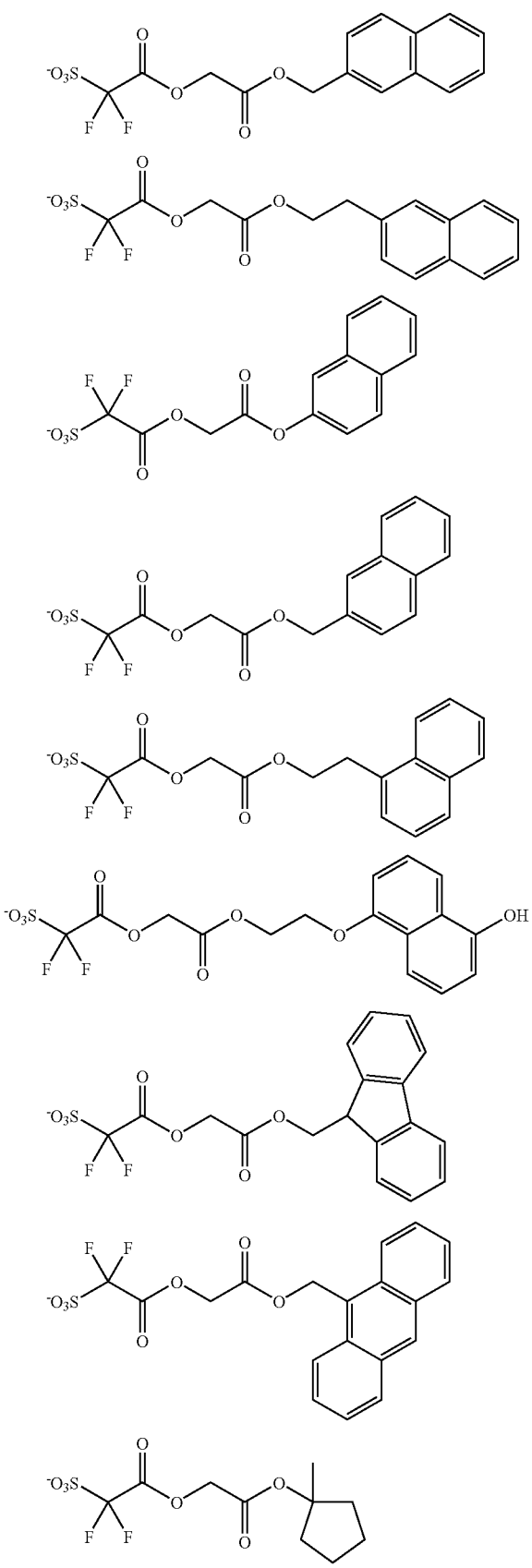
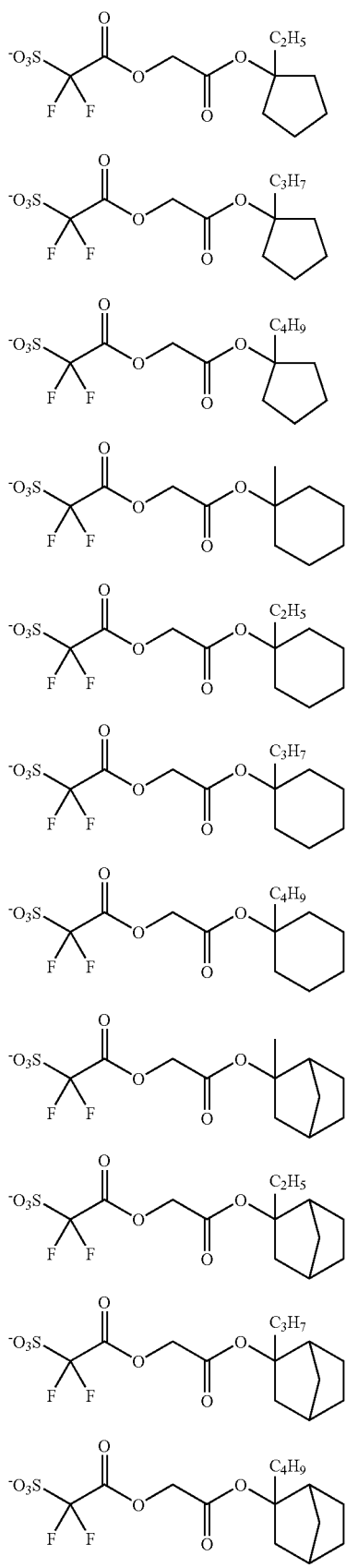

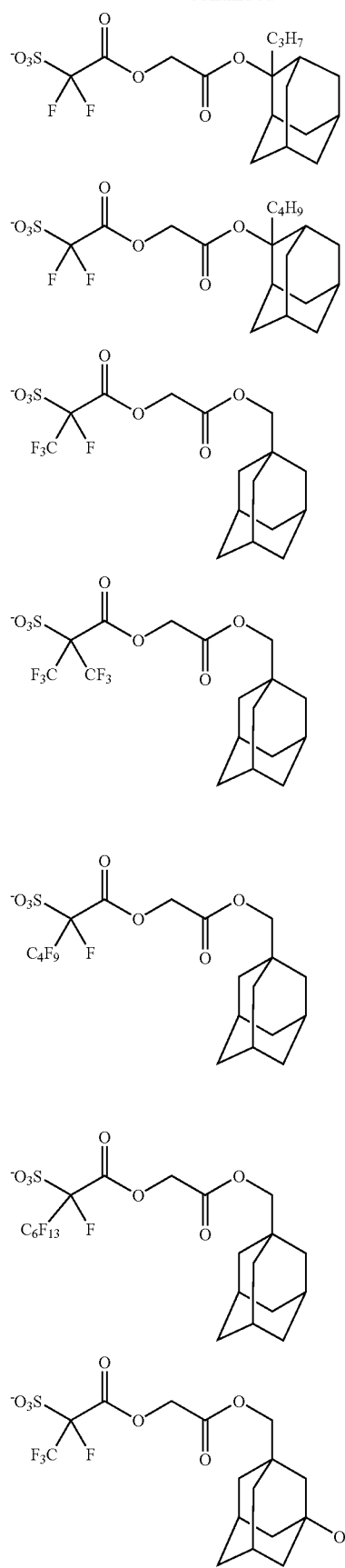
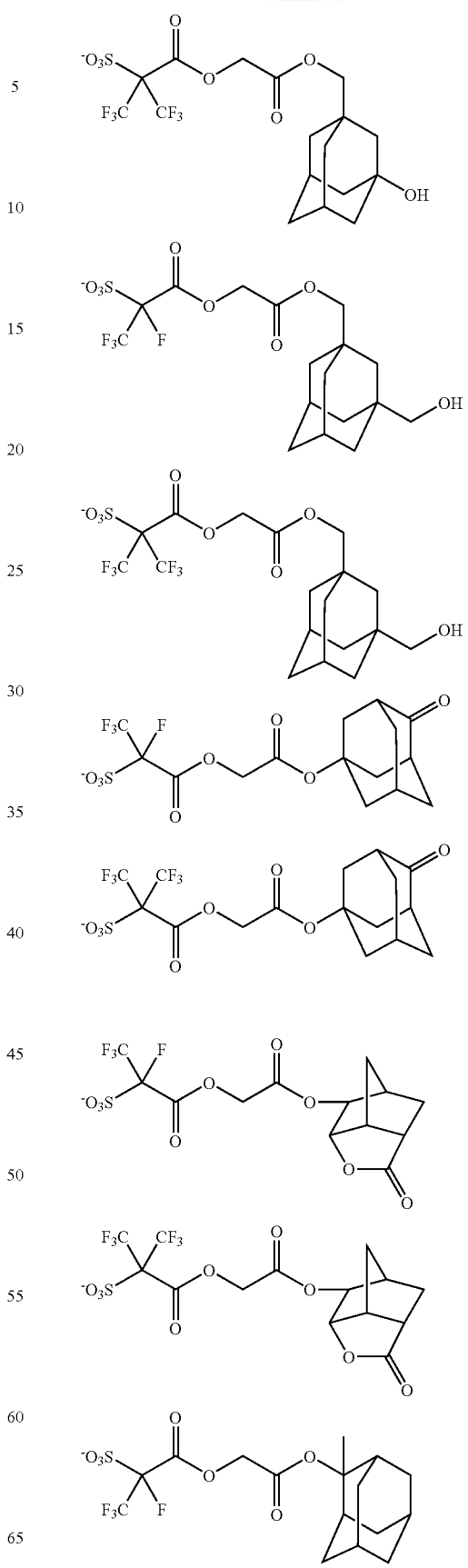

-continued
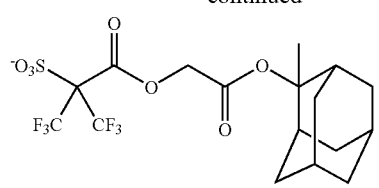
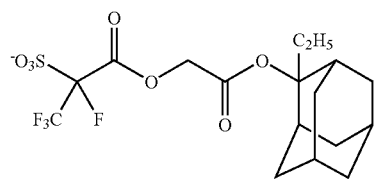
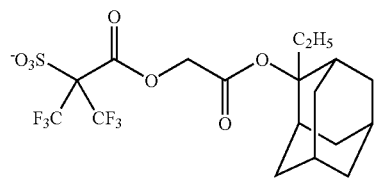
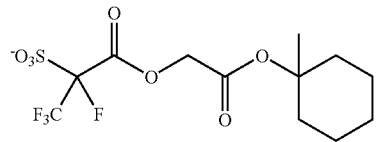
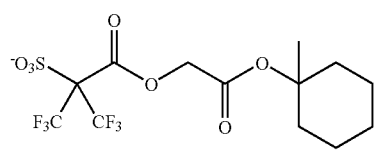
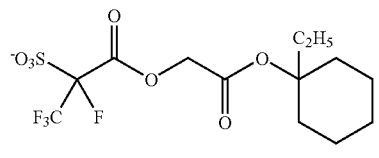
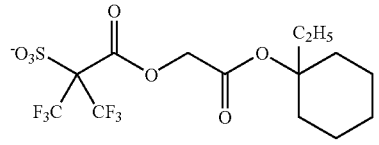
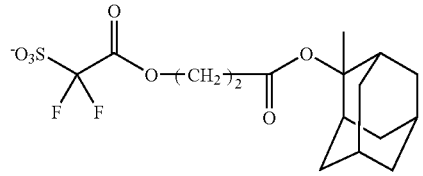
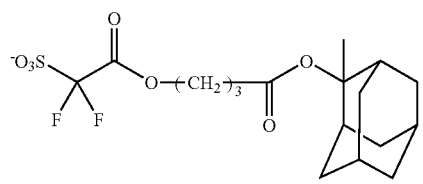
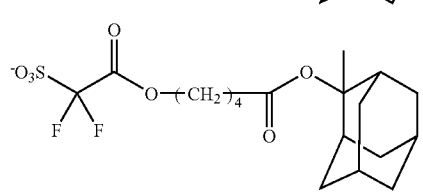
-continued
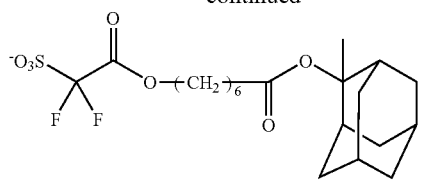
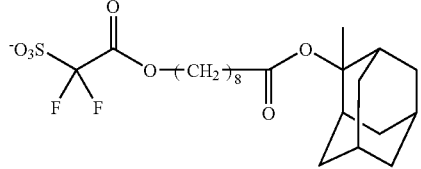
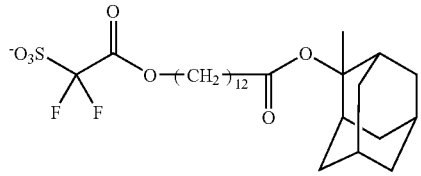
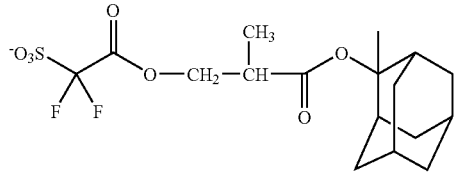
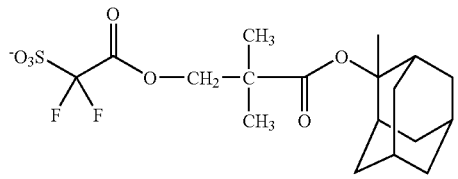
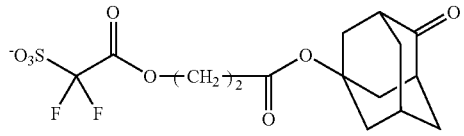
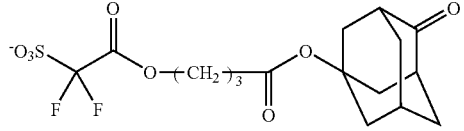
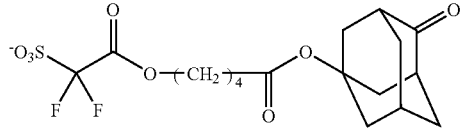
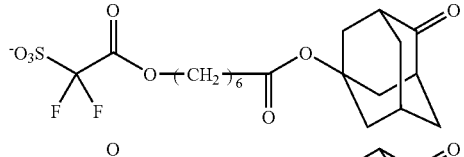
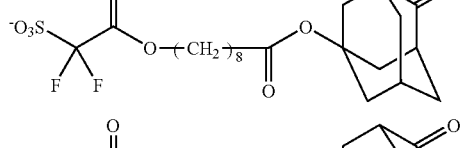
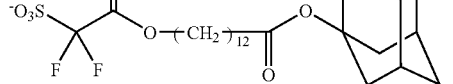

87
-continued
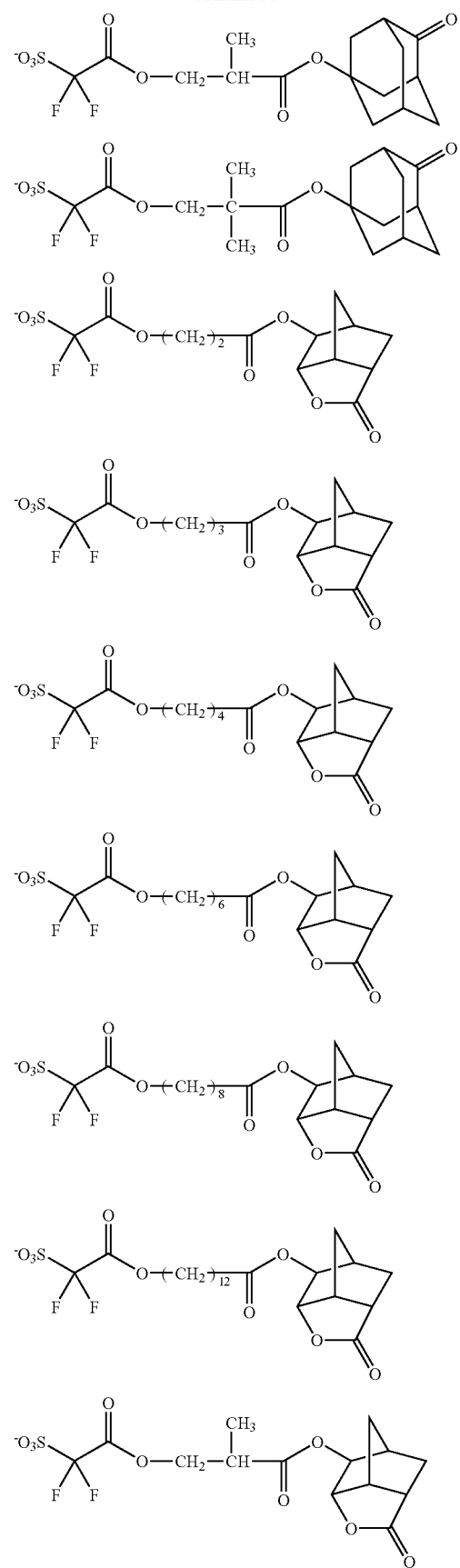
88
-continued
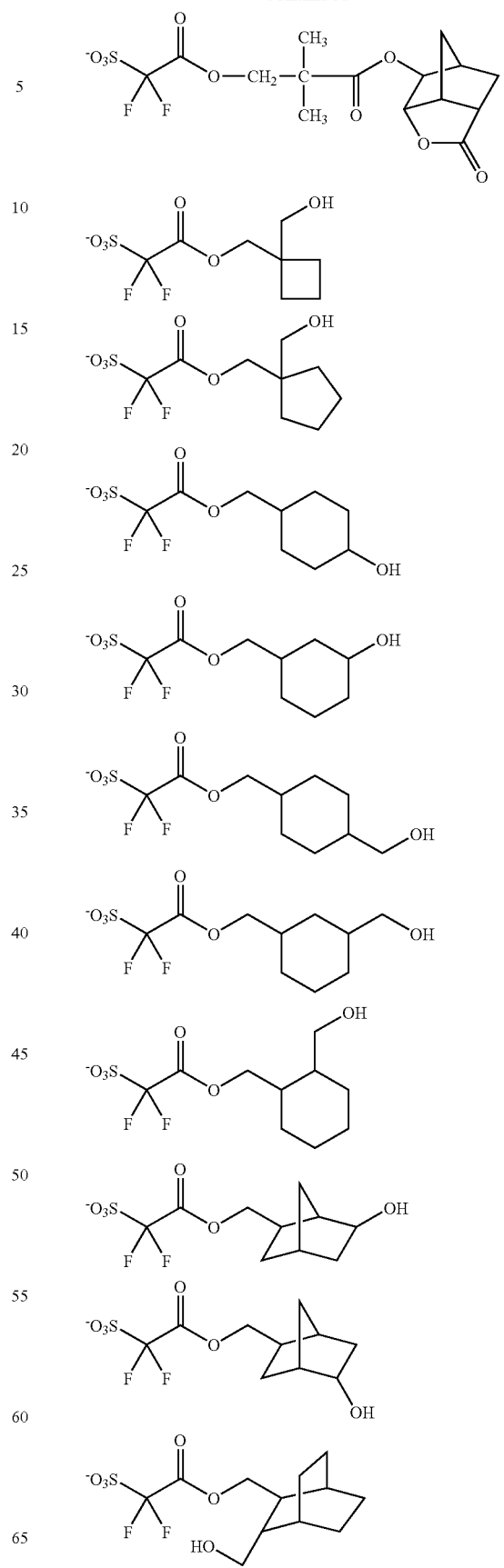

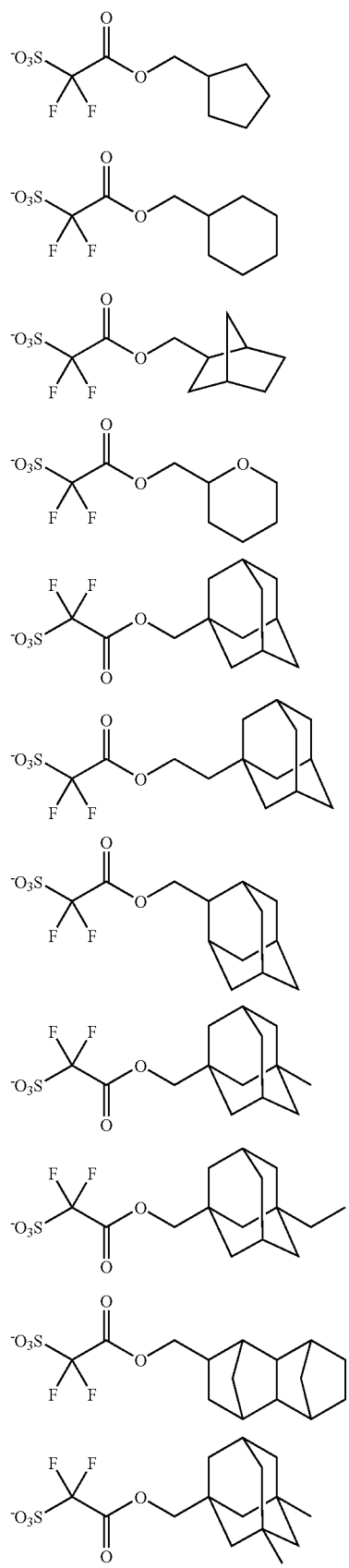
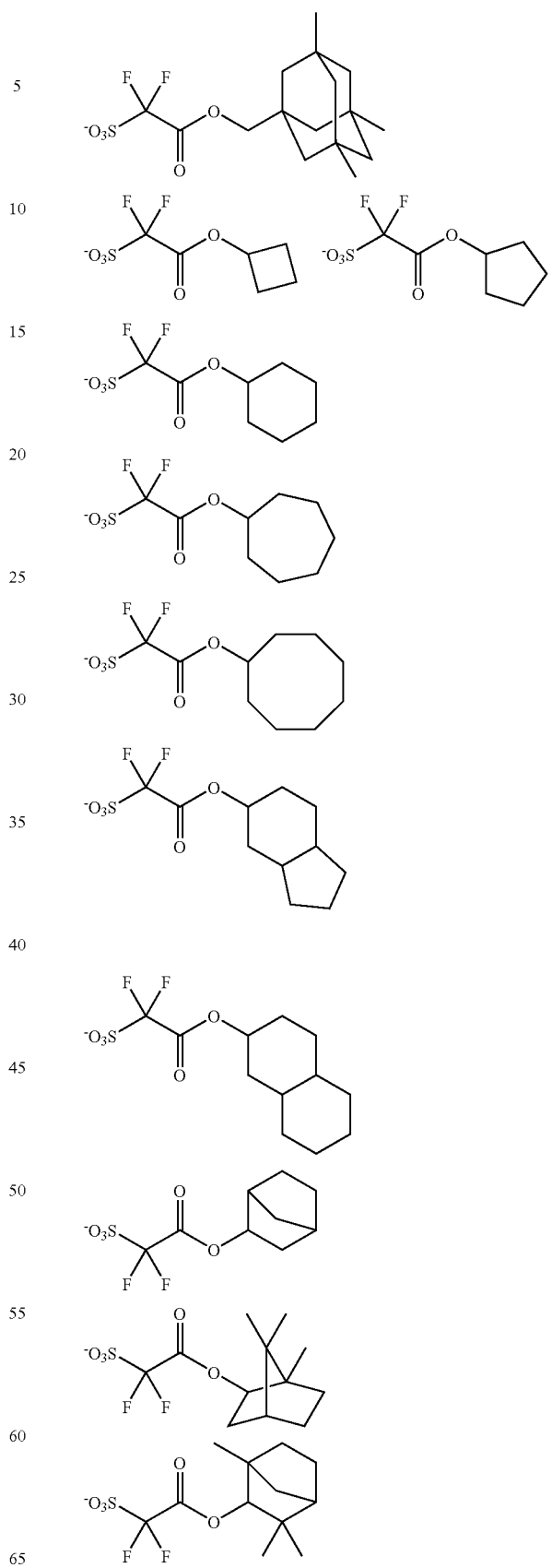

91
-continued
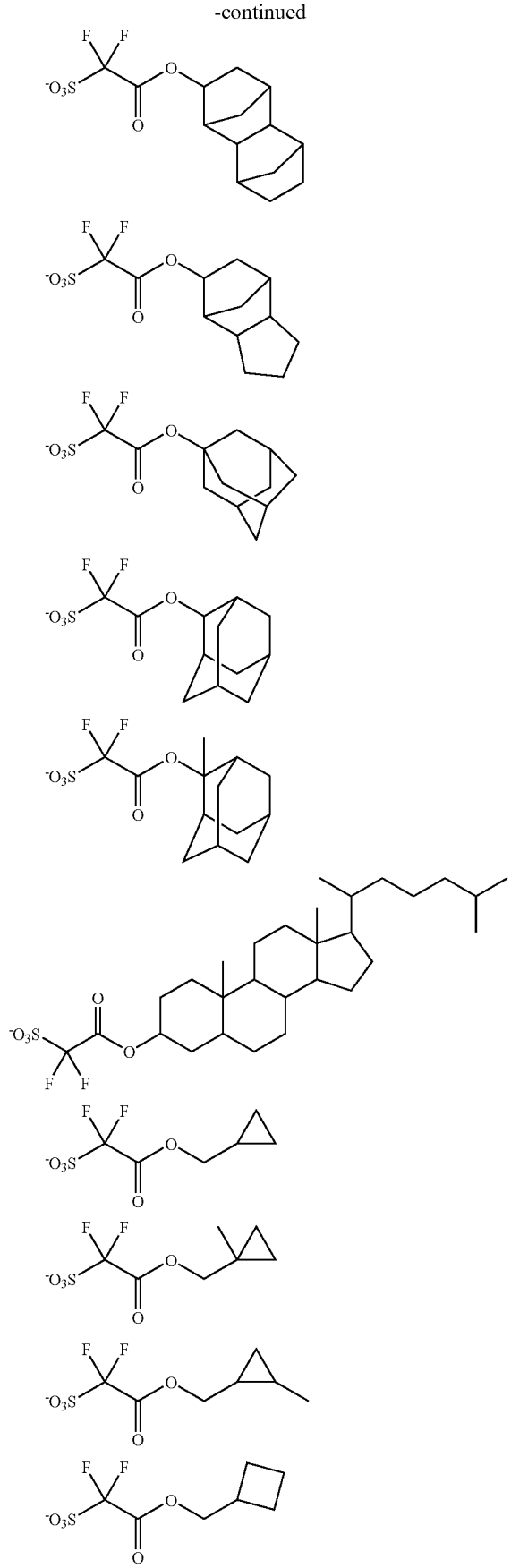
92
-continued
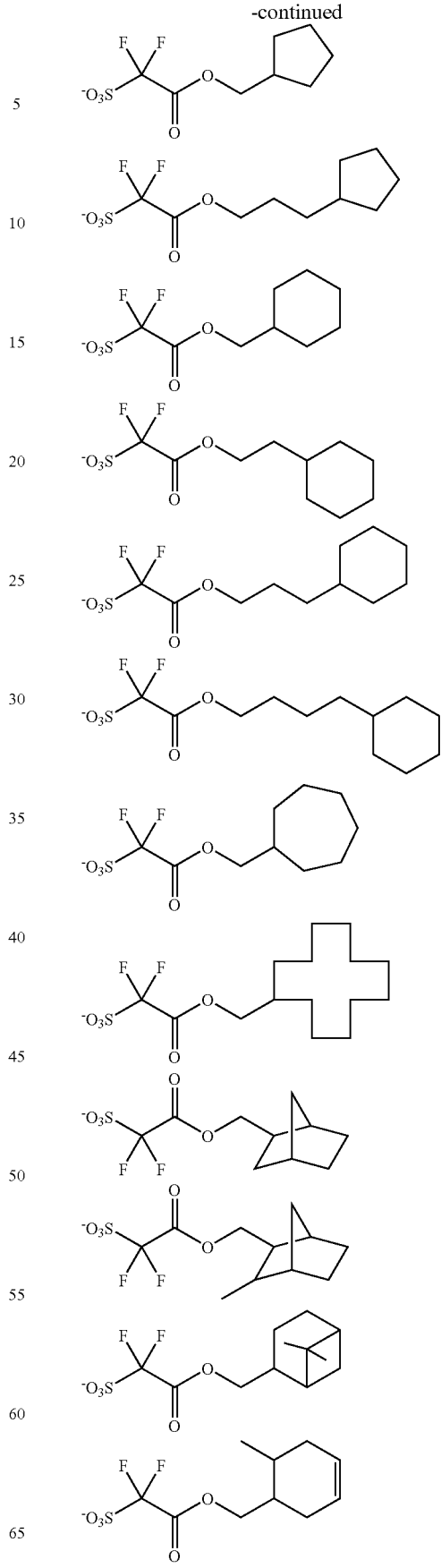

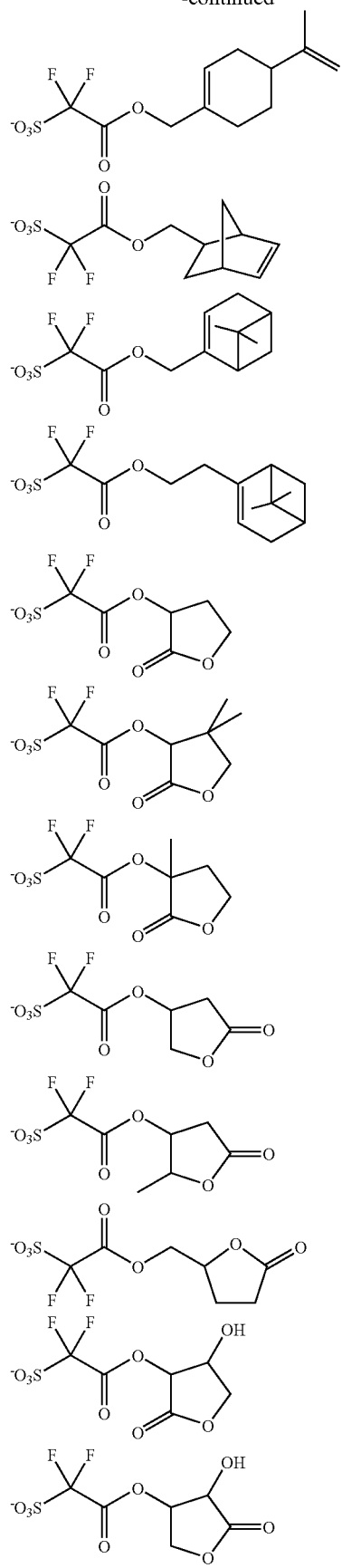
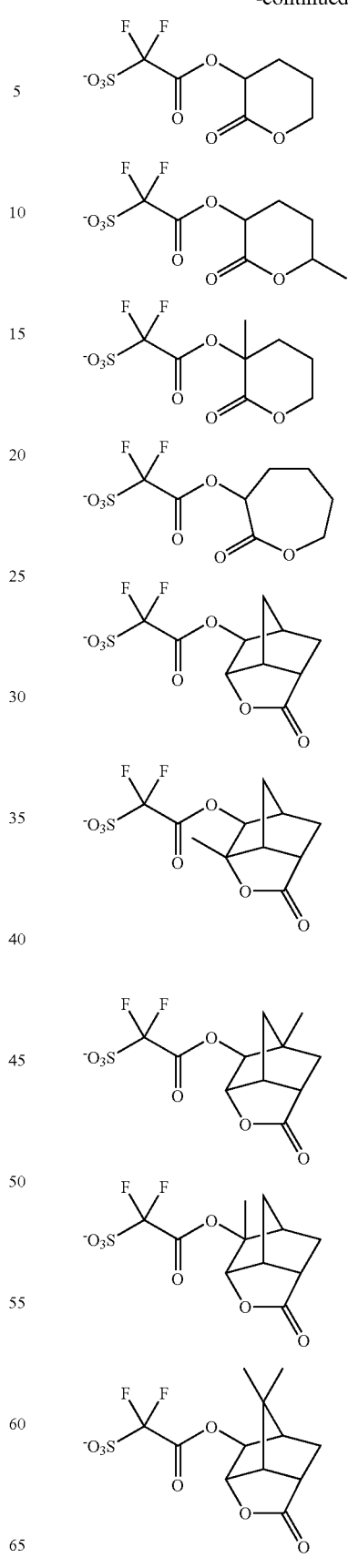

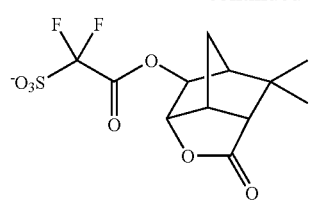
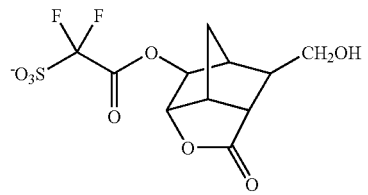
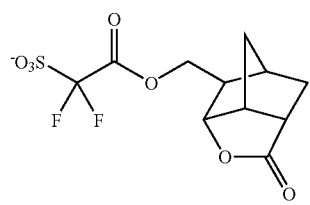
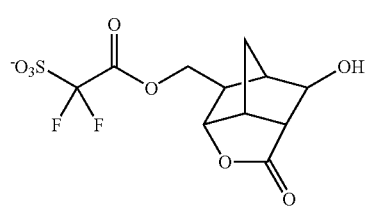
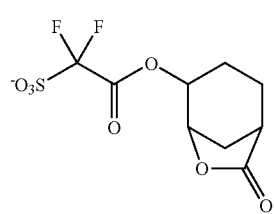
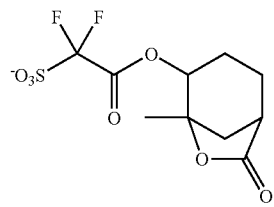
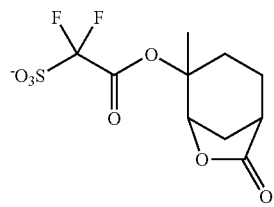
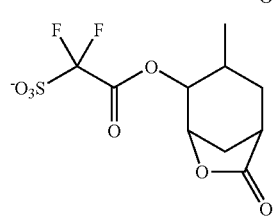
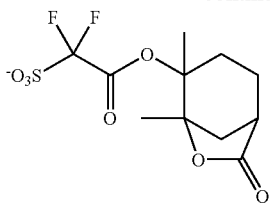
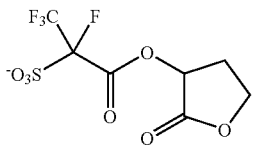
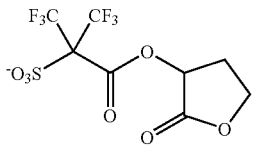
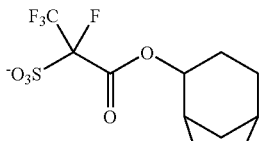
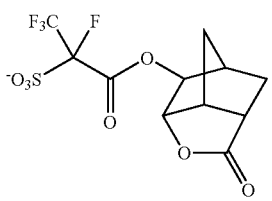
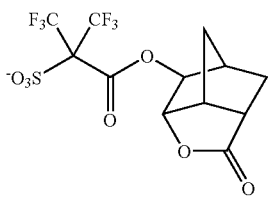
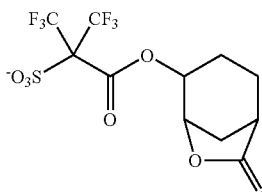
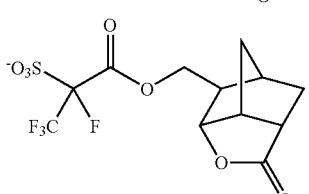
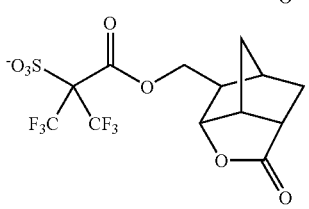

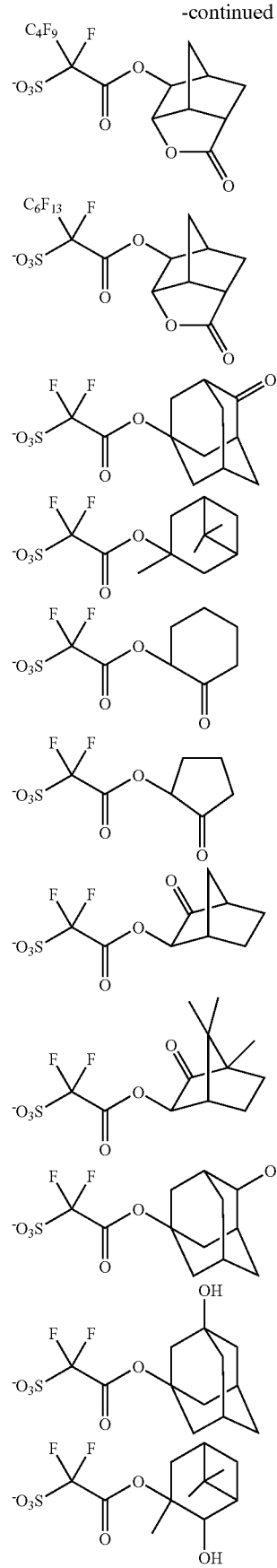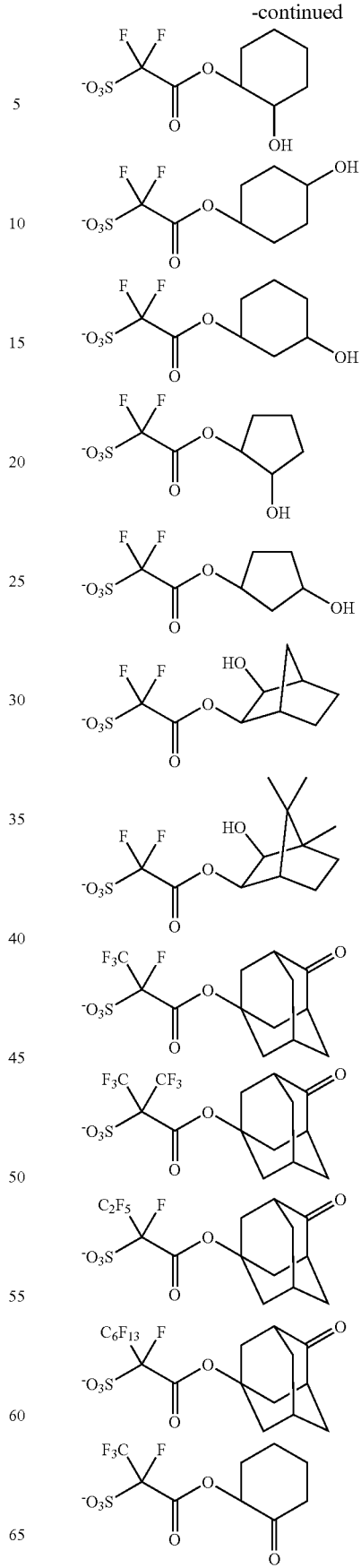

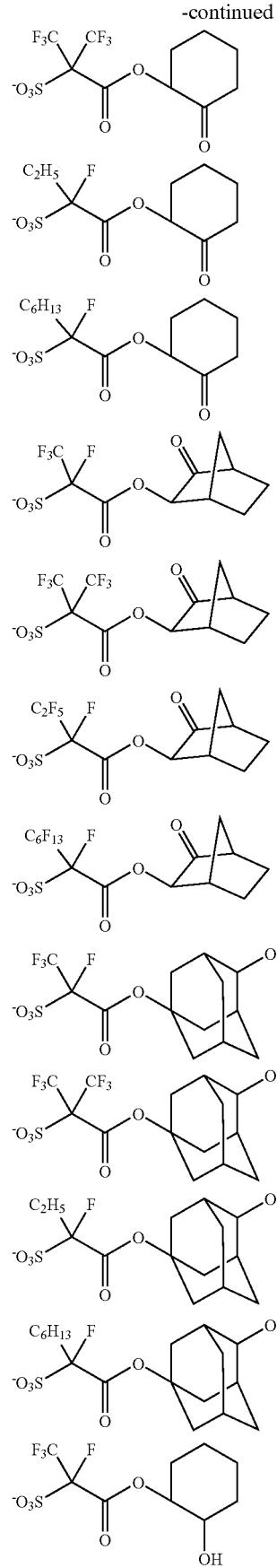
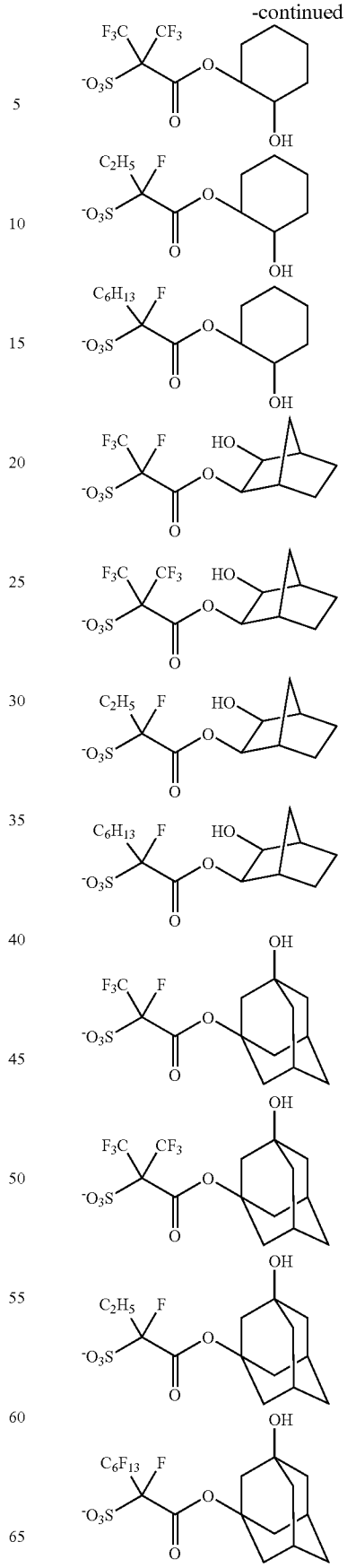

101
-continued
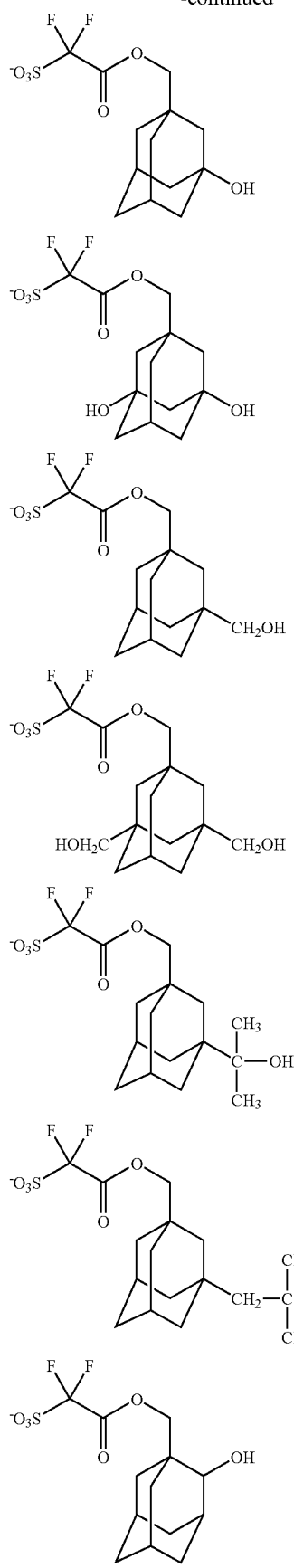
102
-continued
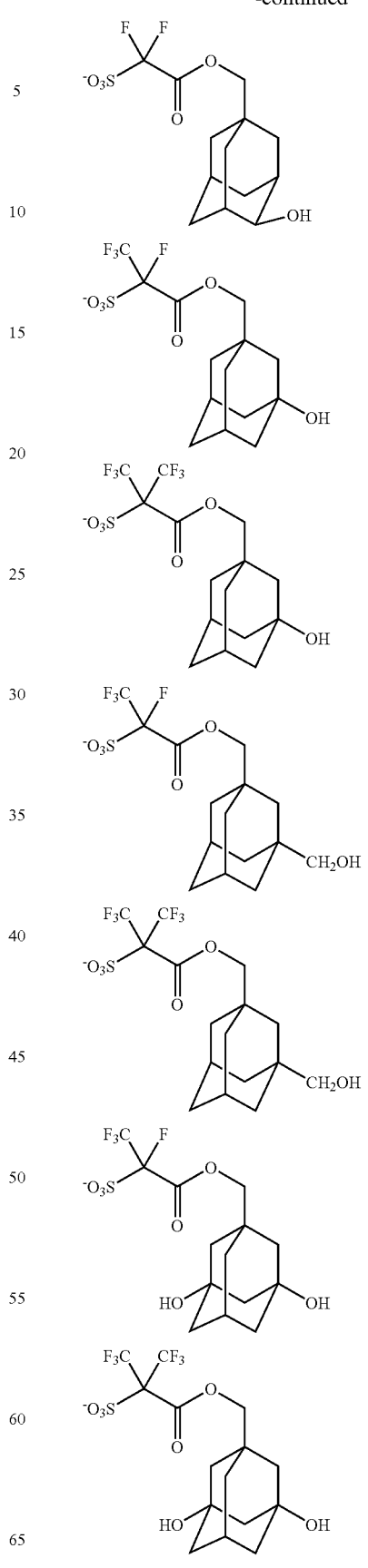

103
-continued
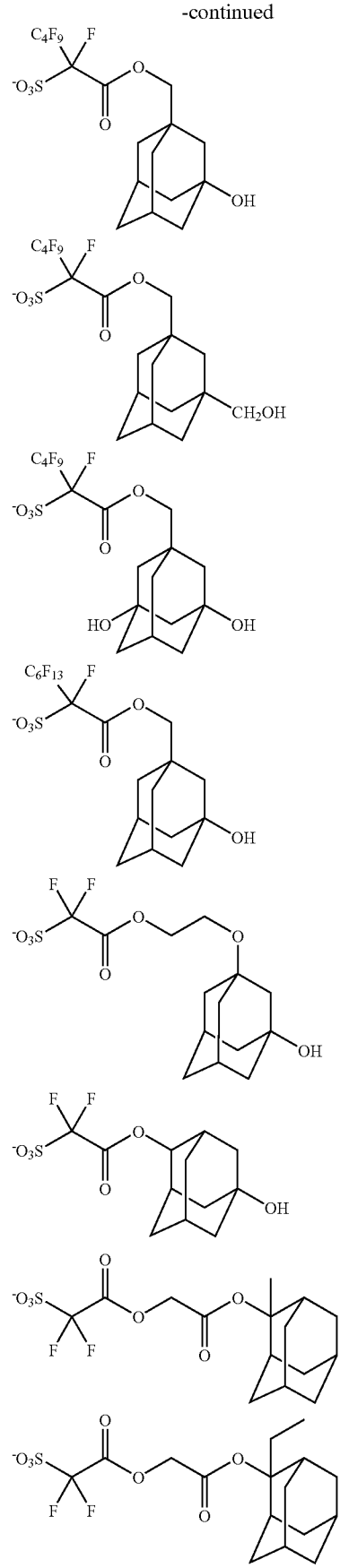
104
-continued
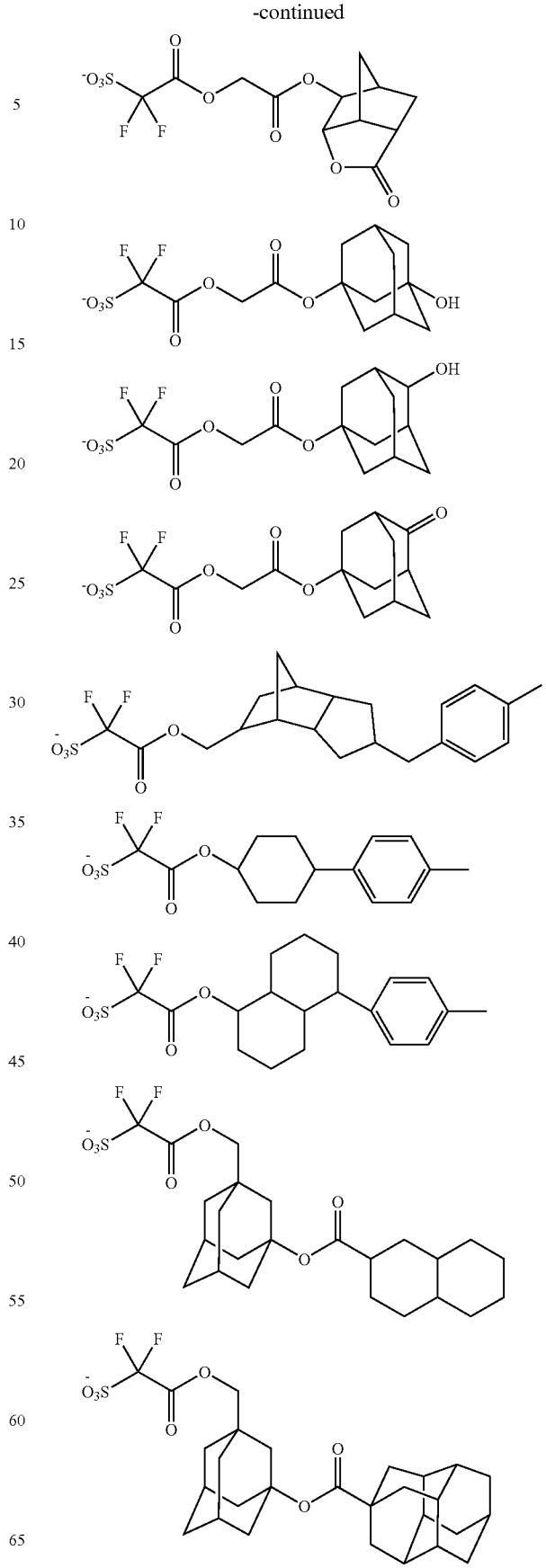

105
-continued
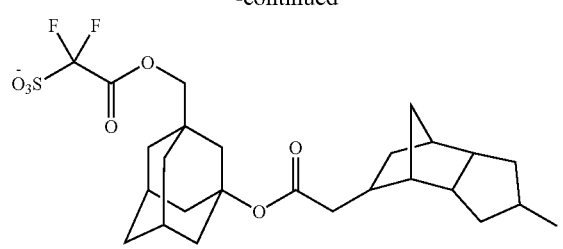
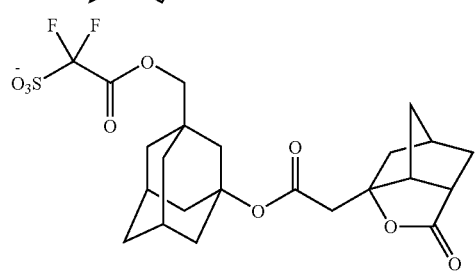
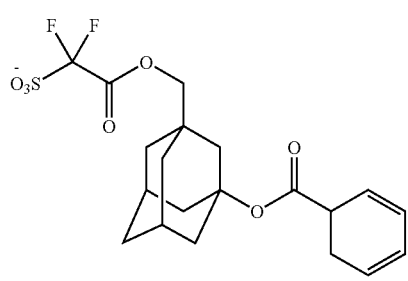
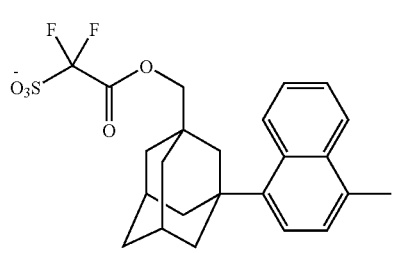
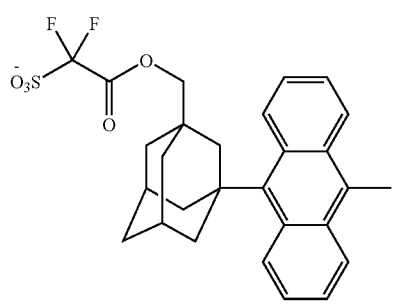
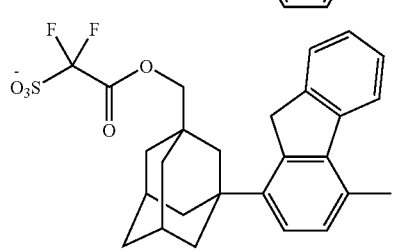
106
-continued
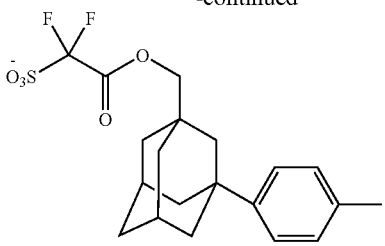
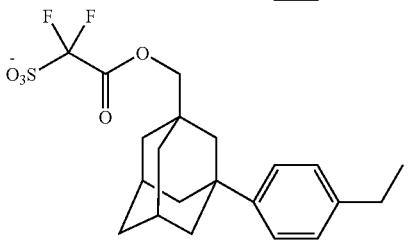
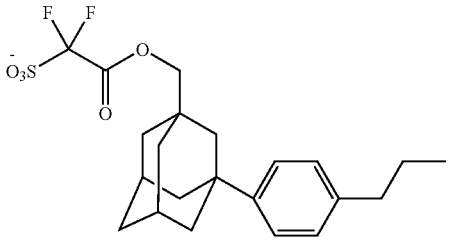
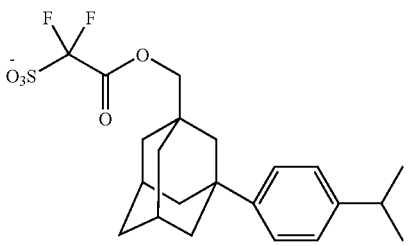
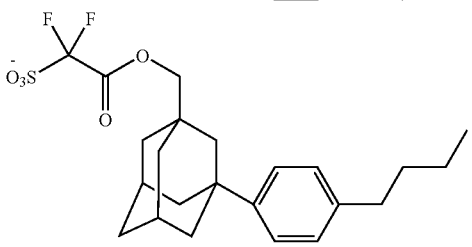
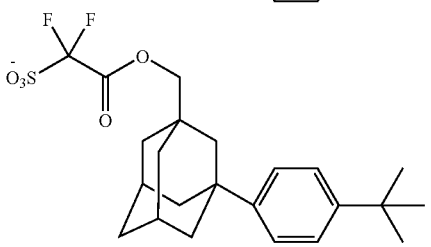
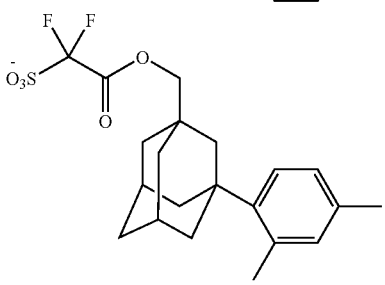

107
-continued
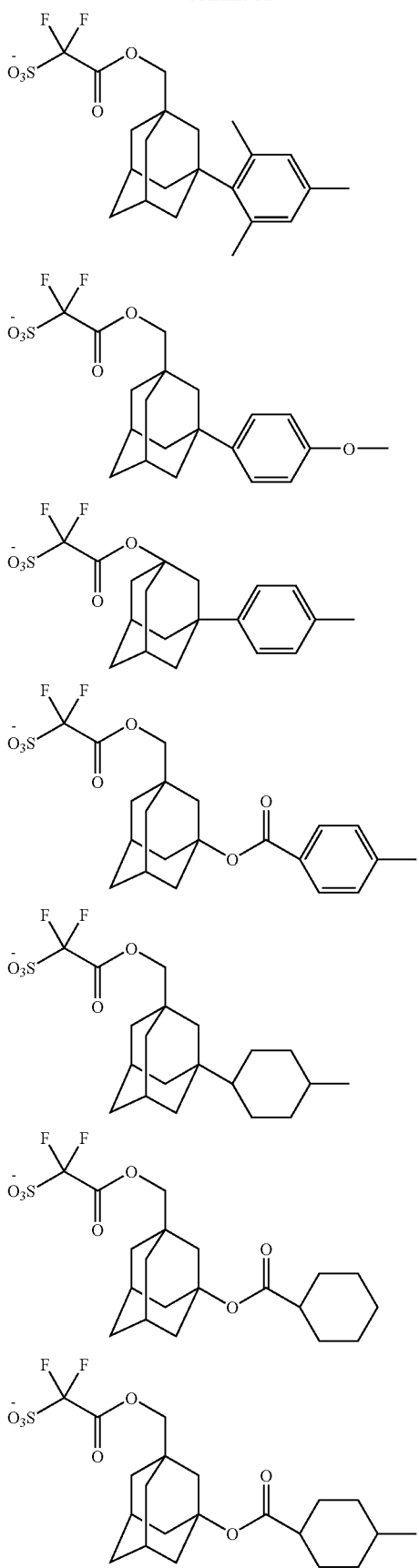
108
-continued
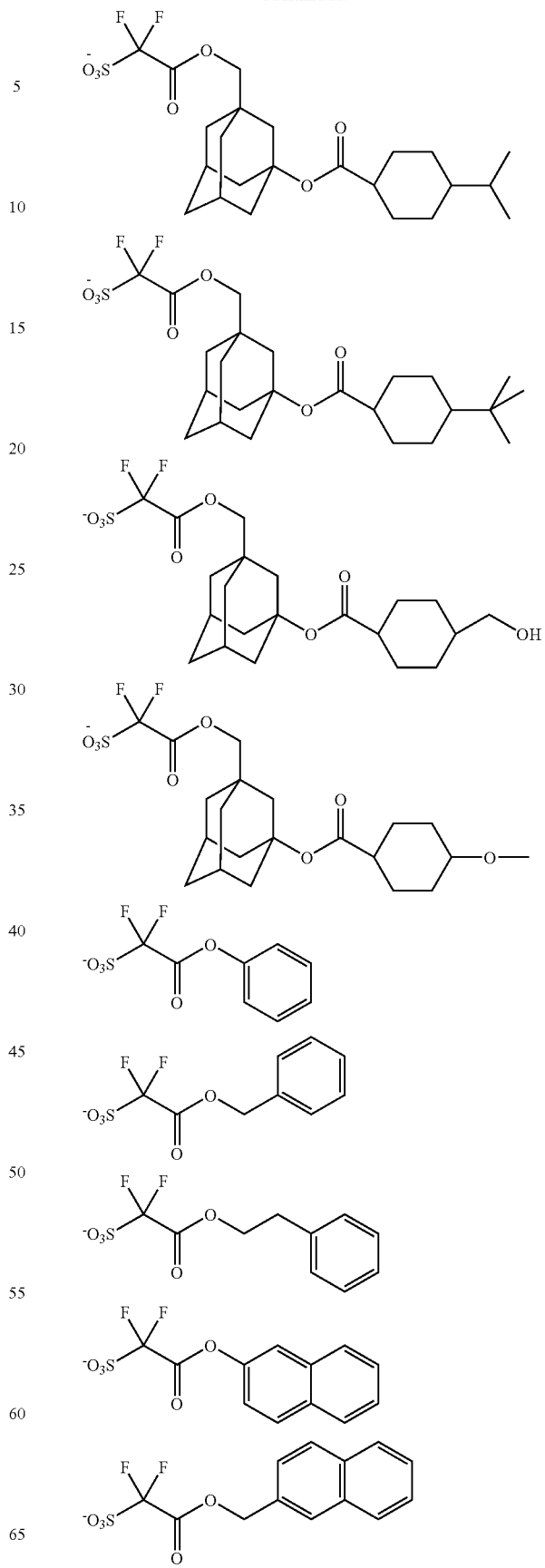

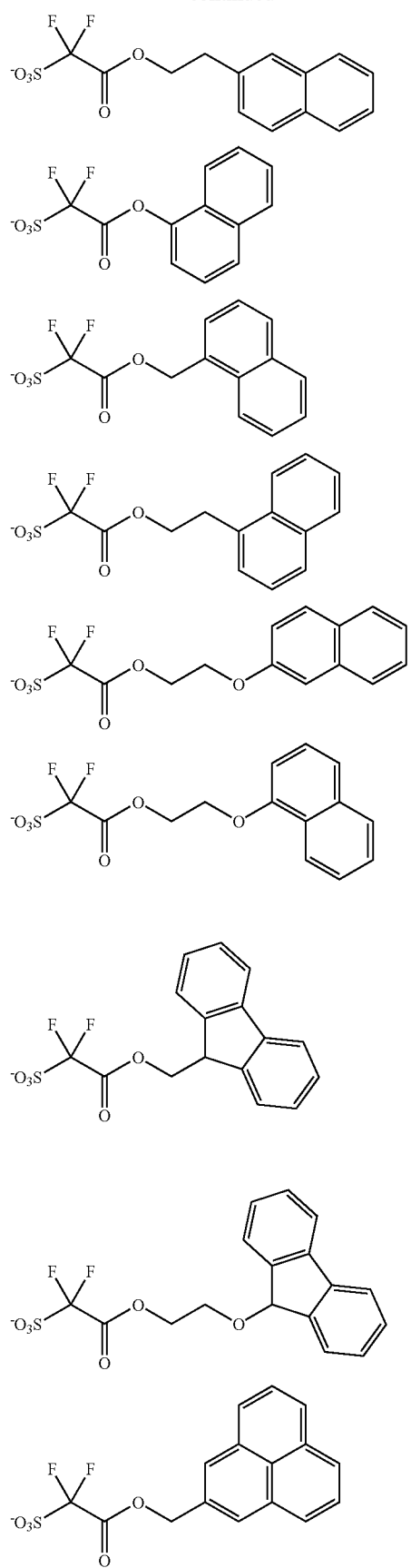
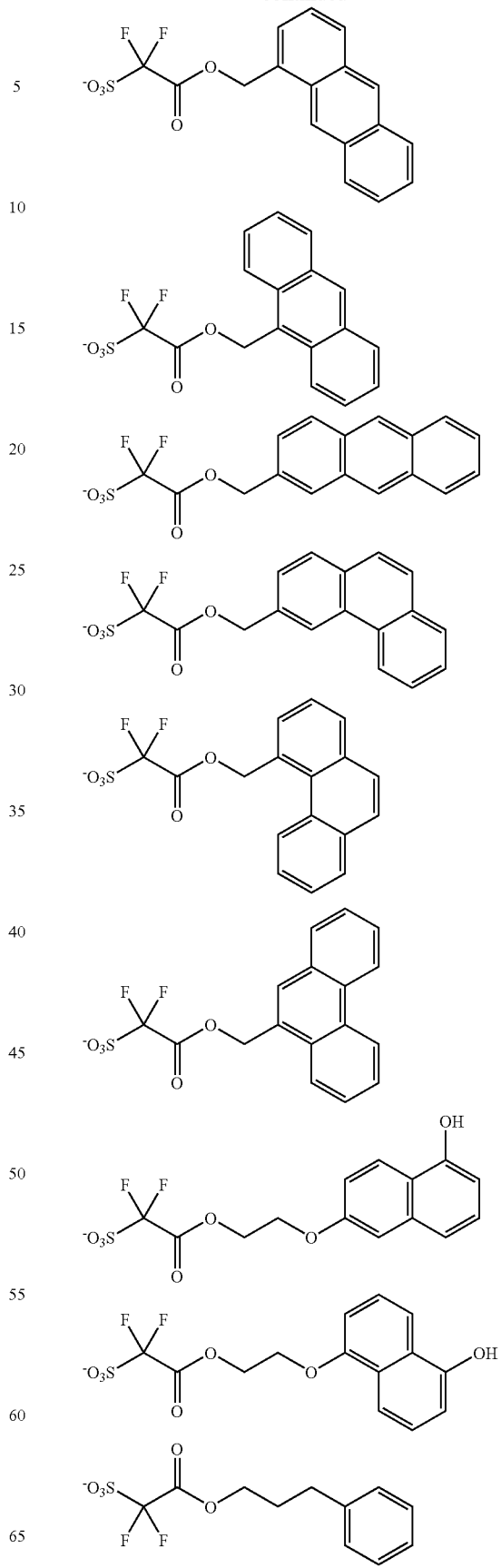

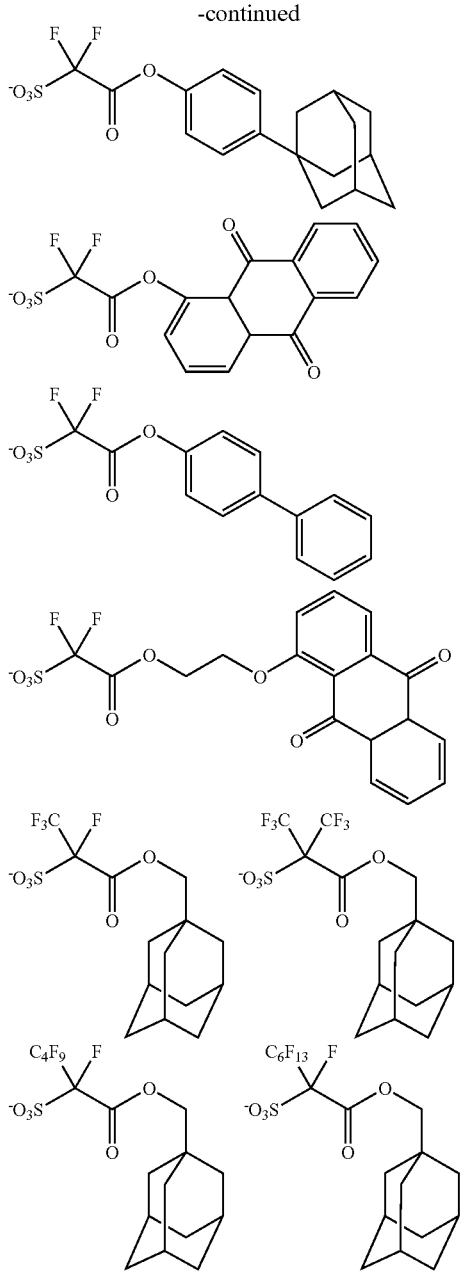

Among them, Salt (V) wherein $R^{40}$ is a group represented by the following formula:

—Z'—$X^{10}$ wherein $X^{10}$ represents a C3-C30 monocyclic or polycyclic hydrocarbon group having a hydroxyl group or a carbonyl group, and one or more hydrogen atoms in the monocyclic or polycyclic hydrocarbon group may be replaced by a C1-C6 alkyl group, a C1-C6 alkoxy group, a C1-C4 perfluoroalkyl group, a C1-C6 hydroxyalkyl group, a hydroxyl group or a cyano group and Z' represents a single bond or a C1-C4 alkylene group, is preferable.

Examples of the C1-C6 alkyl group, the C1-C6 alkoxy group and the C1-C4 perfluoroalkyl group include the same groups as described above, respectively. Examples of the C1-C6 hydroxyalkyl group include a hydroxymethyl group, a 2-hydroxyethyl group, a 3-hydroxypropyl group, a 4-hydroxybutyl group and a 6-hydroxyhexyl group.

Examples of the C1-C4 alkylene group include a methylene group, an ethylene group, a trimethylene group and a tetramethylene group. Z' is preferably a single bond, a methylene group or an ethylene group, and is more preferable a single bond or a methylene group.

Examples of $X^{10}$ include a C4-C8 cycloalkyl group such as a cyclobutyl group, a cyclopentyl group, a cyclohexyl group and a cyclooctyl group, an adamantyl group, and a norbornyl group, in which at least one hydrogen atom may be replaced with a C1-C6 alkyl group, a C1-C6 alkoxy group, a C1-C4 perfluoroalkyl group, a C1-C6 hydroxyalkyl group, a hydroxyl group or a cyano group.

Specific examples of $X^{10}$ include a 2-oxocyclopentyl group, a 2-oxocyclohexyl group, a 3-oxocyclopentyl group, a 3-oxocyclohexyl group, a 4-oxocyclohexyl group, a 2-hydroxycyclopentyl group, a 2-hydroxycyclohexyl group, a 3-hydroxycyclopentyl group, a 3-hydroxycyclohexyl group, a 4-hydroxycyclohexyl group, a 4-oxo-2-adamantyl group, a 3-hydroxy-1-adamantyl group, a 4-hydroxy-1-adamantyl group, a 5-oxonorbornan-2-yl group, a 1,7,7-trimethyl-2-oxonorbornan-2-yl group, a 3,6,6-trimethyl-2-oxo-bicyclo[3.1.1]heptan-3-yl group, a 2-hydroxy-norbornan-3-yl group, a 1,7,7-trimethyl-2-hydroxynorbornan-3-yl group, a 3,6,6-trimethyl-2-hydroxybicyclo[3.1.1]heptan-3-yl group, and the following groups (in the following formulae, straight line with an open end shows a bond which is extended from an adjacent group).

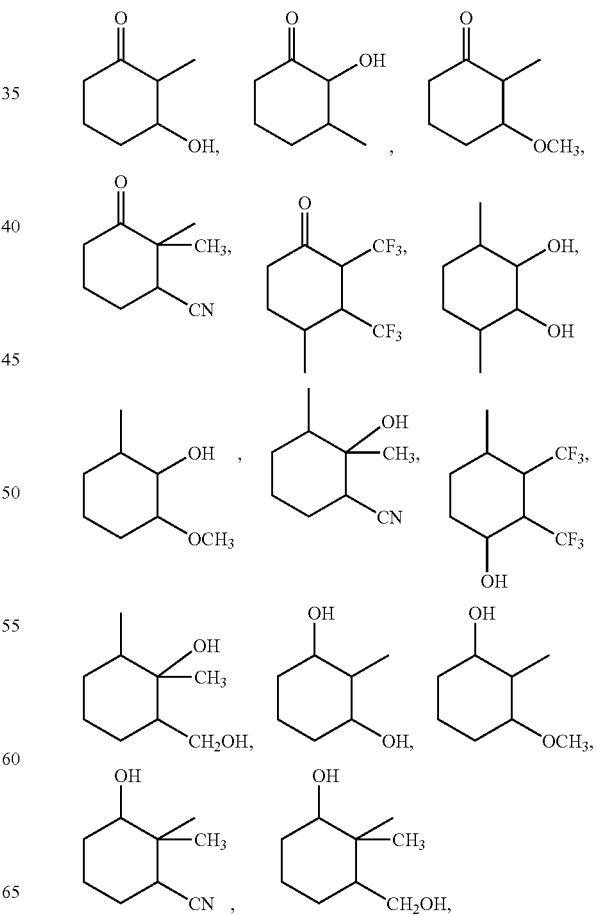

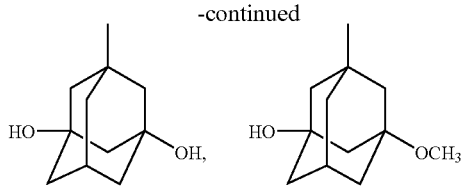
Specific examples of the anion part of Salt (V) wherein $R^{40}$ is a group represented by the following formula:
—Z'—$X^{10}$
include the followings.
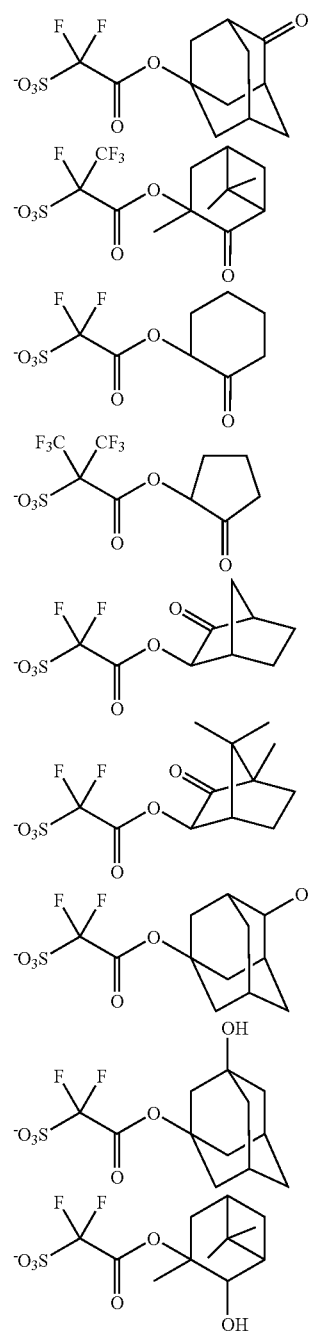
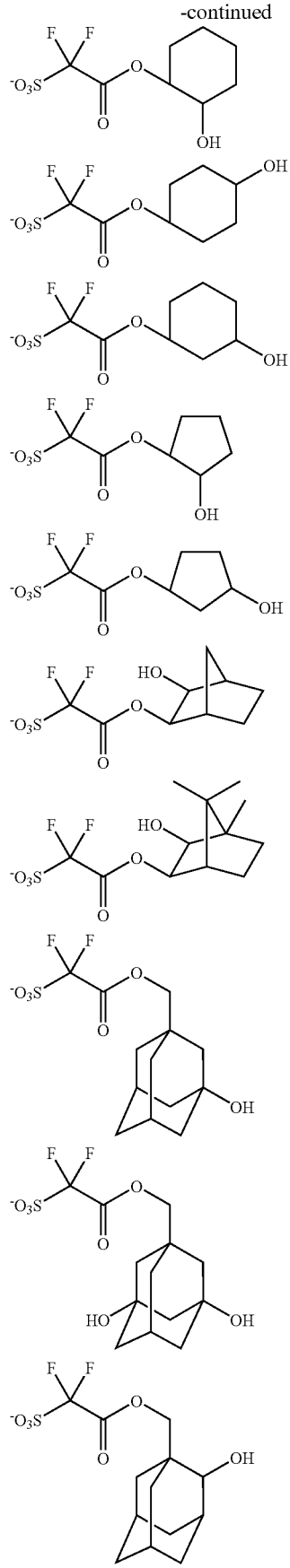

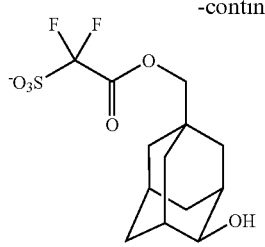

Other examples of the acid generator include a salt represented by the formula (XI):

$$A^{+-}O_3S—R^{27} \quad (XI)$$

wherein $A^+$ is the same meaning as defined above and $R^{27}$ represents a C1-C6 linear or branched chain perfluoroalkyl group (hereinafter, simply referred to as the salt (XI)).

Specific examples of the anion part of the salt (XI) include a trifluoromethanesulfonate anion, a pentafluoroethanesulfonate anion, a heputafluoropropanesulfonate anion and a nonafluorobutanesulfonate anion.

Examples of the organic counter ion represented by $A^+$ include a cation represented by the formula (XIIz):

wherein $P^a$, $P^b$ and $P^c$ each independently represent a C1-C30 linear or branched chain alkyl group which may be substituted with at least one selected from the group consisting of a hydroxyl group, a C3-C12 cyclic hydrocarbon group and a C1-C12 alkoxy group, or a C3-C30 cyclic hydrocarbon group which may be substituted with at least one selected from the group consisting of a hydroxyl group and a C1-C12 alkoxy group (hereinafter, simply referred to as the cation (XIIz)),
a cation represented by the formula (XIIb):

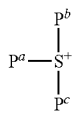

wherein $P^4$ and $P^5$ each independently represent a hydrogen atom, a hydroxyl group, a C1-C12 alkyl group or a C1-C12 alkoxy group (hereinafter, simply referred to as the cation (XIIb)),
a cation represented by the formula (XIIc):

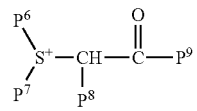

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and at least one —$CH_2$— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ are bonded to form a divalent acyclic hydrocarbon group which forms a 2-oxocycloalkyl group together with the adjacent —CHCO—, and at least one —$CH_2$— in the divalent acyclic hydrocarbon group may be replaced with —CO—, —O— or —S— (hereinafter, simply referred to as the cation (XIIc)); and
a cation represented by the formula (XIId):

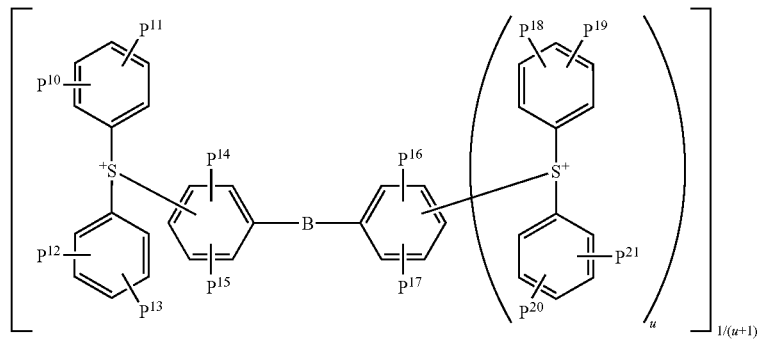

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and u represents 0 or 1 (hereinafter, simply referred to as the cation (XIId)).

Examples of the C1-C12 alkoxy group in the cations (XIIz), (XIIb) and (XIId) include a methoxy group, an ethoxy group, an n-propoxy group, an isopropoxy group, an n-butoxy group, an isobutoxy group, a sec-butoxy group, a tert-butoxy group, an n-pentyloxy group, an n-hexyloxy group, an n-octyloxy group and a 2-ethylhexyloxy group.

Examples of the C3-C12 cyclic hydrocarbon group in the cation (XIIz) include a cyclopentyl group, a cyclohexyl group, a 1-adamantyl group, a 2-adamantyl group, a phenyl group, a 2-methylphenyl group, a 4-methylphenyl group, a 1-naphthyl group and a 2-naphthyl group.

Examples of the C1-C30 alkyl group which may be substituted with at least one selected from the group consisting of a hydroxyl group, a C3-C12 cyclic hydrocarbon group and a C1-C12 alkoxy group in the cation (XIIz) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group, a 2-ethylhexyl group and benzyl group.

Examples of the C3-C30 cyclic hydrocarbon group which may be substituted with at least one selected from the group consisting of a hydroxyl group and a C1-C12 alkoxy group in the cation (XIIz) include a cyclopentyl group, a cyclohexyl group, a 1-adamantyl group, a 2-adamantyl group, a bicyclohexyl group, a phenyl group, a 2-methylphenyl group, a 4-methylphenyl group, a 4-ethylphenyl group, a 4-isopropylphenyl group, a 4-tert-butylphenyl group, a 2,4-dimethylphenyl group, a 2,4,6-trimethylphenyl group, a 4-n-hexylphenyl group, a 4-n-octylphenyl group, a 1-naphthyl group, a 2-naphthyl group, a fluorenyl group, a 4-phenylphenyl group, a 4-hydroxyphenyl group, a 4-methoxyphenyl group, a 4-tert-butoxyphenyl group and a 4-n-hexyloxyphenyl group.

Examples of the C1-C12 alkyl group in the cations (XIIb), (XIIc) and (XIId) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group and a 2-ethylhexyl group.

Examples of the C3-C12 cycloalkyl group in the cation (XIIc) include a cyclopropyl group, a cyclobutyl group, a cyclopentyl group, a cyclohexyl group, a cycloheptyl group, a cyclooctyl group and a cyclodecyl group. Examples of the C3-C12 divalent acyclic hydrocarbon group formed by bonding $P^6$ and $P^7$ include a trimethylene group, a tetramethylene group and a pentamethylene group. Examples of the ring group formed together with the adjacent $S^+$ and the divalent acyclic hydrocarbon group include a tetramethylenesulfonio group, a pentamethylenesulfonio group and oxybisethylenesulfonio group.

Examples of the aromatic group in the cation (XIIc) include a phenyl group, a tolyl group, a xylyl group, a 4-n-butylphenyl group, a 4-isobutylphenyl group, a 4-tert-butylphenyl group, a 4-cyclohexylphenyl group, a 4-phenylphenyl group and a naphthyl group. The aromatic group may be substituted, and examples of the substituents include a C1-C6 alkoxy group such as a methoxy group, an ethoxy group, an n-propoxy group, an n-butoxy group, a tert-butoxy group and an n-hexyloxy group; a C2-C12 acyloxy group such as an acetyloxy group and a 1-adamantylcarbonyloxy group; and a nitro group.

Examples of the divalent acyclic hydrocarbon group formed by bonding $P^8$ and $P^9$ include a methylene group, an ethylene group, a trimethylene group, a tetramethylene group and a pentamethylene group and examples of the 2-oxocycloalkyl group formed together with the adjacent —CHCO— and the divalent acyclic hydrocarbon group include a 2-oxocyclopentyl group and a 2-oxocyclohexyl group.

Examples of the cation (XIIz) include the followings:

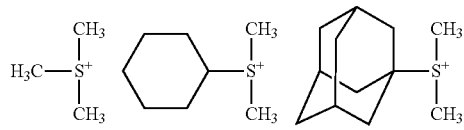

-continued

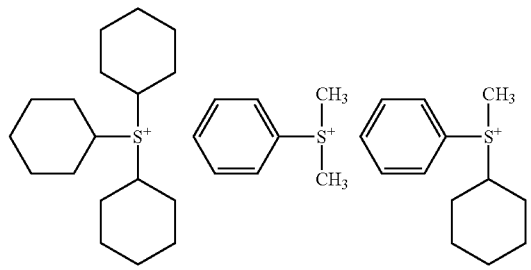

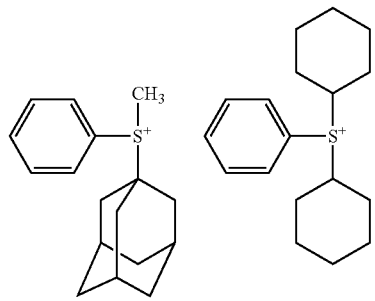

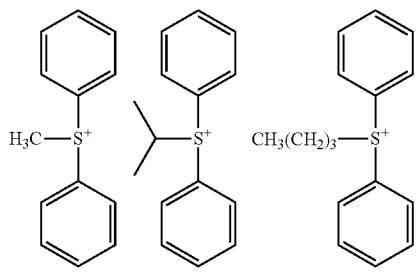

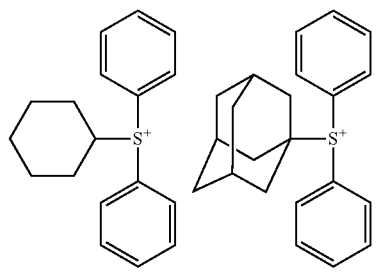

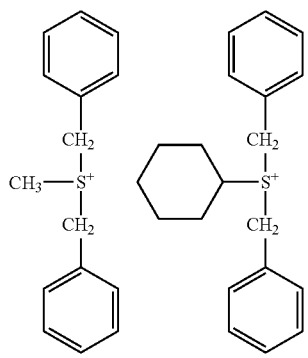

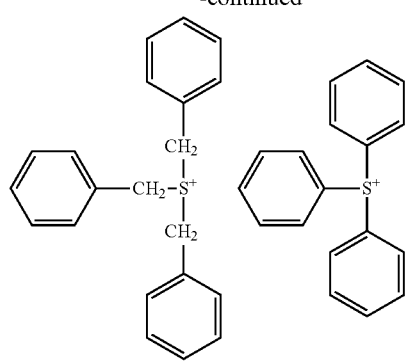
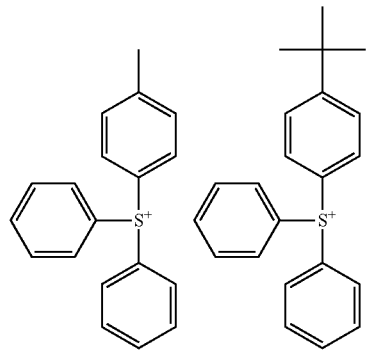
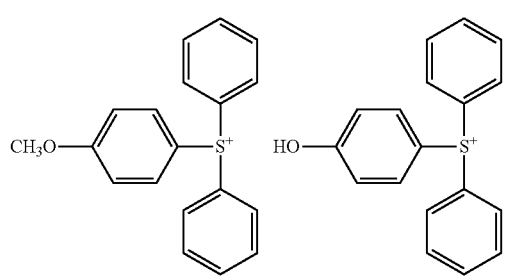
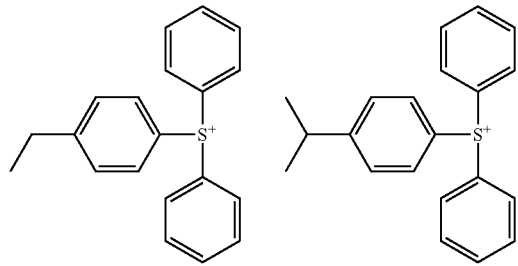
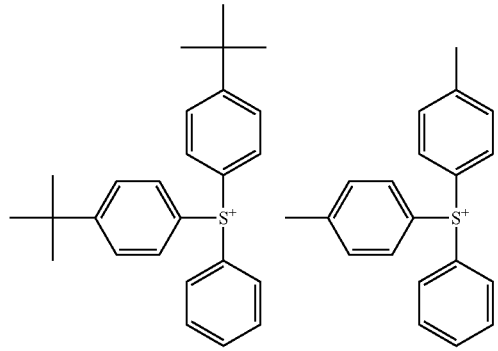
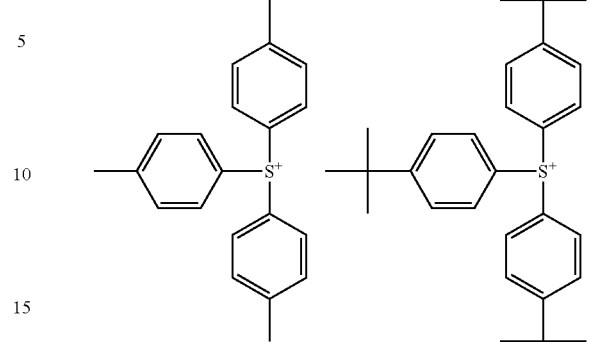
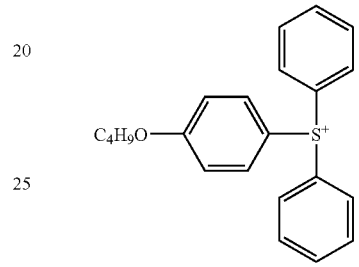
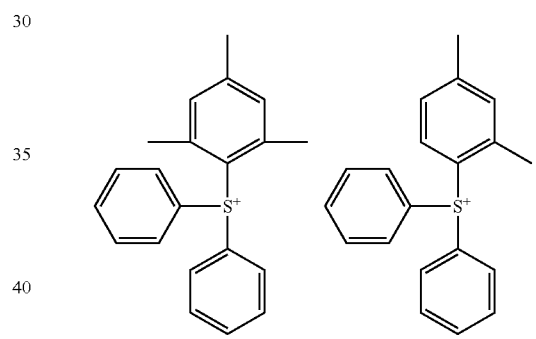
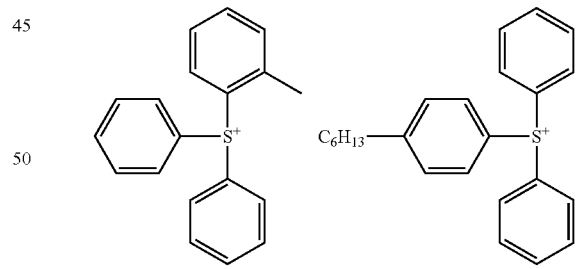
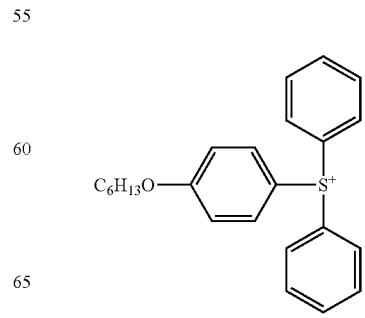

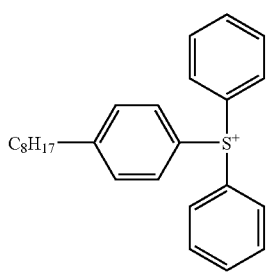
Specific examples of the cation (XIIb) include the following:
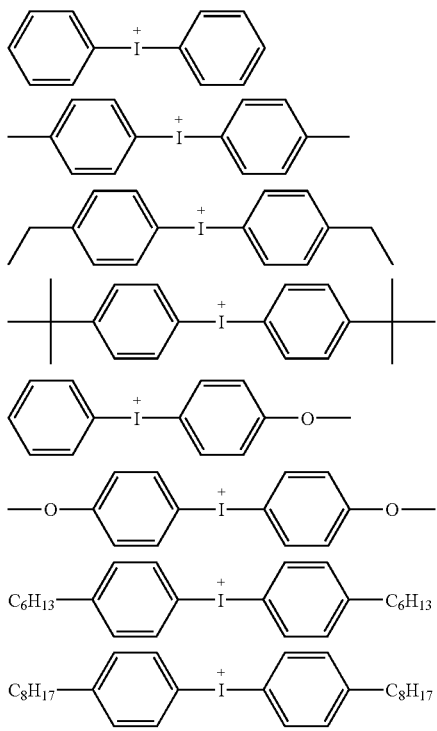
Specific examples of the cation (XIIc) include the following:
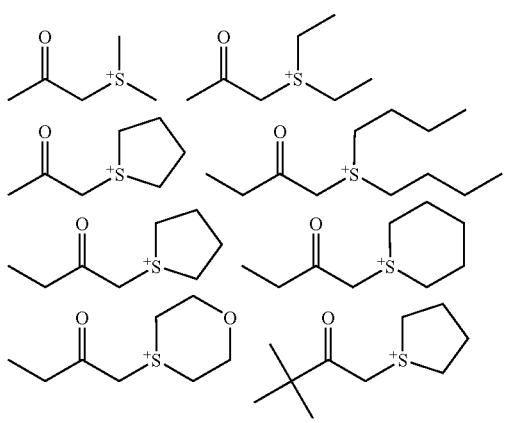
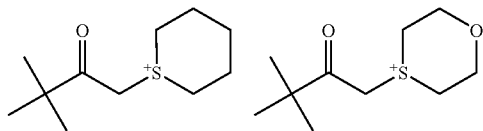
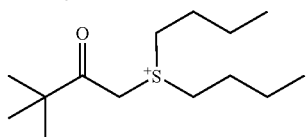
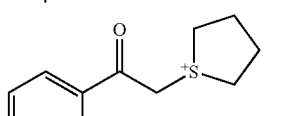
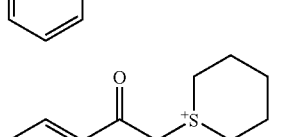
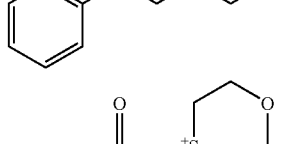
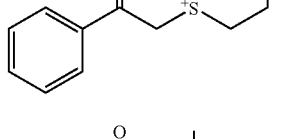
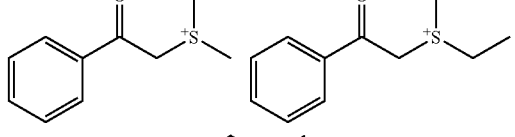
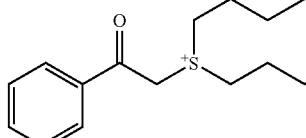
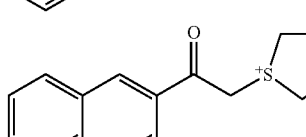
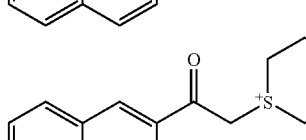
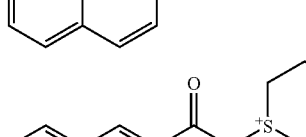
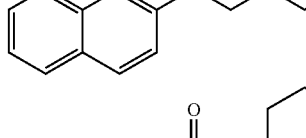
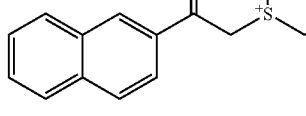

-continued
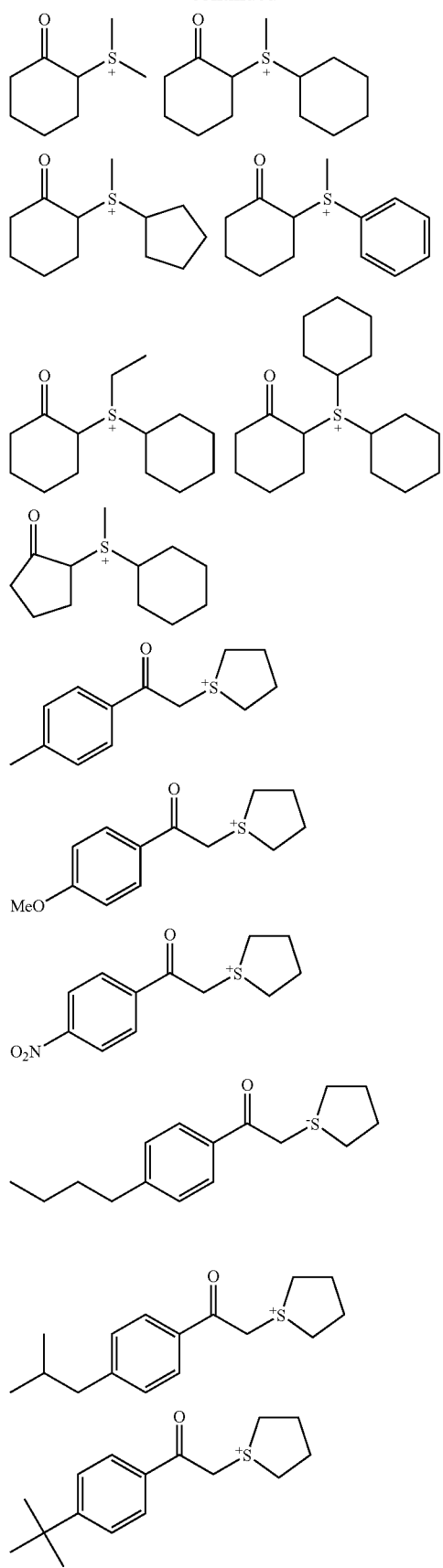
-continued
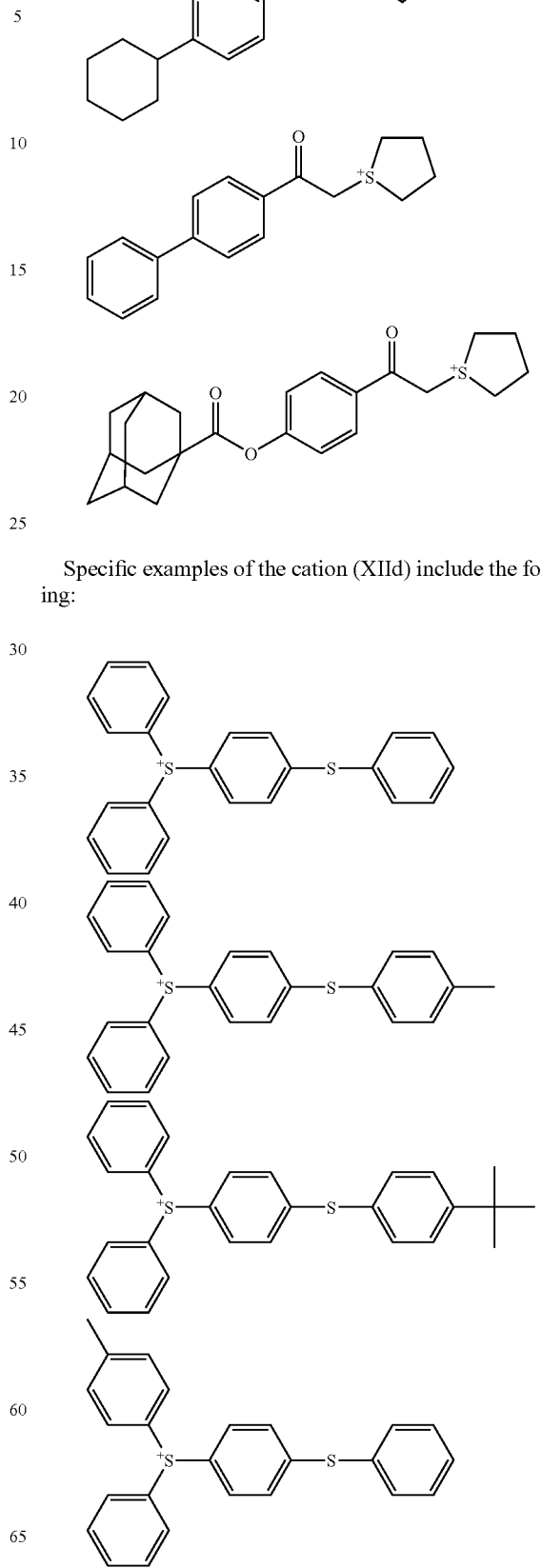
Specific examples of the cation (XIId) include the following:

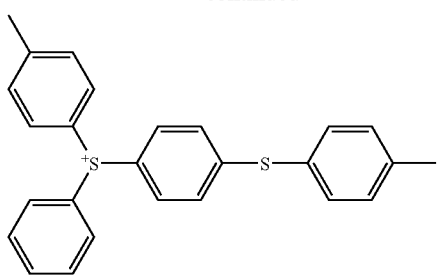
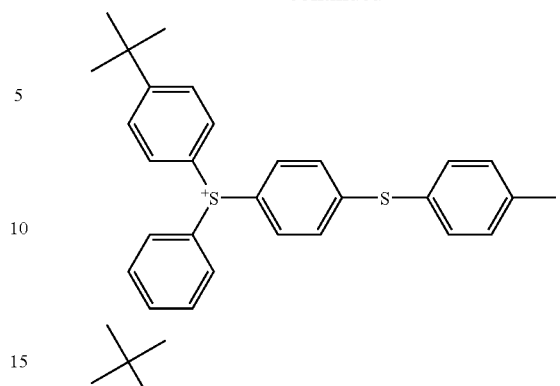
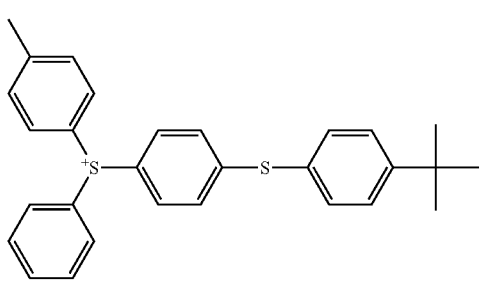
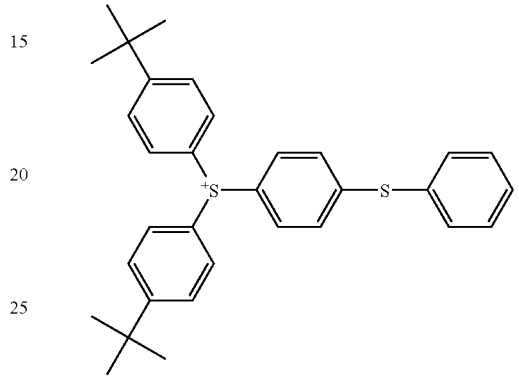
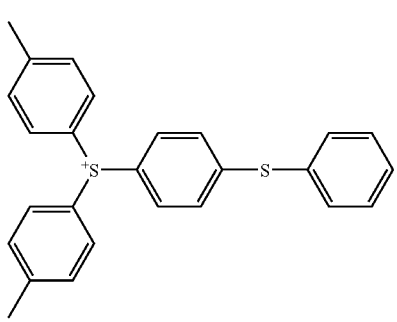
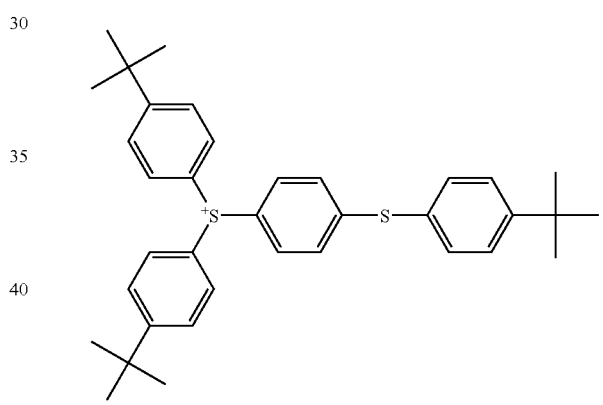
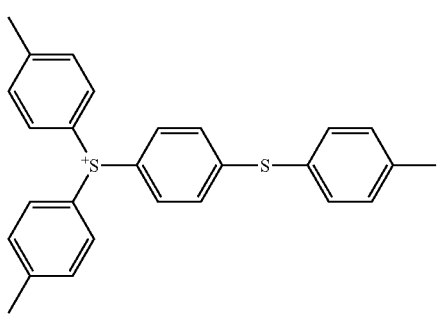
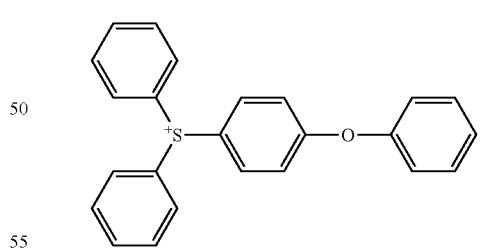
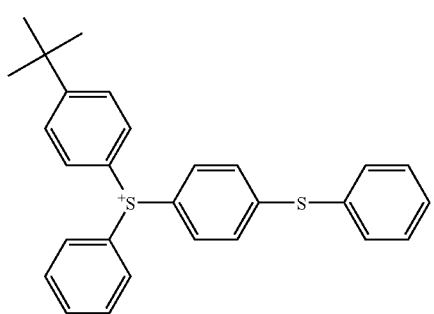
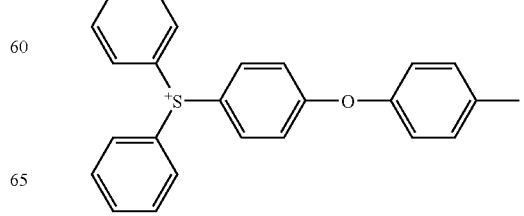

127
-continued
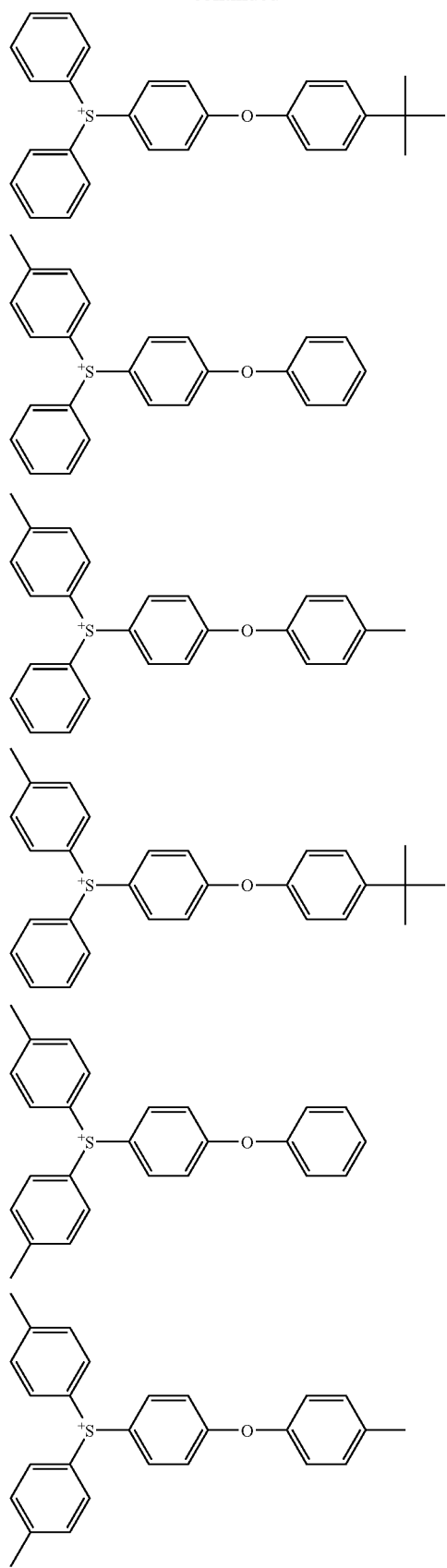
128
-continued
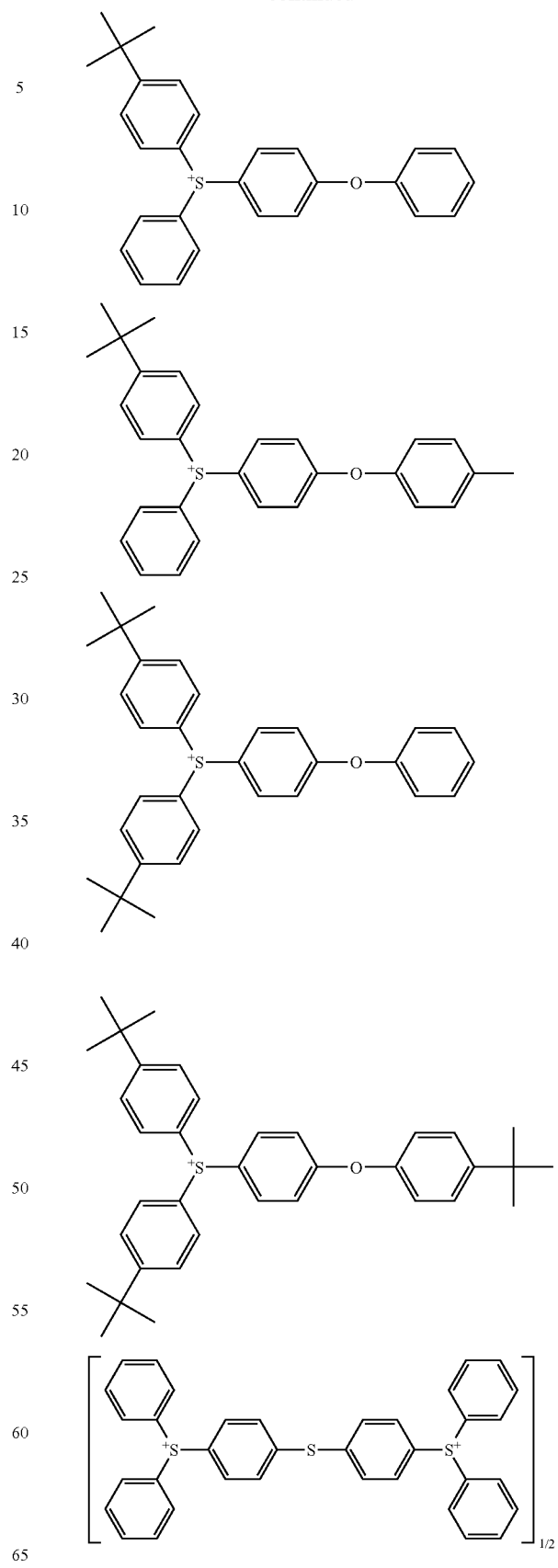

129
-continued
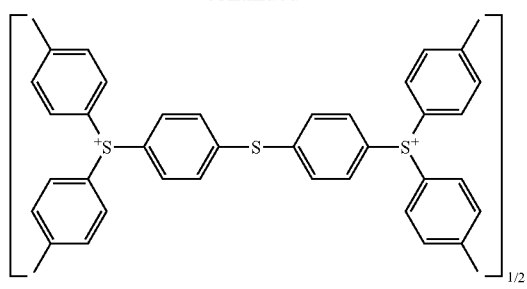
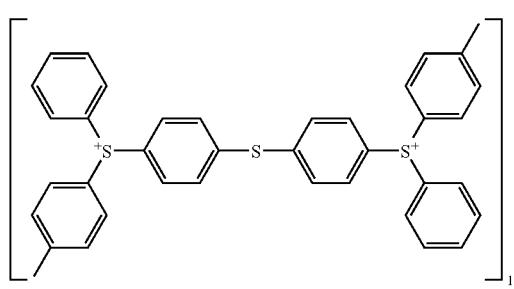
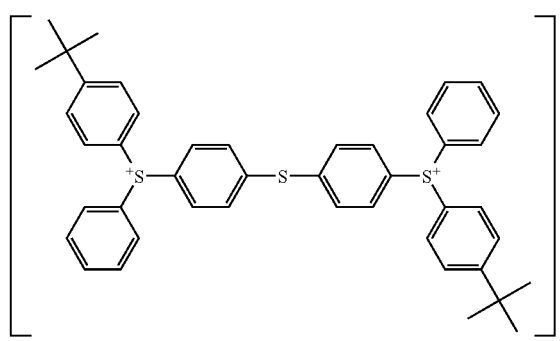
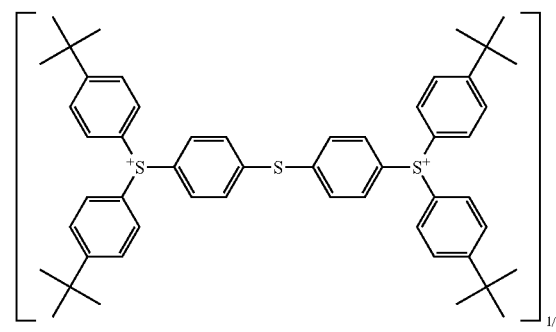
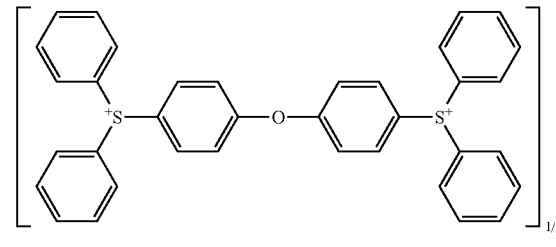
130
-continued
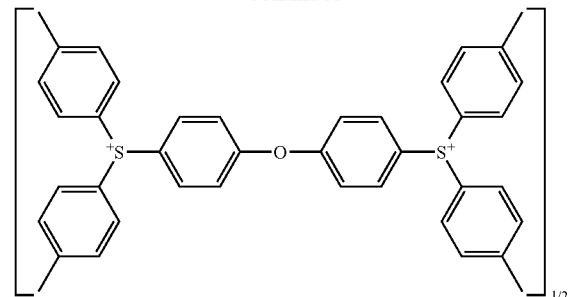
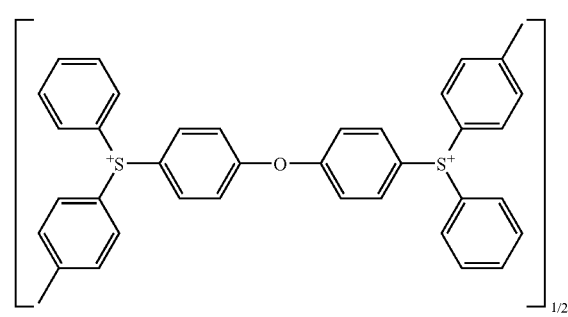
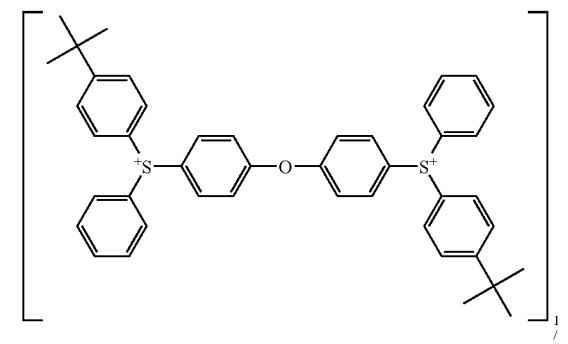
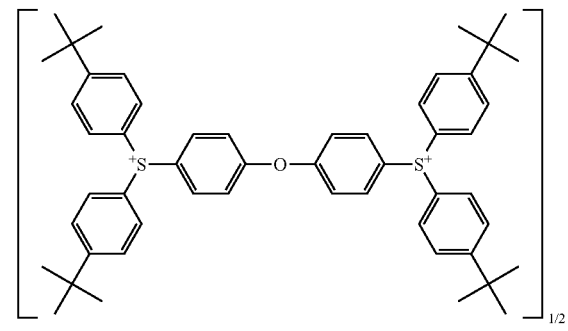

Among the cation (XIIz), the cation represented by the formula (XIIa):

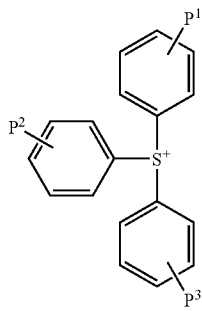

(XIIa)

wherein $P^1$, $P^2$ and $P^3$ each independently represent a hydrogen atom, a hydroxyl group, a C1-C12 alkyl group or a C1-C12 alkoxy group, is preferable. Examples of the C1-C12 alkyl group and the C1-C12 alkoxy group include the same as described above.

As the organic counter ion represented by $A^+$, a cation represented by the following formulae (XIIe):

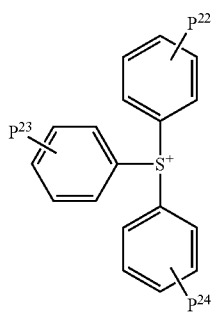

(XIIe)

wherein $P^{22}$, $P^{23}$ and $P^{24}$ each independently represent a hydrogen atom or a C1-C4 alkyl group, is also preferable.

As the Salt (V), a salt wherein $A^+$ is the cation represented by the above-mentioned formula (XIIe) and the anion part is any of the followings:

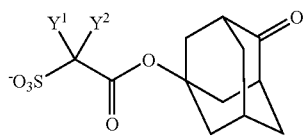

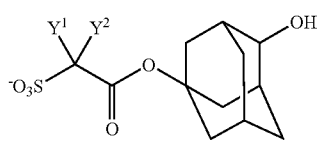

-continued

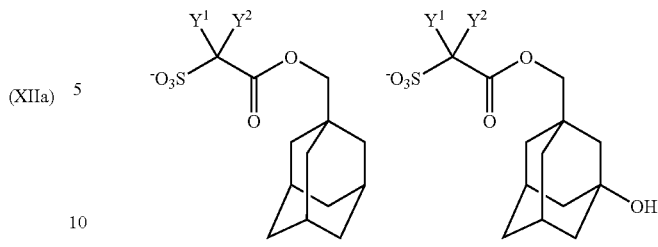

and a salt wherein $A^+$ is the cation represented by the above-mentioned formula (IXc) and the anion part is any one of the followings:

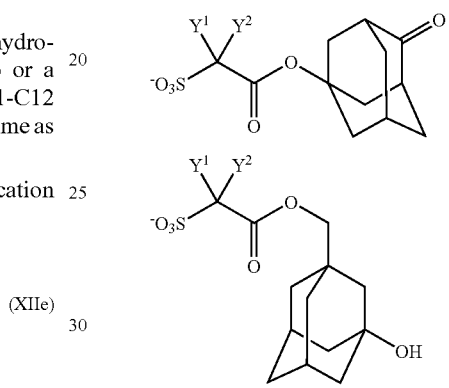

are preferable.

For example, Salt (V) can be produced according to known methods such as a method described in JP 2007-249192 A.

The present resist composition preferably includes 80 to 99.9% by weight of the resin components and 0.1 to 20% by weight of an acid generator based on the total amount of said resin components and an acid generator.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

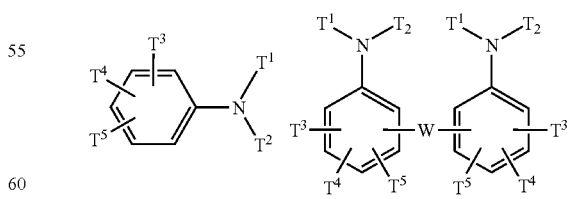

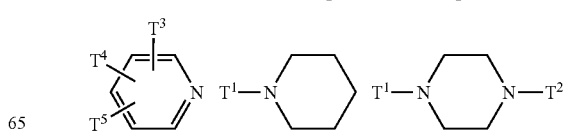

-continued

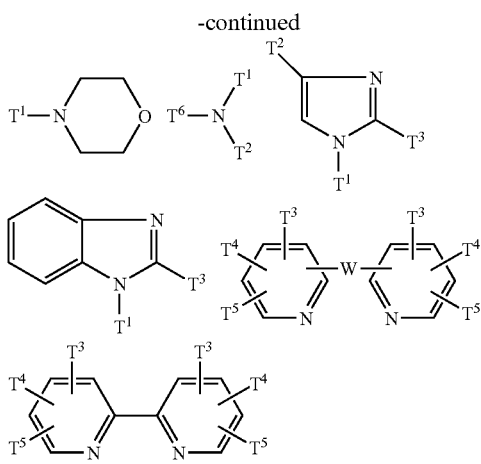

wherein $T^1$ and $T^{12}$ independently represent a hydrogen atom, an alkyl group, a cycloalkyl group or an aryl group, and the alkyl, cycloalkyl and aryl group may be substituted with at least one group selected from the group consisting of a hydroxyl group, an amino group which may be substituted with a C1-C4 alkyl group and a C1-C6 alkoxy group which may be substituted with a C1-C6 alkoxy group, $T^3$ and $T^4$ independently represent a hydrogen atom, an alkyl group, a cycloalkyl group, an aryl group or an alkoxy group, and the alkyl, cycloalkyl, aryl and alkoxy group may be substituted with at least one group selected from the group consisting of a hydroxyl group, an amino group which may be substituted with a C1-C4 alkyl group and a C1-C6 alkoxy group, or $T^3$ and $T^4$ bond together with the carbon atoms to which they bond to form an aromatic ring, $T^5$ represent a hydrogen atom, an alkyl group, a cycloalkyl group, an aryl group, an alkoxy group or a nitro group, and the alkyl, cycloalkyl, aryl and alkoxy groups may be substituted with at least one group selected from the group consisting of a hydroxyl group, an amino group which may be substituted with a C1-C4 alkyl group and a C1-C6 alkoxy group, $T^6$ represents an alkyl or cycloalkyl group, and the alkyl and cycloalkyl group may be substituted with at least one group selected from the group consisting of a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

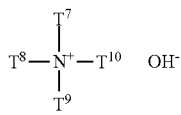

wherein $T^7$, $T^8$, $T^9$ and $T^{10}$ independently represent an alkyl group, a cycloalkyl group or an aryl group, and the alkyl, cycloalkyl and aryl groups may be substituted with at least one group selected from the group consisting a hydroxyl group, an amino group which may be substituted with a C1-C4 alkyl group and a C1-C6 alkoxy group.

The alkyl group in $T^1$, $T^2$, $T^3$, $T^4$, $T^5$, $T^6$, $T^7$, $T^8$, $T^9$ and $T^{10}$ preferably has about 1 to 10 carbon atoms, and more preferably has about 1 to 6 carbon atoms.

Examples of the amino group which may be substituted with the C1-C4 alkyl group include an amino group, a methylamino group, an ethylamino group, an n-butylamino group, a dimethylamino group and a diethylamino group. Examples of the C1-C6 alkoxy group which may be substituted with the C1-C6 alkoxy group include a methoxy group, an ethoxy group, an n-propoxy group, an isopropoxy group, an n-butoxy group, a tert-butoxy group, an n-pentyloxy group, an n-hexyloxy group and a 2-methoxyethoxy group.

Specific examples of the alkyl group which may be substituted with at least one group selected from the group consisting of a hydroxyl group, an amino group which may be substituted with a C1-C4 alkyl group, and a C1-C6 alkoxy group which may be substituted with a C1-C6 alkoxy group include a methyl group, an ethyl group, an n-propyl group, an isopropyl group, an n-butyl group, a tert-butyl group, an n-pentyl group, an n-hexyl group, an n-octyl group, an n-nonyl group, an n-decyl group, a 2-(2-methoxyethoxy) ethyl group, a 2-hydroxyethyl group, a 2-hydroxypropyl group, a 2-aminoethyl group, a 4-aminobutyl group and a 6-aminohexyl group.

The cycloalkyl group in $T^1$, $T^2$, $T^3$, $T^4$, $T^5$, $T^6$, $T^7$, $T^8$, $T^9$ and $T^{10}$ preferably has about 5 to 10 carbon atoms. Specific examples of the cycloalkyl group which may be substituted with at least one group selected from the group consisting of a hydroxyl group, an amino group which may be substituted with a C1-C4 alkyl group and a C1-C6 alkoxy group include a cyclopentyl group, a cyclohexyl group, a cycloheptyl group and a cyclooctyl group.

The aryl group in $T^1$, $T^2$, $T^3$, $T^4$, $T^5$, $T^6$, $T^7$, $T^8$, $T^9$ and $T^{10}$ preferably has about 6 to 10 carbon atoms. Specific examples of the aryl group which may be substituted with at least one group selected from the group consisting of a hydroxyl group, an amino group which may be substituted with a C1-C4 alkyl group and a C1-C6 alkoxy group include a phenyl group and a naphthyl group.

The alkoxy group in $T^3$, $T^4$ and $T^5$ preferably has about 1 to 6 carbon atoms and specific examples thereof include a methoxy group, an ethoxy group, an n-propoxy group, an isopropoxy group, an n-butoxy group, a tert-butoxy group, an n-pentyloxy group and an n-hexyloxy group.

The alkylene and alkenylene groups in W preferably have 2 to 6 carbon atoms. Specific examples of the alkylene group include an ethylene group, a trimethylene group, a tetramethylene group, a methylenedioxy group and an ethylene-1,2-dioxy group, and specific examples of the alkenylene group include an ethene-1,2-diyl group, a 1-propene-1,3-diyl group and a 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]

amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetraisopropylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skeleton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.01 to 5% by weight of the basic compound based on the total amount of the solid components.

The present resist composition can contain, if necessary, a small amount of various additives such as a sensitizer, a dissolution inhibitor, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column (Three Columns): TSKgel Multipore HXL-M, Solvent: Tetrahydrofuran, manufactured by TOSOH CORPORATION] using polystyrene as a standard reference material.

Monomers used in the following Resin Synthetic Examples are following monomers M1, M2, M3, M4, M5, M6, M7, M8, M9 and M10.

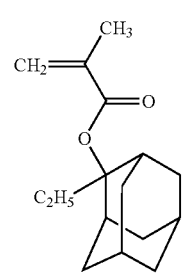

M1

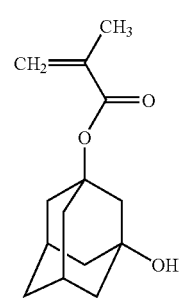

M2

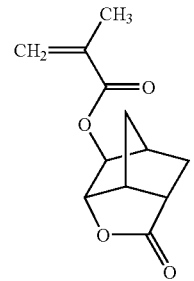

M3

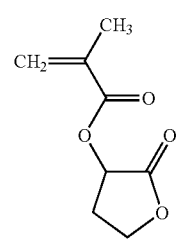

M4

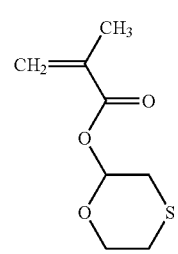

M5

-continued

M6
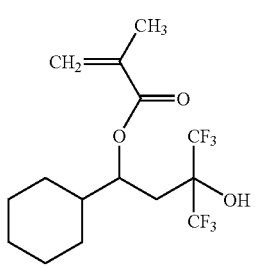

M7
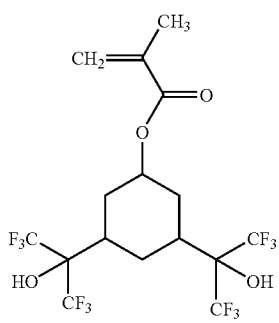

M8
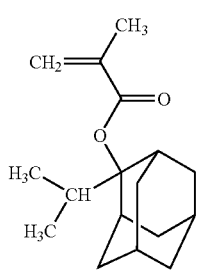

M9
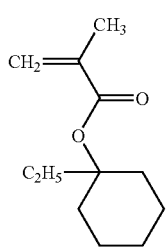

M10
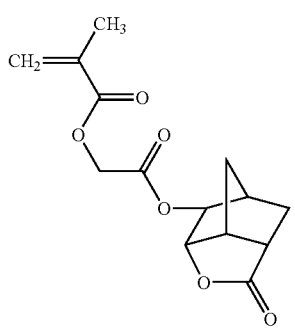

Resin Synthetic Example 1

Into a flask, 15.00 g of monomer M1, 4.89 g of monomer M2, 8.82 g of monomer M3 and 8.81 g of monomer M4 were added (monomer ratio; monomer M1: monomer M2: monomer M3: monomer M4=35:12:23:30) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1 mol % and 3 mol % respectively based on all monomer molar amount, and the resultant mixture was heated at 77° C. for about 5 hours. The reaction solution was poured into a large amount of mixture of water and methanol to cause precipitation. The precipitate was isolated and washed three times with a large amount of methanol. As a result, resin having a weight-average molecular weight of about 8,100 was obtained in a yield of 78%. This resin had the following structural units. This is called as resin A1.

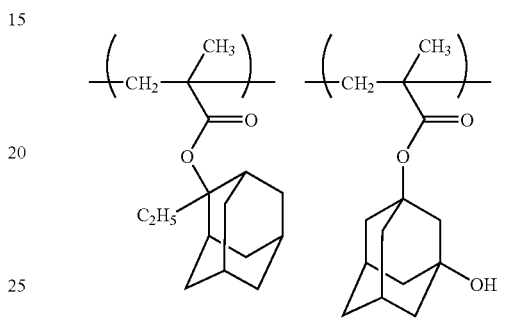

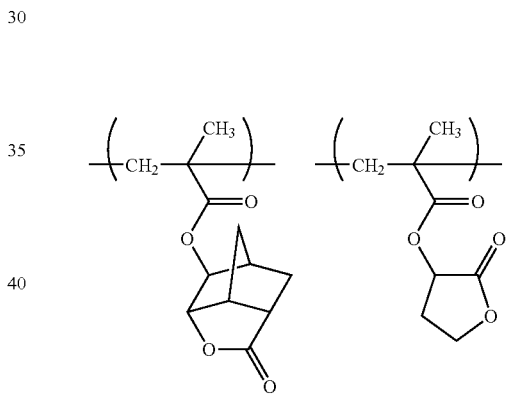

Resin Synthetic Example 2

Into a flask, 9.70 g of monomer M1, 7.10 g of monomer M2 and 5.11 g of monomer M4 were added (monomer ratio; monomer M1: monomer M2: monomer M4=40:30:30) and 1.5 times amount of methyl isobutyl ketone as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1 mol % and 3 mol % respectively based on all monomer molar amount, and the resultant mixture was heated at 72° C. for about 6 hours. The reaction solution was poured into a large amount of mixture of water and methanol to cause precipitation. The precipitate was isolated and washed three times with a large amount of methanol. As a result, resin having a weight-average molecular weight of about 8,200 was obtained in a yield of 72%. This resin had the following structural units. This is called as resin A2.

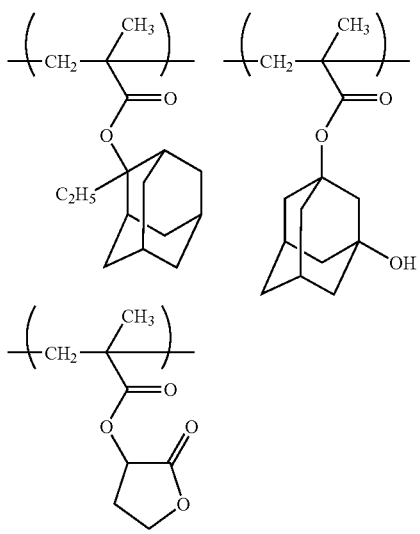

Resin Synthetic Example 3

Into a flask, 7.90 g of monomer M5 and 15.21 g of monomer M6 were added (monomer ratio; monomer M5: monomer M6=50:50) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1.5 mol % and 4.5 mol % respectively based on all monomer molar amount, and the resultant mixture was heated at 75° C. for about 5 hours. The reaction solution was poured into a large amount of mixture of water and methanol to cause precipitation. The precipitate was isolated and washed three times with a large amount of a mixture of methanol and water. As a result, resin having a weight-average molecular weight of about 9,300 was obtained in a yield of 75%. This resin had the following structural units. This is called as resin B1.

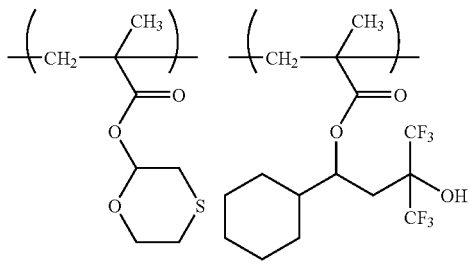

Resin Synthetic Example 4

Into a flask, 7.00 g of monomer M5 and 8.98 g of monomer M6 were added (monomer ratio; monomer M5: monomer M6=60:40) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1.5 mol % and 4.5 mol % respectively based on all monomer molar amount, and the resultant mixture was heated at 75° C. for about 5 hours. The reaction solution was poured into a large amount of mixture of water and methanol to cause precipitation. The precipitate was isolated and washed three times with a large amount of a mixture of methanol and water. As a result, resin having a weight-average molecular weight of about 11,500 was obtained in a yield of 72%. This resin had the following structural units. This is called as resin B2.

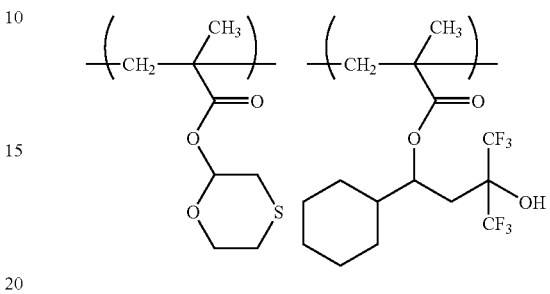

Resin Synthetic Example 5

Into a flask, 8.00 g of monomer M5 and 6.60 g of monomer M6 were added (monomer ratio; monomer M5: monomer M6=70:30) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1.5 mol % and 4.5 mol % respectively based on all monomer molar amount, and the resultant mixture was heated at 75° C. for about 5 hours. The reaction solution was poured into a large amount of mixture of water and methanol to cause precipitation. The precipitate was isolated and washed three times with a large amount of a mixture of methanol and water. As a result, resin having a weight-average molecular weight of about 12,900 was obtained in a yield of 85%. This resin had the following structural units. This is called as resin B3.

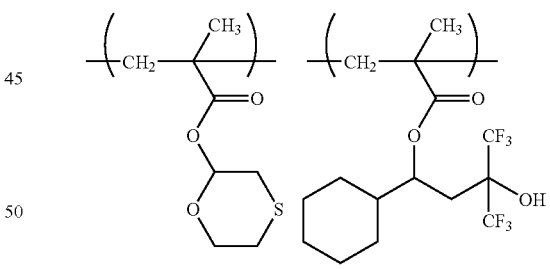

Resin Synthetic Example 6

Into a flask, 7.00 g of monomer M5, 9.80 g of monomer M6 and 1.69 g of monomer M7 were added (monomer ratio; monomer M5: monomer M6: monomer M7=55:40:5) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1 mol % and 3 mol % respectively based on all monomer molar amount, and the resultant mixture was heated at 70° C. for about 5 hours. The reaction solution was poured into a large amount of mixture of water and methanol to cause precipitation. The precipitate was isolated and washed three times with a large amount of a mixture of methanol and water. As a result, resin having a weight-average molecular weight of about 17,700 and in a yield of 63%. This resin had the following structural units. This is called as resin B4.

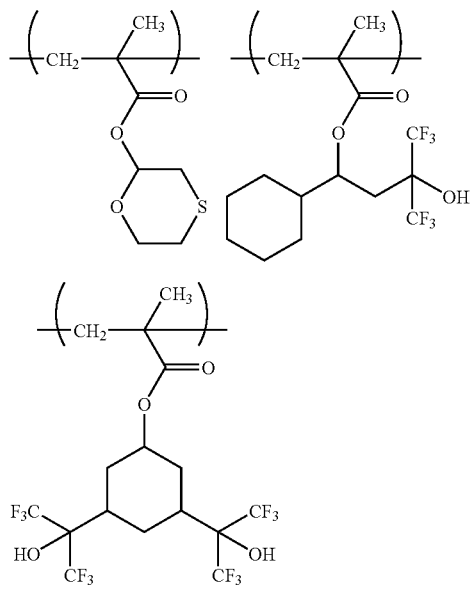

Resin Synthetic Example 7

Into a flask, 2.89 g of monomer M2, 9.53 g of monomer M3, 10.77 g of monomer M4, 15.00 g of monomer M8 and 5.61 g of monomer M9 were added (monomer ratio; monomer M2: monomer M3: monomer M4: monomer M8: monomer M9=6:21:31:28:14) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1 mol % and 3 mol % respectively based on all monomer molar amount, and the resultant mixture was heated at 73° C. for about 5 hours. The reaction solution was poured into a large amount of mixture of water and methanol to cause precipitation. The precipitate was isolated and washed with a large amount of methanol. As a result, resin having a weight-average molecular weight of about 7,800 was obtained in a yield of 85%. This resin had the following structural units. This is called as resin A3.

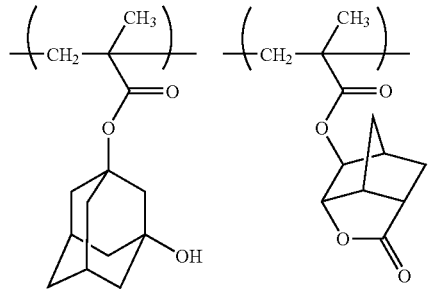

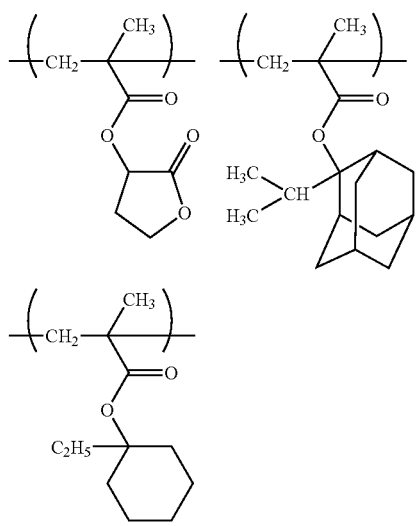

Examples 1 to 9 and Comparative Examples 1 to 4

Acid Generator

Acid generator C1:

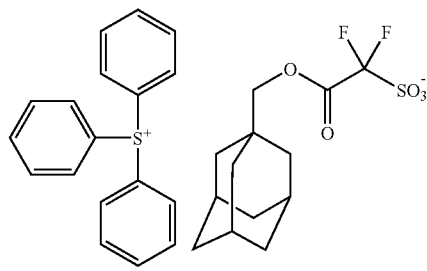

Acid generator C2:

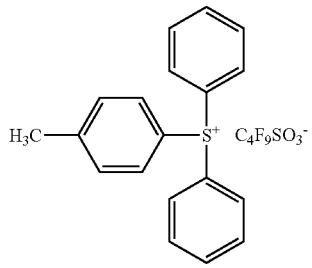

Acid generator C3:

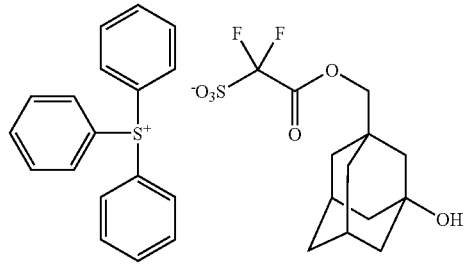

<Resin>
Resin A1, A2, B1, B2, B3, B4
<Quencher>
Q1: 2,6-diisopropylaniline
<Solvent>

| | |
|---|---|
| Y1: propylene glycol monomethyl ether acetate | 140 parts |
| 2-heptanone | 35 parts |
| propylene glycol monomethyl ether | 20 parts |
| γ-butyrolactone | 3 parts |

The following components were mixed and dissolved, further, filtrated through a fluorine resin filter having pore diameter of 0.2 μm, to prepare resist liquid.
Resin (kind and amount are described in Table 1)
Acid generator (kind and amount are described in Table 1)
Quencher (kind and amount are described in Table 1)
Solvent (kind is described in Table 1)

TABLE 1

| Ex. No. | Resin (A) (kind/amount (part)) | Resin (B) (kind/amount (part)) | Acid generator (kind/amount (part)) | Quencher (kind/amount (part)) | Solvent |
|---|---|---|---|---|---|
| Ex. 1 | A1/10 | B1/1.0 | C1/0.3 | Q1/0.03 | Y1 |
| Ex. 2 | A1/10 | B1/0.5 | C1/0.3 | Q1/0.03 | Y1 |
| Ex. 3 | A1/10 | B1/0.1 | C1/0.3 | Q1/0.03 | Y1 |
| Ex. 4 | A1/10 | B2/0.5 | C1/0.3 | Q1/0.03 | Y1 |
| Ex. 5 | A1/10 | B3/0.5 | C1/0.3 | Q1/0.03 | Y1 |
| Ex. 6 | A1/10 | B4/0.5 | C1/0.3 | Q1/0.03 | Y1 |
| Ex. 7 | A1/10 | B1/0.5 | C2/0.3 | Q1/0.02 | Y1 |
| Ex. 8 | A2/10 | B1/0.5 | C2/0.3 | Q1/0.01 | Y1 |
| Ex. 9 | A2/10 | B1/0.5 | C1/0.3 | Q1/0.03 | Y1 |
| Comp. Ex. 1 | A1/10 | — | C1/0.3 | Q1/0.03 | Y1 |
| Comp. Ex. 2 | A1/10 | — | C2/0.3 | Q1/0.02 | Y1 |
| Comp. Ex. 3 | A2/10 | — | C2/0.3 | Q1/0.01 | Y1 |
| Comp. Ex. 4 | A2/10 | — | C1/0.3 | Q1/0.03 | Y1 |

Each of the resist liquids prepared as above was spin-coated over silicon wafer so that the thickness of the resulting film became 0.15 μm after drying. The silicon wafers thus coated with the respective resist liquids were each prebaked on a direct hotplate at 100° C. for 60 seconds.

Each contact angle and receding contact angle of the non-exposure resist film formed on wafer was measured using "Drop Master-700" manufactured by Kyowa Interface Science Co., LTD. The contact angle was measured after 0.1 second after dropping using 1 μl water by droplet method and the receding contact angle was measured using 50 μl water by sliding method with a stepwise decant mode. The results of which are shown in Table 2.

TABLE 2

| Ex. No. | Receding contact angle (°) | Contact angle (°) |
|---|---|---|
| Ex. 1 | 79.8 | 89.7 |
| Ex. 2 | 77.4 | 88.0 |
| Ex. 3 | 64.4 | 81.7 |
| Ex. 4 | 76.5 | 87.1 |
| Ex. 5 | 71.2 | 84.2 |
| Ex. 6 | 76.1 | 87.6 |
| Ex. 7 | 75.9 | 87.9 |
| Ex. 8 | 72.4 | 85.6 |
| Ex. 9 | 73.8 | 85.9 |
| Comp. Ex. 1 | 54.0 | 72.0 |
| Comp. Ex. 2 | 49.3 | 72.8 |
| Comp. Ex. 3 | 51.8 | 70.7 |
| Comp. Ex. 4 | 54.0 | 71.0 |

Apparent from the results shown in Table 2, resin films obtained by Examples corresponding to the present invention have higher receding contact angle and contact angle than those of Comparative Examples.

Each of the resist liquids prepared as above was spin-coated over silicon wafer so that the thickness of the resulting film became 0.15 μm after drying. The silicon wafers thus coated with the respective resist liquids were each prebaked on a direct hotplate at 100° C. for 60 seconds.

Onto the resist film, 20 μL of ultrapure water was poured. After 60 seconds, the water sample was collected and analyzed with LC-MS method to measure amounts of leaching of the corresponding anion species and cation species, respectively. The results are shown in Table 3.

TABLE 3

| Ex. No. | Leaching amount of Cation Species ($\times 10^{-12}$ mol/cm$^2$) | Leaching amount of anion Species ($\times 10^{-12}$ mol/cm$^2$) |
|---|---|---|
| Ex. 1 | 0.2 | 0.1 |
| Ex. 2 | 0.4 | 0.8 |
| Ex. 3 | 1.2 | 2.1 |
| Ex. 4 | 0.4 | 0.6 |
| Ex. 5 | 0.6 | 0.7 |
| Ex. 6 | 0.6 | 1.1 |
| Ex. 7 | 0.7 | 1.6 |
| Ex. 8 | 0.7 | 1.7 |
| Ex. 9 | 0.1 | 0.0 |
| Comp. Ex. 1 | 1.8 | 2.5 |
| Comp. Ex. 2 | 6.8 | 10.3 |
| Comp. Ex. 3 | 3.8 | 6.3 |
| Comp. Ex. 4 | 0.5 | 0.0 |

Apparent from the results shown in Table 3, resin films obtained by Examples corresponding to the present invention have lower leaching amounts of cation and anion than those of Comparative Examples.

Example 10

The following components were mixed and dissolved, further, filtrated through a fluorine resin filter having pore diameter of 0.2 μm, to prepare resist liquid.
Resin (kind and amount are described in Table 4)
Acid generator (kind and amount are described in Table 4)
Quencher (kind and amount are described in Table 4)
Solvent (kind is described in Table 4)

TABLE 4

| Ex. No. | Resin (A) (kind/amount (part)) | Resin (B) (kind/amount (part)) | Acid generator (kind/amount (part)) | Quencher (kind/amount (part)) | Solvent |
|---|---|---|---|---|---|
| Ex. 10 | A3/10 | B1/0.4 | C3/1.5 | Q1/0.122 | Y1 |

Silicon wafers were each coated with "ARC-29A-8", which is an organic anti-reflective coating composition available from Nissan Chemical Industries, Ltd., and then baked under the conditions: 205° C., 60 seconds, to form a 780 Å-thick organic anti-reflective coating. Each of the resist liquids prepared as above was spin-coated over the anti-reflective coating so that the thickness of the resulting film became 0.08 μm after drying. The silicon wafers thus coated with the respective resist liquids were each prebaked on a direct hotplate at 80° C. for 60 seconds. Using an ArF excimer stepper ("FPA-5000AS3" manufactured by CANON INC., NA=0.75, ⅔ Annular), the wafer thus formed with the respective resist film was subjected to line and space pattern exposure, with the exposure quantity being varied stepwise.

After the exposure, each wafer was subjected to post-exposure baking on a hotplate at 85° C. for 60 seconds and then to paddle development for 15 seconds with an aqueous solution of 2.38 wt % tetramethylammonium hydroxide.

The line and space pattern developed on the organic anti-reflective coating substrate after the development was observed with a scanning electron microscope, and the development residue was checked. The result of which is shown in Table 5.

Development Residue: When no development residue was found on the line and space pattern, the pattern is good and its evaluation is marked by "○", when the development residue was found on the line and space pattern, the pattern is bad and its evaluation is marked by "×".

TABLE 5

| Ex. No. | Development Residue |
| --- | --- |
| Ex. 10 | ○ |

Resin Synthetic Example 8

Into a four-necked flask equipped with a thermometer and a condenser, 27.78 parts of 1,4-dioxane was charged and a nitrogen gas was blown into it for 30 minutes. Under an atmosphere of nitrogen, a solution obtained by mixing 15.00 parts of monomer M8, 5.61 parts of monomer M9, 2.89 parts of monomer M2, 12.02 parts of monomer M10, 10.77 parts of monomer M4, 0.34 parts of 2,2'-azobisisobutyronitorile, 1.52 parts of 2,2'-azobis(2,4-dimethylvaleronitrile) and 63.85 parts of 1,4-dioxane was added dropwise thereto over 2 hours at 73° C. The resultant mixture was heated at 73° C. for 5 hours. The reaction mixture was cooled and was diluted with 50.92 parts of 1,4-dioxane. The resultant mixture was poured into a solution obtained by mixing 481 parts of methanol and 120 parts of ion-exchanged water to cause precipitation. The precipitated polymer was isolated by filtration. The polymer was mixed with 301 parts of methanol, and the resultant mixture was stirred and then filtrated to obtain a resin. This procedure was further repeated twice. The obtained resin was dried under reduced pressure to obtain 37.0 parts of a resin in a yield of 80%. This resin had the following structural units and had a weight-average molecular weight of about 7,883 and a dispersion degree of 1.96. This is called as resin A3.

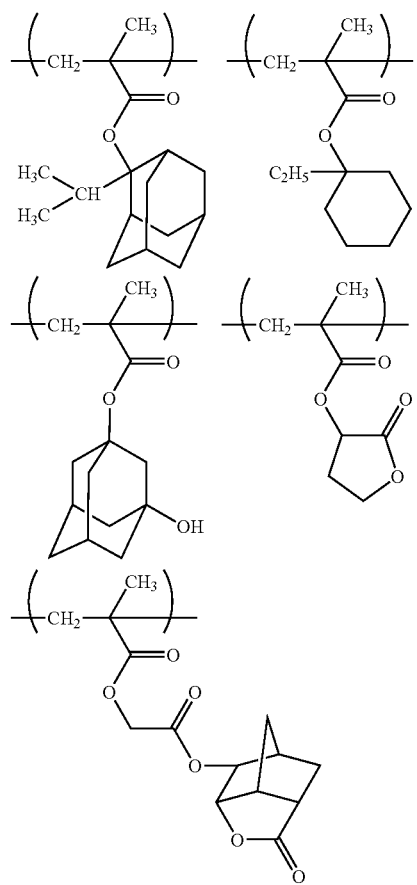

Acid Generator Synthetic Example 1

Into a flask, 30 g of 4-hydroxyphenyldiphenylsulfonium perfluorobutanesulfonate and 300 g of dichloromethane were added to prepare a solution. In the flask, a nitrogen gas was blown. To the solution, 17.9 g of N,N-diethylcarbamoyl chloride was added and then 10.5 g of triethylamine was added thereto. The resultant mixture was stirred at room temperature for 1 hour. To the obtained reaction mixture, 100 g of ion-exchanged water was added and an organic layer was obtained by separation. The obtained organic layer was washed with 300 mL of distillated water and then dried over anhydrous magnesium sulfate. Magnesium sulfate was removed by filtration and the obtained filtrate was concentrated. The obtained residue was dried under reduced pressure to obtain 26.7 g of 4-(N,N-diethylaminocarboxy)phenyldiphenylsulfonium perfluorobutanesulfonate.

Example 11

Ten parts of the resin A3, 1.5 parts of 4-(N,N-diethylaminocarboxy)phenyldiphenylsulfonium perfluorobutanesulfonate, 0.105 part of 2,6-diisopropylaniline and a solvent prepared by mixing 255 parts of propylene glycol monomethyl ether, 35 parts of 2-heptanone, 20 parts of propylene glycol monomethyl ether acetate and 3 parts of γ-butyrolactone are mixed and dissolved, further, filtrated through a fluorine resin filter having pore diameter of 0.2 μm, to prepare resist liquid.

The first pattern on the wafer is obtained according to the same manner as that described in Example 1, and then the pattern is hard-baked. Next, the resist liquid prepared above is applied onto the first pattern, and then, is prebaked on a direct hotplate. Using an ArF excimer stepper, the wafer is subjected to line and space pattern exposure to obtain the second pattern formed parallel to the first pattern between the first pattern.

After the exposure, the wafer is subjected to post-exposure baking on a hotplate and then to paddle development with an aqueous solution of 2.38 wt % tetramethylammonium hydroxide.

The resist pattern developed on the wafer after the development is observed with a scanning electron microscope to find out that the second pattern is formed parallel to the first pattern between the first pattern.

The resist pattern can be obtained according to the same manner as that of Example 11, except that resist liquid prepared in Example 2, 3, 4, 5, 6, 7, 8, 9 or 10 is used in place of resist liquid prepared in Example 1.

The resin containing the structural unit represented by the following formula:

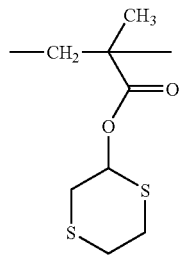

can be produced according to the same manner as that of Resin Synthetic Examples 3 to 6, except that monomer M11 is used in place of monomer M5.

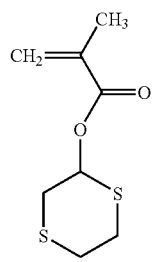

The obtainable resins are called as B5, B6, B7 and B8, respectively.

The resist composition can be produced according to the same manner as that of Examples 1 to 10, except that the resin B5, B6, B7 or B8 is used in place of the resin B1, B2, B3 or B4, respectively.

The present resist composition provides a good resist pattern having good contact angle and receding contact angle, and having a low leaching of the resist composition to water in a contact with water.

What is claimed is:

1. A chemically amplified positive resist composition comprising:
    (A) a resin comprising a structural unit having an acid-labile group and being itself insoluble or poorly soluble in an alkali aqueous solution but becoming soluble in an alkali aqueous solution by the action of an acid,
    (B) a resin comprising a structural unit represented by the formula (I):

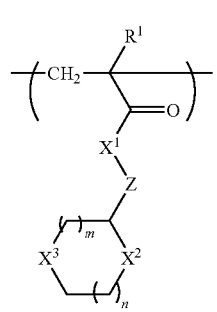

wherein $R^1$ represents a hydrogen atom, a halogen atom, a C1-C4 alkyl group or a C1-C4 perfluoroalkyl group, Z represents a single bond or $-(CH_2)_k-CO-X^4-$, k represents an integer of 1 to 4, $X^1$, $X^2$, $X^3$ and $X^4$ each independently represents an oxygen atom or a sulfur atom, m represents an integer of 1 to 3 and n represents an integer of 0 to 3, and a structural unit having a fluorine atom in a side chain, and
    an acid generator.

2. The chemically amplified positive resist composition according to claim 1, wherein the structural unit having a fluorine atom in a side chain is a structural unit represented by the formula (VI):

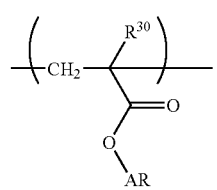

wherein $R^{30}$ represents a hydrogen atom, a methyl group or a trifluoromethyl group, and AR represents a fluorine-containing C1-C30 hydrocarbon group which may have one or more hydroxyl groups and one or more methylene group in the hydrocarbon group may be replaced by $-O-$, $-NH-$ or $-S-$.

3. The chemically amplified positive resist composition according to claim 1, wherein the resin (A) further contains a structural unit represented by the formula (III):

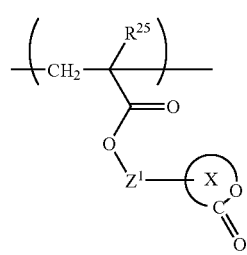

wherein $R^{25}$ represents a hydrogen atom or a methyl group, ring X represents an unsubstituted or substituted C3-C30 cyclic hydrocarbon group having $-COO-$, $Z^1$ represents a single bond or $-(CH_2)_{k'}-COO-$, and k' represents an integer of 1 to 4.

4. The chemically amplified positive resist composition according to claim 1, wherein the amount of the resin (B) is 0.1 to 30 parts by weight per 100 parts by weight of the resin (A).

5. The chemically amplified positive resist composition according to claim 1, wherein the acid generator is an acid generator represented by the formula (V):

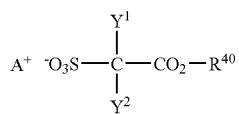

wherein $Y^1$ and $Y^2$ each independently represent a fluorine atom or a C1-C6 perfluoroalkyl group, $R^{40}$ represents a C1-C30 linear, branched chain or cyclic hydrocarbon group which may be substituted with at least one selected from the group consisting of a C1-C6 alkyl group, a C1-C6 alkoxy group, a C1-C4 perfluoroalkyl group, a hydroxyl group and a cyano group, and one or more —CH2— in the hydrocarbon group may be replaced by —CO—, —O— or —COO—, and $A^+$ represents an organic counter ion.

6. The chemically amplified positive resist composition according to claim 5, wherein $R^{40}$ in the formula (V) is a group represented by the formula:

—Z'—X¹⁰ wherein $X^{10}$ represents a C3-C30 monocyclic or polycyclic hydrocarbon group having a hydroxyl group or a carbonyl group, and one or more hydrogen atoms in the monocyclic or polycyclic hydrocarbon group may be replaced by a C1-C6 alkyl group, a C1-C6 alkoxy group, a C1-C4 perfluoroalkyl group, a C1-C6 hydroxyalkyl group, a hydroxyl group or a cyano group and Z' represents a single bond or a C1-C4 alkylene group.

7. The chemically amplified positive resist composition according to claim 5, wherein the organic counter ion is a cation represented by the formula (XIIa):

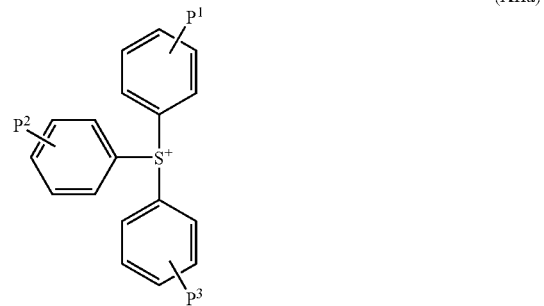

wherein $P^1$, $P^2$ and $P^3$ each independently represent a hydrogen atom, a hydroxyl group, a C1-C12 alkyl group or a C1-C12 alkoxy group.

* * * * *